US006924926B2

(12) United States Patent
Islam et al.

(10) Patent No.: US 6,924,926 B2
(45) Date of Patent: Aug. 2, 2005

(54) LASER DIODE PUMP SOURCES

(75) Inventors: Mohammed N. Islam, Allen, TX (US); Michael J. Freeman, Northville, MI (US)

(73) Assignees: Xtera Communications, Inc., Allen, TX (US); The Regents of the University of Michigan, Ann Arbor, MI (US)

( * ) Notice: Subject to any disclaimer, the term of this patent is extended or adjusted under 35 U.S.C. 154(b) by 46 days.

(21) Appl. No.: 10/210,987

(22) Filed: Aug. 2, 2002

(65) Prior Publication Data

US 2003/0053507 A1 Mar. 20, 2003

Related U.S. Application Data

(60) Provisional application No. 60/310,147, filed on Aug. 3, 2001.

(51) Int. Cl.[7] ............................................. H01S 3/00
(52) U.S. Cl. ........................................................ 359/334
(58) Field of Search ................................. 359/334, 70

(56) References Cited

U.S. PATENT DOCUMENTS

| 4,932,739 A | 6/1990 | Islam | 350/96.15 |
| 4,995,690 A | 2/1991 | Islam | 350/96.15 |
| 5,020,050 A | 5/1991 | Islam | 370/4 |

(Continued)

OTHER PUBLICATIONS

Fludger, C.R.S. et al., "Pump to Signal RIN Transfer in Raman Fiber Amplifiers," Journal of Lightwave Technology, vol. 19, No. 8, pp. 1140–1148, Aug. 2001.

Grosz, D.F., et al., "Demonstration of All–Raman Ultra–Wide–Band Transmissionof 1.28 TB/s (128×10 Bb/s) over 4000 km of NZ–DSF with Large BER margins," Bell Labs–Lucent Technologies, (date?)(pages?).

Espindola, R.P., et al., "Penalty–free 10 Gibit/s single–channel co–pumped distributed Raman amplification using low RN 14xx nm DFB pump," Electronic Letters, Jan. 31, 2002, vol. 38, No. 3.

Nakazawa, "Highly efficient Raman amplification in a polarization–preserving optical fiber," Appl. Phys. Letter., vol. 46, No. 7, pp. 628–630, Apr. 1, 1985.

(Continued)

*Primary Examiner*—Thomas H. Tarcza
*Assistant Examiner*—Deandra M. Hughes
(74) *Attorney, Agent, or Firm*—Baker Botts L.L.P.

(57) ABSTRACT

A laser diode pump includes a plurality of laser diodes each capable of generating a lasing wavelength. The laser diode pump further includes at least one wavelength combiner operable to combine the plurality of lasing wavelengths generated by the plurality of laser diodes into a multiple wavelength pump signal. In one particular embodiment, at least two of the plurality of lasing wavelengths generated by the plurality of laser diodes comprise a wavelength between 1270 nm and 1350 nm.

45 Claims, 17 Drawing Sheets

U.S. PATENT DOCUMENTS

| | | | |
|---|---|---|---|
| 5,078,464 A | 1/1992 | Islam | 385/122 |
| 5,101,456 A | 3/1992 | Islam | 385/27 |
| 5,115,488 A | 5/1992 | Islam et al. | 385/129 |
| 5,224,194 A | 6/1993 | Islam | 385/122 |
| 5,369,519 A | 11/1994 | Islam | 359/173 |
| 5,485,536 A | 1/1996 | Islam | 385/31 |
| 5,589,684 A * | 12/1996 | Ventrudo et al. | 250/225 |
| 5,664,036 A | 9/1997 | Islam | 385/31 |
| 5,796,909 A | 8/1998 | Islam | 385/147 |
| 6,043,927 A | 3/2000 | Islam | 359/332 |
| 6,052,393 A | 4/2000 | Islam | 372/6 |
| 6,101,024 A | 8/2000 | Islam et al. | 359/334 |
| 6,178,038 B1 | 1/2001 | Taylor et al. | 359/341 |
| 6,233,077 B1 | 5/2001 | Alexander et al. | 359/133 |
| 6,239,902 B1 | 5/2001 | Islam et al. | 359/334 |
| 6,239,903 B1 | 5/2001 | Islam et al. | 359/337 |
| 6,304,585 B1 * | 10/2001 | Sanders et al. | 372/22 |
| 6,335,820 B1 | 1/2002 | Islam | 359/334 |
| 6,344,922 B1 | 2/2002 | Grubb et al. | 359/334 |
| 6,356,384 B1 | 3/2002 | Islam | 359/334 |
| 6,359,725 B1 | 3/2002 | Islam | 359/334 |
| 6,370,164 B1 | 4/2002 | Islam | 372/6 |
| 6,374,006 B1 | 4/2002 | Islam et al. | 385/15 |
| 6,381,391 B1 | 4/2002 | Islam et al. | 385/123 |
| 6,404,542 B1 * | 6/2002 | Ziari et al. | 359/341.3 |
| 6,522,796 B1 * | 2/2003 | Ziari et al. | 385/11 |
| 6,606,337 B1 * | 8/2003 | King | 372/70 |
| 6,611,369 B2 * | 8/2003 | Matsushita et al. | 359/334 |
| 6,625,347 B1 * | 9/2003 | Wu | 385/27 |
| 6,643,433 B2 * | 11/2003 | Gonthier et al. | 385/43 |
| 2001/0046083 A1 * | 11/2001 | Akasaka et al. | 359/334 |
| 2001/0053264 A1 * | 12/2001 | Edagawa et al. | 385/27 |
| 2002/0075913 A1 * | 6/2002 | Koyanagi | 372/36 |
| 2002/0080833 A1 * | 6/2002 | Matsuura et al. | 372/20 |
| 2002/0093738 A1 * | 7/2002 | Kimura et al. | 359/497 |
| 2002/0141698 A1 * | 10/2002 | Matsushita et al. | 385/31 |
| 2002/0191290 A1 * | 12/2002 | Chang et al. | 359/497 |
| 2003/0063833 A1 * | 4/2003 | Gonthier et al. | 385/11 |
| 2003/0133180 A1 * | 7/2003 | Yang et al. | 359/341.3 |

OTHER PUBLICATIONS

Fürst et al., "Influence of the dispersion map on limitations due to cross–phase modulation in WDM multispan transmission systems," Optical Society of America, pp. MF4–1–3, 2000.

Radic et al., "Feasibility of Hybrid Raman/EDFA Amplification in Birdirectional Optical Transmission," IEEE Photonics Technology Letters, vol. 14, No. 2, pp. 221–223, Feb. 2002.

Pending Patent Application; U.S. Appl. No. 10/211,103; entitled "Co–Propagating Raman Amplifiers," by Mohammed N. Islam et al, filed Aug. 2, 2002.

* cited by examiner

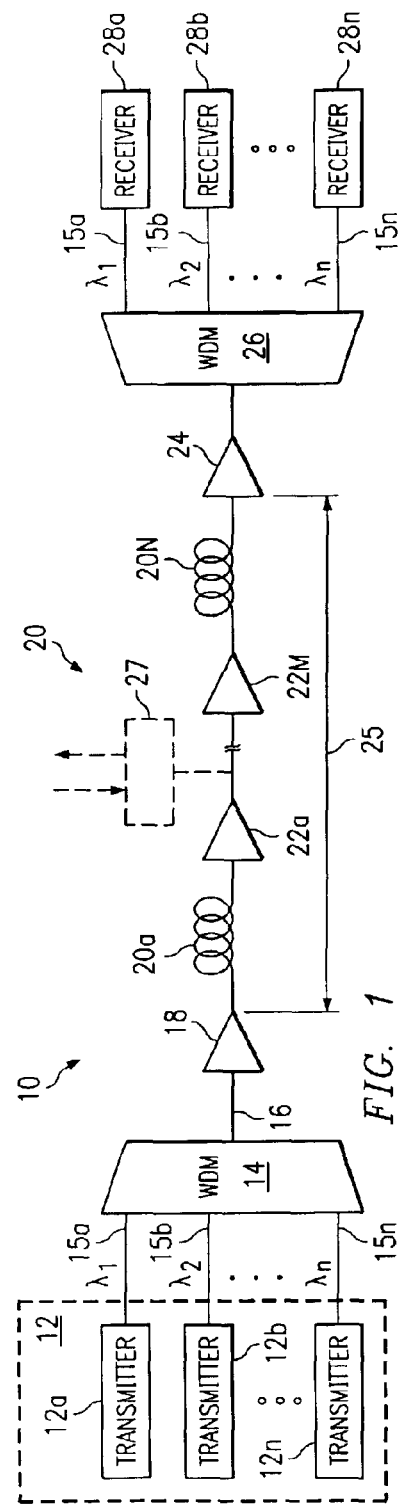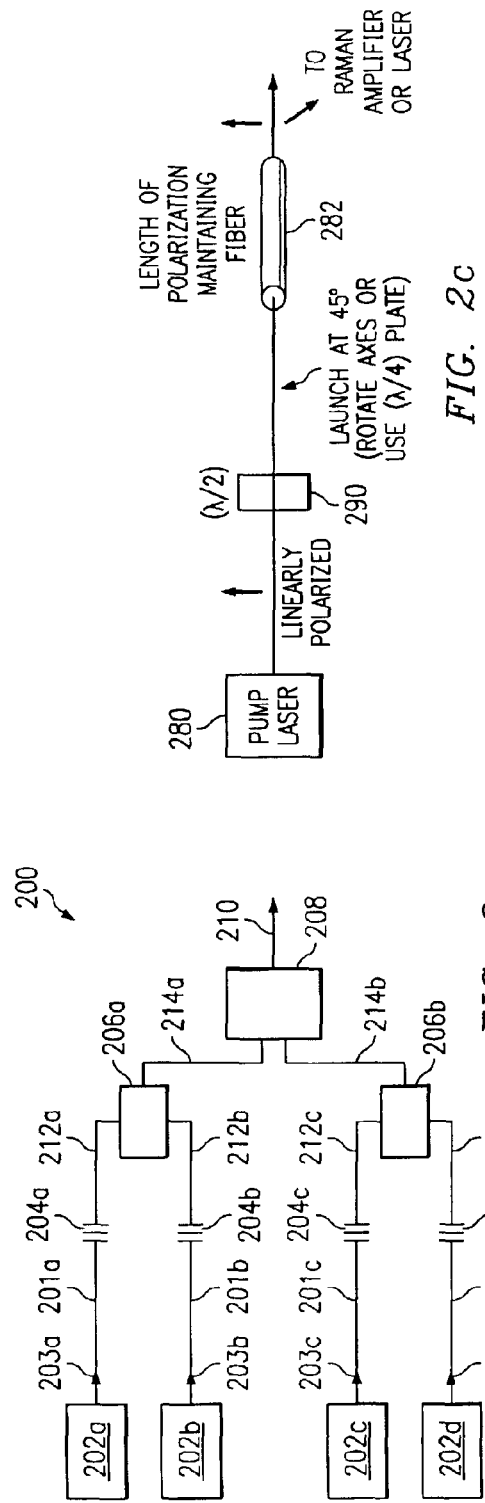

FIG. 3

| ID PUMP CENTER λ | CENTER OF FIRST ORDER RAMAN | CENTER OF SECOND ORDER RAMAN | CENTER OF THIRD ORDER RAMAN |
|---|---|---|---|
| 1280nm | 1356 | 1442 | 1539 |
| 1295nm | 1373 | 1462 | 1563 |
| 1310nm | 1390 | 1480 | 1584 |
| 1325nm | 1407 | 1500 | 1606 |
| 1340nm | 1424 | 1519 | 1628 |

EXAMPLE APPLICATIONS:

| FIRST ORDER RAMAN | SECOND ORDER RAMAN | THIRD ORDER RAMAN |
|---|---|---|
| ① RA FOR 1400nm WINDOW<br>② RO PUMP FOR "VIOLET BAND" | ① RA FOR "VIOLET BAND"<br>② RO PUMP FOR AGEQ AND DCF<br>③ RO PUMP FOR DISTRIBUTED GAIN PRE-AMP IN EDFA BAND | ① SUPPLEMENT GAIN IN EDFA BAND<br>② RA WITH GAIN SHAPING FOR AGEQ |

DCF: DISPERSION COMPENSATING FIBER
RA: RAMAN AMPLIFIER
RO: RAMAN OSCILLATOR
AGEQ: ACTIVE GAIN EQUALIZATION

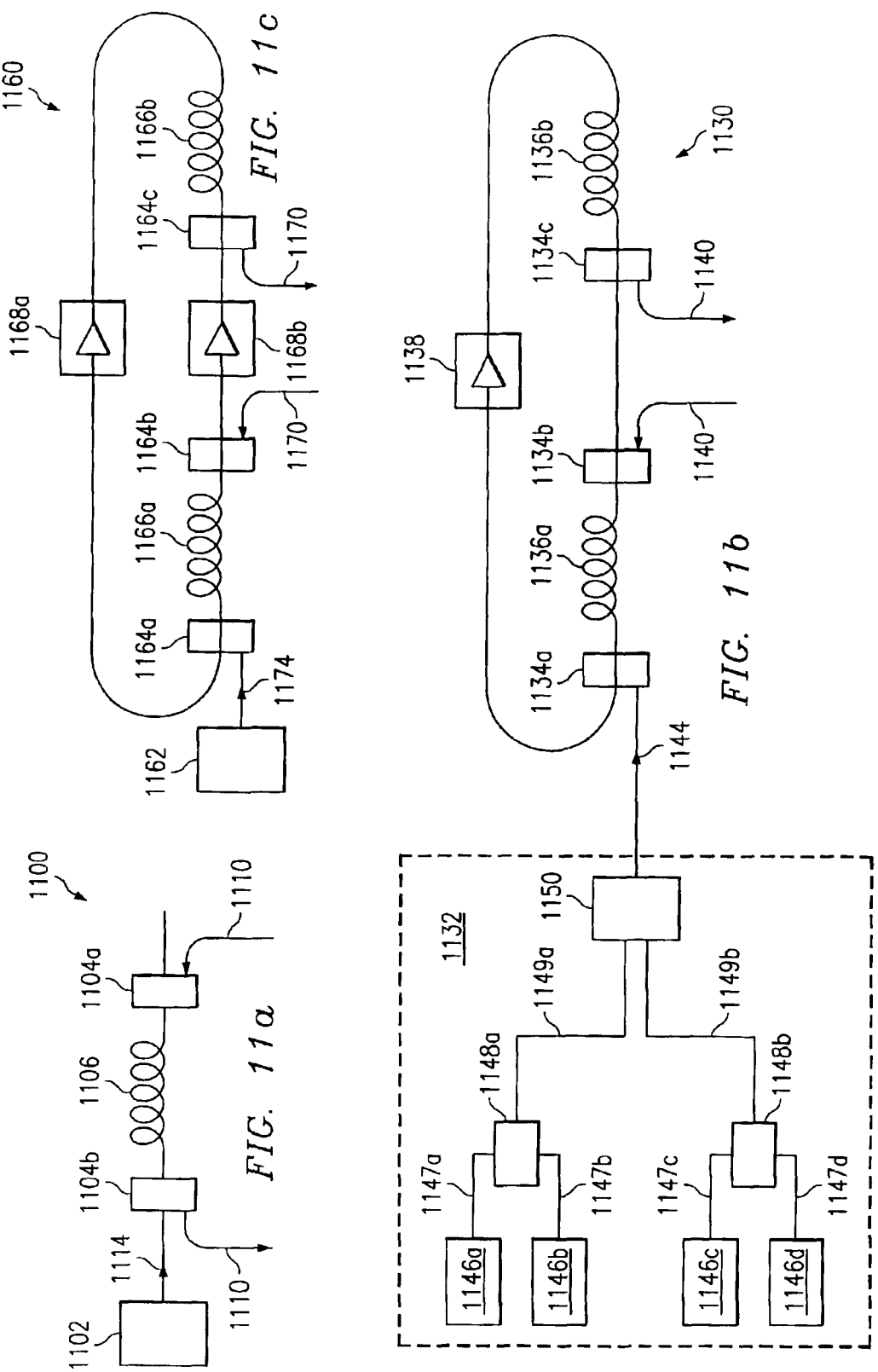

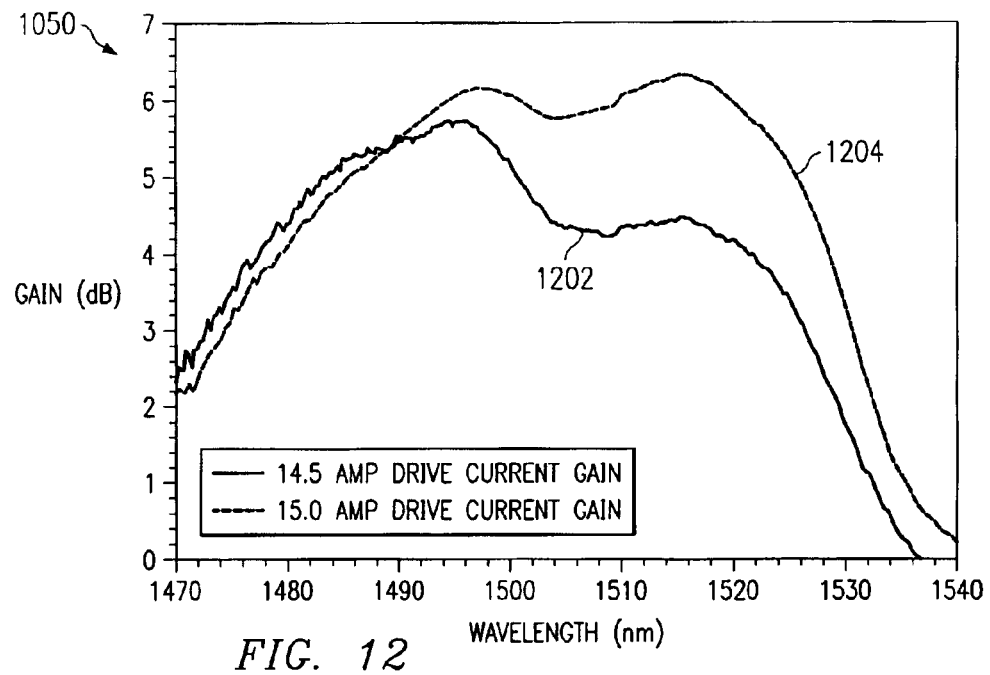
FIG. 12
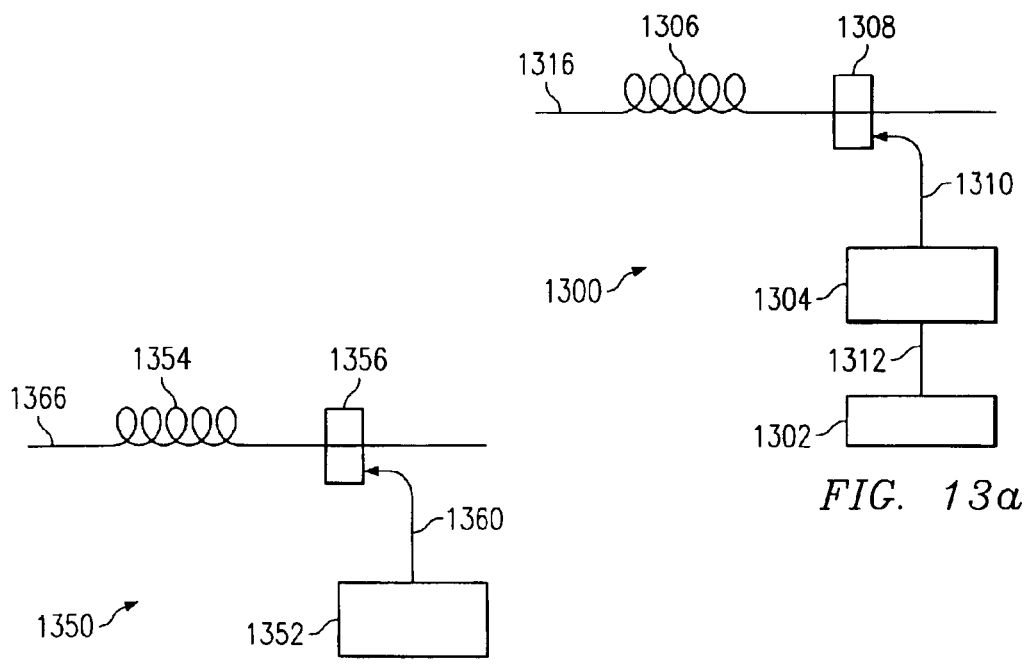
FIG. 13a
FIG. 13b

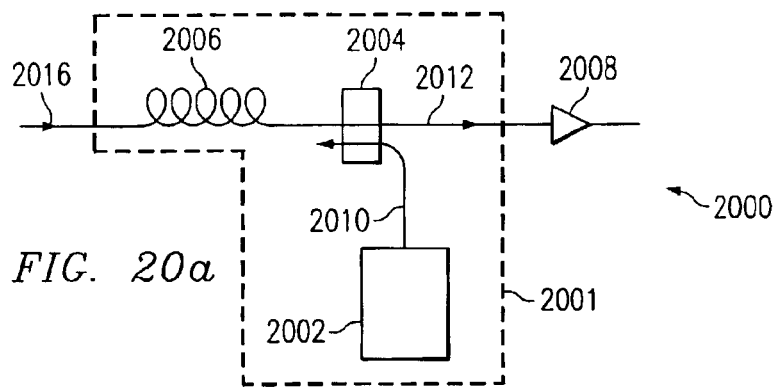
FIG. 20a
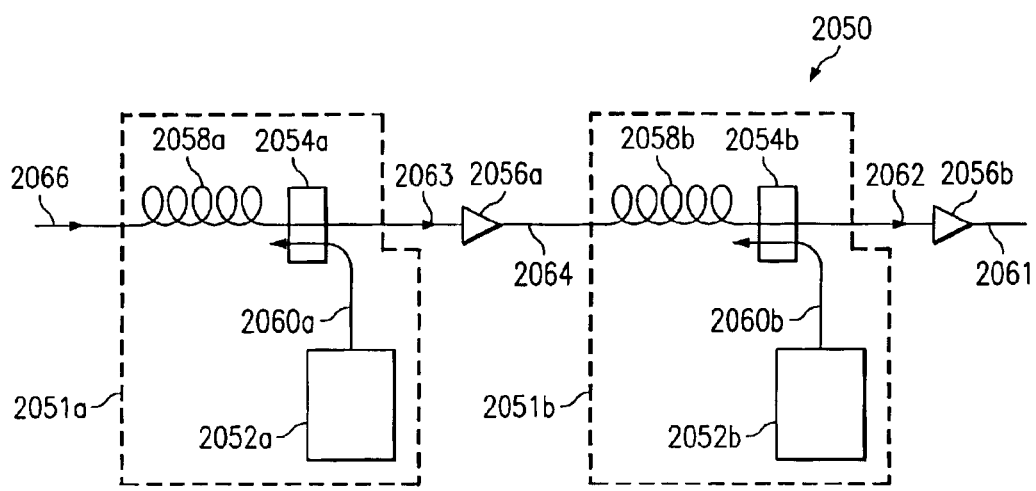
FIG. 20b
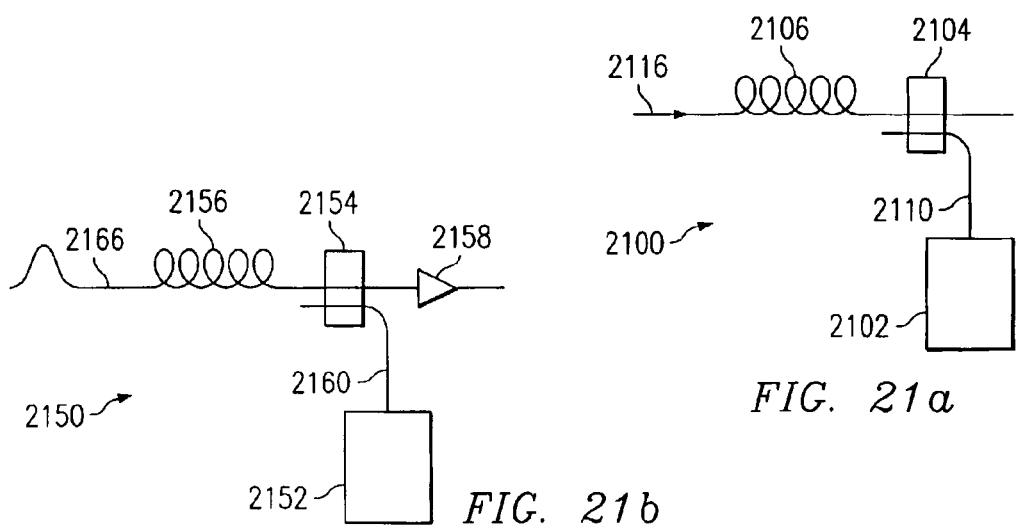
FIG. 21a
FIG. 21b

LASER DIODE PUMP SOURCES

CROSS-REFERENCE TO RELATED APPLICATIONS

This application claims the benefit of priority under 35 U.S.C. §119(e) of U.S. Provisional Application Ser. No. 60/310,147, filed Aug. 3, 2001.

This application claims priority to U.S. patent application Ser. No. 10/033,848, filed Dec. 19, 2001 and entitled "BROADBAND SAGNAC RAMAN AMPLIFIERS AND CASCADE LASERS," which is a divisional of U.S. patent application Ser. No. 09/550,730 filed Apr. 17, 2000, now U.S. Pat. No. 6,370,164.

U.S. Pat. No. 6,370,164 is a divisional of U.S. patent application Ser. No. 09/110,696, filed Jul. 7, 1998, now U.S. Pat. No. 6,052,393. U.S. Pat. No. 6,052,393 claims priority to U.S. patent application Ser. No. 08/773,482 filed Dec. 23, 1996, now U.S. Pat. No. 5,778,014, and to U.S. provisional patent application Ser. No. 60/080,317 filed Apr. 1, 1998.

TECHNICAL FIELD OF THE INVENTION

The present invention relates generally to the field of communications systems and, more particularly, to laser diode pump sources and applications thereof.

OVERVIEW

Raman amplification typically places a relatively large burden on the pump source associated with the Raman amplifier, in terms of both power level and pump wavelength range. Conventional pump sources have typically been limited to amplifying optical signal wavelengths that substantially overlap the Erbium-doped fiber amplifier wavelength range. Moreover, conventional laser based pump sources typically comprise a power level that is higher than desired. In addition, these conventional laser based pump sources are relatively expensive.

SUMMARY OF EXAMPLE EMBODIMENTS

The present invention provides an improved apparatus and method for optical amplification using a combination of laser diodes to form a multiple wavelength pump signal. In accordance with the present invention, an apparatus and method for optical amplification are provided that reduce or eliminate at least some of the shortcomings associated with prior approaches.

In one embodiment, a laser diode pump comprises a plurality of laser diodes each capable of generating a lasing wavelength. The laser diode pump also comprises at least one wavelength combiner operable to combine the plurality of lasing wavelengths generated by the plurality of laser diodes into a multiple wavelength pump signal. In one particular embodiment, at least two of the plurality of lasing wavelengths generated by the plurality of laser diodes comprise a wavelength between 1270 nm and 1350 nm.

In another embodiment, a laser diode pump comprises a plurality of laser diodes each capable of generating a lasing wavelength. The laser diode pump also comprises at least one combiner operable to combine at least two of the lasing wavelengths generated by the plurality of laser diodes into at least one substantially un-polarized pump signal. In one particular embodiment, at least one of the lasing wavelengths generated by the plurality of laser diodes comprises a wavelength between 1270 nm and 1350 nm.

In yet another embodiment, a laser diode pump comprises a pump assembly operable to generate at least one substantially un-polarized multiple wavelength pump signal for use in pumping a Raman amplifier stage. In one particular embodiment, the pump assembly comprises at least one laser diode comprising a ternary semiconductor material.

In a method embodiment, a method of forming a multiple wavelength pump signal comprises generating a plurality of lasing wavelengths. The method also comprises combining the plurality of lasing wavelength into a multiple wavelength pump signal. In one particular embodiment, at least two of the plurality of lasing wavelengths comprise a wavelength between 1270 nm and 1350 nm.

In another method embodiment, a method of forming a multiple wavelength pump signal, comprises generating a plurality of lasing wavelengths. The method also comprises combining at least two of the plurality of lasing wavelengths into a at least one substantially un-polarized pump output signal. In one particular embodiment, at least one of the plurality of lasing wavelengths comprises a wavelength between 1270 nm and 1350 nm.

In yet another method embodiment, a method of forming a multiple wavelength pump signal comprises generating a plurality of lasing wavelengths. The method also comprises combining at least two of the plurality of lasing wavelengths into at least one, substantially un-polarized multiple wavelength pump signal for use in pumping a Raman amplification stage. In one particular embodiment, the plurality of lasing wavelengths are generated in a pump assembly comprising at least one laser diode comprising a ternary semiconductor material.

Depending on the specific features implemented, particular embodiments of the present invention may exhibit some, none, or all of the following technical advantages. Various embodiments enable the formation of a multiple wavelength pump signal centered at approximately the 1310 nm wavelength. Some embodiments may enable the formation of a substantially un-polarized broadband pump signal that is particularly useful in Raman amplification. Other embodiments may be capable of broadening the gain spectrum of an amplifier by combining a plurality of grating-tuned laser diodes. Still other embodiments may be capable of providing gain in the 1400 nm window, the violet window, or the EDFA window of an optical fiber.

Other technical advantages will be readily apparent to one skilled in the art from the following figures, descriptions and claims. Moreover, while specific advantages have been enumerated above, various embodiments may include all, some or none of the enumerated advantages.

BRIEF DESCRIPTION OF THE DRAWINGS

For a more complete understanding of the present invention, and for further features and advantages thereof, reference is now made to the following description taken in conjunction with the accompanying drawings, in which:

FIG. 1 is a block diagram showing at least a portion of an exemplary optical communication system operable to facilitate communication of one or more multiple wavelength signals;

FIGS. 2A through 2D are block diagrams illustrating exemplary embodiments of a laser diode pump comprising a plurality of laser diodes;

FIG. 3 is a chart illustrating three exemplary Raman cascade orders starting from laser diodes centered at approximately the 1310 nm wavelength and exemplary applications for each order;

FIGS. 11A through 11D are block diagrams illustrating example optical amplifiers capable of varying the amplifier gain spectrum by controlling pump wavelength power levels;

FIG. 12 is a graph illustrating example gain spectra of an optical amplifier generated by varying the power levels of the wavelengths of a multiple wavelength pump signal;

FIGS. 13A and 13B are block diagrams illustrating exemplary embodiments of Raman amplifiers implementing active gain equalization;

FIGS. 20A and 20B are block diagrams illustrating exemplary embodiments of active gain equalization pump sources implemented to upgrade pre-existing optical amplifiers;

FIGS. 21A and 21B are block diagrams illustrating exemplary embodiments of implementing distributed Raman amplifiers to at least partially counteract losses in relatively high loss systems;

DETAILED DESCRIPTION OF EXAMPLE EMBODIMENTS

I. Example System Architecture

Figure 2B:
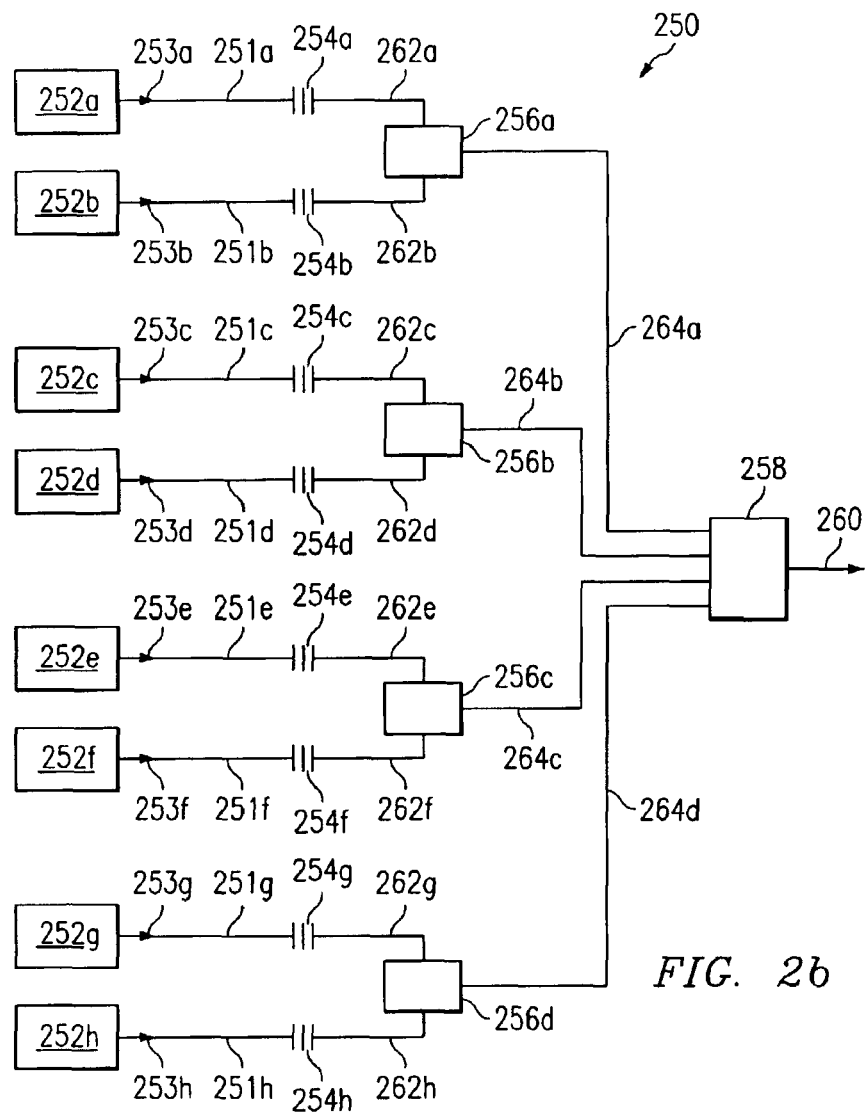

FIG. 1 is a block diagram showing at least a portion of an exemplary optical communication system 10 operable to facilitate communication of one or more multiple wavelength signals 16. Each multiple wavelength signal 16 comprises a plurality of optical wavelength signals (or channels) 15a–15n, each comprising a center wavelength of light. In some embodiments, each optical signal 15a–15n can comprise a center wavelength that is substantially different from the center wavelengths of other signals 15. As used throughout this document, the term "center wavelength" refers to a time-averaged mean of the spectral distribution of an optical signal. The spectrum surrounding the center wavelength need not be symmetric about the center wavelength. Moreover, there is no requirement that the center wavelength represent a carrier wavelength.

In this example, system 10 includes a transmitter assembly 12 operable to generate the plurality of optical signals (or channels) 15a–15n. Transmitters 12 can comprise any devices capable of generating one or more optical signals. Transmitters 12 can comprise externally modulated light sources, or can comprise directly modulated light sources.

In one embodiment, transmitter assembly 12 comprises a plurality of independent pairs of optical sources and associated modulators, each pair being operable to generate one or more wavelength signals 15. Alternatively, transmitter assembly 12 could comprise one or more optical sources shared by a plurality of modulators. For example, transmitter assembly 12 could comprise a continuum source transmitter including a mode-locked source operable to generate a series of optical pulses and a continuum generator operable to receive a train of pulses from the mode-locked source and to spectrally broaden the pulses to form an approximate spectral continuum of optical signals. In that embodiment, a signal splitter receives the continuum and separates the continuum into individual signals each having a center wavelength. In some embodiments, transmitter assembly 12 can also include a pulse rate multiplexer, such as a time division multiplexer, operable to multiplex pulses received from the mode locked source or the modulator to increase the bit rate of the system.

Transmitter assembly 12 may, in some cases, comprise a portion of an optical regenerator. That is, transmitter assembly 12 may generate optical signals 15 based on electrical representations of electrical or optical signals received from other optical communication links. In other cases, transmitter assembly 12 may generate optical signals 15 based on information received from sources residing locally to transmitters 12. Transmitter assembly 12 could also comprise a portion of a transponder assembly (not explicitly shown), containing a plurality of transmitters and a plurality of receivers.

In the illustrated embodiment, system 10 also includes a combiner 14 operable to receive wavelength signals 15a–15n and to combine those signals into a multiple wavelength signal 16. As one particular example, combiner 14 could comprise a wavelength division multiplexer (WDM). The terms wavelength division multiplexer and wavelength division demultiplexer as used herein may include equipment operable to process wavelength division multiplexed signals and/or equipment operable to process dense wavelength division multiplexed signals.

In this example, system 10 includes one or more booster amplifiers 18 operable to receive and amplify wavelengths of signal 16 in preparation for transmission over a communication medium 20.

System 10 communicates multiple wavelength signal 16 over an optical communication medium 20. Communication medium 20 can comprise a plurality of spans 20a–20n of fiber. Fiber spans 20a–20n could comprise standard single mode fiber (SMF), dispersion-shifted fiber (DSF), non-zero dispersion-shifted fiber (NZDSF), dispersion compensating fiber (DCF), or another fiber type or combination of fiber types. In various embodiments, communication medium 20 can comprise up to five (5) fiber spans, seven (7) fiber spans, ten (10) fiber spans, fifteen (15) fiber spans, twenty (20) fiber spans, or more.

Two or more spans of communication medium 20 can collectively form an optical link. In the illustrated example, communication medium 20 includes a single optical link 25 comprising numerous spans 20a–20n. System 10 could include any number of additional links coupled to link 25. For example, optical link 25 could comprise one optical link of a multiple link system, where each link is coupled to other links through, for example, optical regenerators.

Optical communication link 25 could comprise, for example, a unidirectional link or a bi-directional link. Link 25 could comprise a point-to-point communication link, or could comprise a portion of a larger communication network, such as a ring network, a mesh network, a star network, or any other network configuration.

Where communication system 10 includes a plurality of fiber spans 20a–20n, system 10 can also include one or more in-line amplifiers 22a–22m. In-line amplifiers 22 couple to one or more spans 20a–20n and operate to amplify multiple wavelength signal 16 as it traverses communication medium 20. Optical communication system 10 can also include one or more preamplifiers 24 operable to amplify signal 16 received from a final fiber span 20n. Amplifiers 18, 22, and 24 could each comprise, for example, one or more stages of discrete Raman amplification stages, distributed Raman amplification stages, rare earth doped amplification stages, such as erbium doped or thulium doped stages, semiconductor amplification stages or a combination of these or other amplification stage types. In some embodiments, amplifiers 18, 22, and 24 could each comprise bi-directional Raman amplifiers.

Throughout this document, the term "amplifier" denotes a device or combination of devices operable to at least partially compensate for at least some of the losses incurred by signals while traversing all or a portion of optical link 25. Likewise, the terms "amplify" and "amplification" refer to offsetting at least a portion of losses that would otherwise be incurred.

An amplifier may, or may not impart a net gain to a signal being amplified. Moreover, the terms "gain" and "amplify" as used throughout this document, do not (unless explicitly specified) require a net gain. In other words, it is not necessary that a signal experiencing "gain" or "amplification" in an amplifier stage experience enough gain to overcome all losses in the amplifier stage or in the fiber connected to the amplifier stage. As a specific example, distributed Raman amplifier stages typically do not experience enough gain to offset all of the losses in the transmission fiber that serves as a gain medium. Nevertheless, these devices are considered "amplifiers" because they offset at least a portion of the losses experienced in the transmission fiber.

Although optical link 25 is shown to include one or more booster amplifiers 18 and preamplifiers 24, one or more of the amplifier types could be eliminated in other embodiments.

In some cases, multiple wavelength signal 16 can carry wavelength signals 15a–15n ranging across a relatively wide bandwidth. In some implementations, wavelength signals 15a–15n may even range across different communications bands (e.g., the short band (S-band), the conventional band (C-band), and/or the long band (L-band)). Depending on the amplifier types chosen, one or more of amplifiers 18, 22, and/or 24 could comprise a wide band amplifier operable to amplify all signal wavelengths 15a–15n received.

Alternatively, one or more of those amplifiers could comprise a parallel combination of narrower band amplifier assemblies, wherein each amplifier in the parallel combination is operable to amplify a portion of the wavelengths of multiple wavelength signal 16. In that case, system 10 could incorporate signal separators and/or signal combiners surrounding the parallel combinations of amplifier assemblies to facilitate amplification of a plurality of wavelength groups of wavelengths prior to combining or recombining the wavelengths for communication through system 10.

System 10 may further include one or more access elements 27. For example, access element 27 could comprise an add/drop multiplexer, a cross-connect, or another device operable to terminate, cross-connect, switch, route, process, and/or provide access to and from optical link 25 and another optical link or communication device. System 10 may also include one or more lossy elements (not explicitly shown) coupled between spans 20a–20n of link 25. For example, the lossy element could comprise a signal separator, a signal combiner, an isolator, a dispersion compensating element, or a gain equalizer.

In this example, system 10 includes a separator 26 operable to separate individual optical signal 15a–15n from multiple wavelength signal 16 received at the end of link 25. Separator 26 can communicate individual signal wavelengths or ranges of wavelengths to a bank of receivers 28 and/or other optical communication paths. Separator 26 may comprise, for example, a wavelength division demultiplexer (WDM).

In one embodiment, at least one amplifier 18, 22, or 24 of system 10 comprises an amplifier that utilizes a gain fiber pumped by a laser diode based pump. Power amplification typically places a relatively large burden on the pump associated with the amplifier, in terms of both power levels and pump wavelength range. This is particularly true for Raman amplifiers. This disclosure recognizes that a laser diode based pump can provide a desired power level and pump wavelength range by combining the power of a plurality of grating-tuned laser diodes centered, for example, approximately at 1310 nm. For example, a plurality of laser diodes can be combined to produce power levels of 400 mW or more and can provide the desired pump wavelength range. In addition, a low noise and highly efficient pump source can be achieved by combining a plurality of grating-tuned laser diodes and operating the pump in the low-loss window of the transmission fiber used in fiber spans 20a–20n. As used throughout this document the phrase "low-loss window" refers to an operating characteristic of an optical transmission fiber that has an intrinsic fiber (e.g., excluding losses attributable to coupling, splicing, aging, etc.) loss of 0.4 decibels per kilometer or less for a given wavelength.

One aspect of this disclosure recognizes that combining a plurality of grating-tuned laser diodes approximately centered on the 1310 nm wavelength to pump the gain fiber enables a broadening of the gain spectrum. Broadening the gain spectrum of the amplifier allows the amplifier to amplify a wider range of wavelength signals, in particular in a Raman amplifier. As used throughout this document, the phrase "approximately centered on the 1310 nm wavelength" refers to a wavelength centered in the wavelength range between 1270 nm and 1350 nm. In some embodiments, the laser diode based pump centered at approximately the 1310 nm wavelength is capable of providing Raman gain through at least a substantial portion of the low-loss window of the optical transmission fiber. For example, the laser diode based pump centered at approximately the 1310 nm wavelength can provide gain in the 1400 nm window, the "violet" window (e.g., 1430–1525 nm) and the EDFA window (e.g., 1525–1610 nm).

In some embodiments, the combination of a plurality of grating-tuned laser diodes can produce an un-polarized broadband laser diode pump, particularly useful in Raman amplifiers. Implementing an un-polarized pump source provides the advantage of minimizing polarization dependent gain effects within the Raman amplifier. In one embodiment, the lasing wavelength of the plurality of laser diodes are combined using polarization multiplexers and wavelength multiplexers. As used throughout this document, the term "lasing wavelength" refers to the center wavelength of the signal generated by a pump source and/or a laser diode. Lasing wavelength is not intended to suggest that a range of wavelengths cannot be used.

In particular embodiments, the laser diode based pump can be used to directly pump the gain fiber of a Raman amplifier. The Raman amplifier may comprise a discrete Raman amplifier or a distributed Raman amplifier. Using a 1310 nm laser diode pumped Raman amplifier is advantageous in providing Raman gain in the 1400 nm window and the "violet" window of the optical fiber. In one particular embodiment, the laser diode based pump can be used to pump a distributed Raman amplifier, resulting in improved system margin. Improvements to system margin are typically desired, for example, in soliton-based systems and in systems with transmission fiber operating windows that have a relatively high loss coefficient.

In other embodiments, the laser diode based pump can be wavelength shifted using a broadband oscillator. In one particular embodiment, the broadband oscillator comprises a broadband Raman oscillator. The broadband oscillator can comprise, for example, one or more chirped fiber gratings in a linear cavity, one or more Sagnac Raman cavities, or one or more circulator loop cavities. Using a 1310 nm laser diode pumped broadband oscillator is advantageous in pumping a gain fiber in the 1400 nm window and the "violet" window of the transmission fiber. Using higher order cascades, the wavelength shifted 1310 nm laser diode pump can also be used to pump Raman or rare-earth doped gain fibers in the EDFA window.

In one particular embodiment, the laser diode pump implements a plurality of pairs of laser diodes, each pair centered on a different wavelength within the 1280 nm to 1340 nm wavelength range. Implementing pairs of laser diodes centered on a different wavelength allows additional control of the gain spectrum width and the gain flatness associated with the broadband Raman oscillator. In alternate embodiments, the laser diode pumped broadband Raman oscillator can be used as the pump for a distributed Raman amplifier in systems requiring additional system margin.

Whether implementing laser diode based pumps or not, some embodiments of system 10 can comprise at least one Raman amplifier that implements active gain equalization. As used throughout this document, the term "gain equalization" refers to a process of equalizing the gain response of an amplified optical signal so that substantially all amplified wavelength signals receive an approximately uniform gain over a particular spectral range. Conventional gain equalization techniques typically introduce a spectrally dependent loss in the path of the amplified optical signal. These techniques, referred to generally as "in-path" equalization techniques, seek to introduce a spectral loss profile that is approximately complimentary to the gain profile or spectrum of the optical amplifier. The substantially complimentary profiles, when added together, generate a substantially uniform gain over a desired spectral range.

The generation of spectral loss approximately complimentary to the gain spectrum of the amplifier has, in previous designs, typically required implementation of a gain equalizing filter in-line with the optical amplifier and the optical signal. For example, where the optical amplifier is a single stage amplifier, then the gain equalizing element was placed downstream of the optical amplifier in the optical signal path. Introducing gain equalization elements into the transmission path typically results in a reduction in the efficiency and noise figure of the amplifier, and results in a decrease in the signal-to-noise ratio for the optical communication system.

One aspect of the present disclosure recognizes that providing active gain equalization (AGEQ) to achieve an approximately uniform gain over a specified spectral range improves the efficiency and noise figure of the optical amplifier, and the signal-to-noise ratio of the system. As used throughout this document, the term "active gain equalization" or "AGEQ" refers to a gain equalization technique that tailors the pump signal spectrum to produce an approximately uniform gain over a specified spectral range. Thus, in active gain equalization, adding the tailored pump signal spectrum and the gain spectrum of the optical amplifier and/or amplifiers generates an approximately uniform gain over the desired spectral range. In some embodiments, active gain equalization can be used in combination with a laser diode pump approximately centered on the 1310 nm wavelength.

Implementing active gain equalization allows a reduction in the loss or the removal of the gain equalization element from the transmission path of the optical signal, if desired. This provides gain equalization while reducing spectrally dependent loss in the signal. In various embodiments, active gain equalization can be implemented to tailor the gain spectrum of the pump signal by utilizing a gain equalization element between the Raman gain fiber and a pump source or a broadband Raman oscillator. In some embodiments, active gain equalization can be implemented by utilizing a gain equalization element within a broadband Raman oscillator assembly to control the output spectrum for pumping the Raman gain fiber. In other embodiments, active gain equalization can be implemented by tailoring the amplitudes and/or power of the lasing wavelengths combined to form the pump signal.

Another aspect of this disclosure recognizes that active gain equalization can be used to upgrade existing optical amplifiers. As optical communication system designers continue to increase the capacity of optical communication systems, existing optical amplifiers can require upgrading to handle the increased capacity. In various embodiments, existing optical amplifiers can be upgraded to provide increased gain and output power, gain equalization, dispersion compensation, or a combination of these or other amplification upgrades. These upgrades can be implemented in either single-stage or multiple-stage optical amplifiers. In addition, active gain equalization can be used in distributed Raman amplifiers to upgrade high-loss systems, soliton transmission systems, and/or bi-directional transmission links.

In some embodiments, active gain equalization may be used to upgrade multiple stage amplifiers by implementing an active gain equalized pump source and a Raman gain fiber. In some cases, the Raman gain fiber can comprise a dispersion compensating fiber. In these embodiments, the dispersion compensating fiber and the active gain equalized pump source can be implemented at any intermediate stage in a multiple stage amplifier. In other embodiments, active gain equalization may be used to upgrade single stage optical amplifiers by implementing an active gain equalized pump source to create a distributed Raman amplifier. In these embodiments, the distributed Raman amplifier may comprise, for example, a low-noise pre-amplifier to the existing amplifier.

Regardless of whether system 10 implements laser diode pump sources or active gain equalization, in some embodiments, at least one amplifier 18, 22, and/or 24 can comprise a forward pumped or bi-directionally pumped Raman amplifier that implements a relatively high-dispersion gain fiber and/or a low-noise pump source. In various embodiments, the forward pumped or bi-directionally pumped Raman amplifier comprises a relatively high-dispersion gain fiber that provides adequate walk off to minimize cross talk and inter-channel interference between adjacent wavelength channels. In other embodiments, the Raman amplifier comprises a low-noise pump. Implementing a low-noise pump provides the advantage of minimizing cross talk between the pump signal and the amplified optical signals during the period the signals are co-propagating. In some embodiments, the low noise pump comprises a relatively low relative intensity noise (RIN) pump source. As used in this document the term "low noise pump" refers to a pump source capable of generating a noise fluctuation of no more than a twenty-two (22) percent in the at least one pump signal prior to propagation within the Raman gain medium. U.S. patent application Ser. No. 5,778,014 provides one example of a low noise pump source. The low RIN pump source can be selected, for example, as a function of the number of spans in the multiple span communications link and the dispersion acquired by optical signal 16 while traversing system 10.

In one particular embodiment, system 10 comprises a dispersion managed system capable of reducing the system penalties associated with chromatic dispersion and relative intensity noise (RIN). As used throughout this document, the term "dispersion managed" refers to a system that compensates for chromatic dispersion in multiple spans of the communication system. In this example, the dispersion managed system includes at least one in-line Raman amplifier and at least one dispersion compensating element coupled between spans 20a–20n of system 10.

In some embodiments, the dispersion acquired by optical signal 16 while traversing system 10 can comprise a residual dispersion and/or a local dispersion. As used throughout this document, the term "residual dispersion" refers to dispersion introduced into the span from a previous span in system 10. The term "local dispersion" refers to dispersion acquired by optical signal 16 while traversing a particular span of system 10.

In one particular embodiment, the dispersion compensating element comprises a maximum dispersion compensation level that provides only partial compensation for dispersion acquired by optical signal 16 while traversing a span of system 10. Providing only partial dispersion compensation in each span allows system 10 to maintain a sufficiently high dispersion. Maintaining a sufficiently high dispersion throughout system 10 is advantageous in providing adequate walk off between the pump signal and optical signal 16, which tends reduce the RIN system penalty.

II. Stimulated Raman Scattering and Raman Cascading

To provide a better understanding of the amplification mechanisms, stimulated Raman scattering and Raman cascading are first described. Stimulated Raman scattering is the result of third-order non-linearities that occur when a dielectric material such as an optical fiber is exposed to intense light. The third-order non-linear effect (e.g., Raman gain) is proportional to the instantaneous light intensity passing through a gain medium.

Stimulated Raman scattering is an important nonlinear process that turns optical fibers into amplifiers and tunable lasers. Raman gain results from the interaction of intense light with optical phonons in glass fibers, and Raman scattering leads to a transfer of energy from one optical beam (e.g., the pump) to another optical beam (e.g., the optical signal). The signal is downshifted in frequency (or upshifted in wavelength) by an amount determined by the vibrational modes and composition of a given glass fiber. The Raman gain coefficient $g_r$ for typical silica fibers extends over a relatively large frequency range (e.g., up to 40 THz) with a broad peak centered at approximately 13.2 THz (this corresponds to 440 cm$^{-1}$). The relatively large frequency range results from the amorphous nature of the silica glass and enables stimulated Raman scattering to be used in broadband amplifiers. The Raman gain depends at least in part on the composition of the fiber core and can vary the with core dopant concentration.

Raman amplification provides some advantageous features. First, Raman gain can be used to upgrade existing fiber optic links because Raman gain is based at least in part on the interaction of the pump signal with the optical phonons in the existing transmission fibers. Second, Raman gain provides minimal loss in the absence of pump power, which is an important consideration for system reliability. Third, the gain band associated with Raman gain is set by the pumping wavelengths. Fourth, peak Raman gain is proportional to pump power. Consequently, bandwidth can be increased by increasing the pump power.

Cascading is the mechanism by which optical energy at the pump wavelength is transferred, through a series of nonlinear polarizations, to an optical signal at a longer wavelength. Each nonlinear polarization of the dielectric produces a molecular vibrational state corresponding to a wavelength that is offset from the wavelength of the light that produced the stimulation. The nonlinear polarization effect is distributed throughout the dielectric, resulting in a cascading series of wavelength shifts as energy at one wavelength excites a vibrational mode that produces light at a longer wavelength. This process can cascade through numerous orders. Because the Raman gain profile has a peak centered at 13.2 THz in silica fibers, one Raman order can be arranged to be separated from the previous order by 13.2 THz. In other words, each Raman order shifts by a photon energy of 13.2 THz, which corresponds to about 80 nm, 90 nm, and 100 nm, at approximately the 1310 nm, 1400 nm, and 1460 nm wavelengths, respectively.

The effects of cascading results in stimulated Raman scattering amplifiers providing a beneficial effect in optical communication systems. Raman amplification can be used to amplify multiple wavelengths or short optical pulses because the Raman gain spectrum is relatively broad, for example, a bandwidth of greater than 5 THz around the 13.2 THz peak. Moreover, cascading enables Raman amplification over a wide range of different wavelengths. In some cases, Raman gain can be provided over the entire telecommunications window (e.g., 1300 nm to 1600 nm) by varying the pump wavelength or by using cascaded orders of Raman gain from a single or a few pump wavelengths. Thus, cascaded Raman orders provide an efficient means by which to accomplish frequency shifting from a pump signal to any desired wavelength on a longer wavelength side of the pump signal.

The effective gain bandwidth of Raman amplification is the convolution of the bandwidth of the pump with the Raman gain curve. In other words, broadening the bandwidth amplified by Raman amplification can occur because of the Raman amplification property that the gain spectrum follows the pump spectrum. Thus, as the pump spectrum changes, the Raman gain spectrum changes as well. This can be useful in both extending the wavelength range of a pump source, and in amplifying various wavelength signals through Raman transfer from the pump source.

III. Laser Diode Pump Sources

FIGS. 2A through 2D are block diagrams illustrating exemplary embodiments of laser diode pumps implementing a combination of laser diodes centered approximately at 1310 nanometers.

FIG. 2A depicts a pump source 200 including four laser diodes 202a–202d, each centered approximately at 1310 nanometers. Although this example uses four (4) laser diodes 202a–202d, any number of laser diodes can be used without departing from the scope of the present disclosure. Using laser diodes centered approximately at 1310 nanometers provides an advantage of facilitating use of simpler ternary material, such as ternary InGaAs, compared to more complex designs requiring quarternary materials. Use of laser diodes formed from quarternary materials is, however, also within the scope of this disclosure. Although these examples use laser diodes centered at approximately the 1310 nanometer wavelength, the laser diodes can be centered on any other desired wavelength without departing from the scope of the present disclosure. For example, in various embodiments, laser diodes 202a–202d can be centered at a wavelength between 1395 nanometers and 1510 nanometers.

Each laser diode generates an optical signal 203a–203d, respectively, which ranges over several nanometers of bandwidth. In order to more narrowly focus the wavelength range output from each laser diode, the illustrated embodiment implements wavelength selecting elements 204a–204d, coupled to outputs of laser diodes 202a–202d, respectively. In this particular example, wavelength selecting elements 204 each comprise an external fiber grating device. To enable the fiber grating device to control the lasing wavelength, this example avoids distributed feedback and/or a distributed Bragg reflector type laser diodes. In some embodiments, one or more anti-reflective coatings may be located between laser diode 202 and wavelength selecting element 204.

In various embodiments, each wavelength selecting element 204 is capable of reflecting at least five (5) percent of the desired lasing center wavelength 212. In some embodiments, each wavelength selecting element 204 is capable of tuning the lasing center wavelength 212 at least 30 nm from the gain peak of laser diode 202 coupled to wavelength selecting element 204. Maintaining a desired lasing wavelength when it is within 30 nm of the gain peak of a laser diode is advantageous in ensuring wavelength and output power stability over changes in drive current and/or temperature.

In some embodiments, wavelength selecting elements 204 are capable of maintaining the polarization of lasing wavelengths 212. For example, in the illustrated embodiment, polarization maintaining fibers 201 couple wavelength selecting elements 204 to laser diodes 202. Although not required in any embodiments, using polarization maintaining fiber to couple laser diodes 202 and wavelength selecting elements 204 can ensure substantially linearly polarized signals exiting wavelength selecting elements 204. In this example, the fiber pigtails of laser diodes 202 comprise polarization maintaining fibers 201 which are coupled to or further comprise wavelength selecting elements 204. In some embodiments, polarization maintaining fibers 201 can comprise one or more gratings. Where polarization maintaining fiber is not used, polarization can be substantially maintained by keeping the length of the external cavity sufficiently short. The external cavities formed between laser diodes 202 and wavelength selecting elements 204.

In this example, signals output from wavelength selecting elements 204a–204b comprise wavelengths of approximately 1310 nanometers, while signals output from wavelength selecting elements 204c–204d comprise wavelengths of approximately 1330 nanometers. Although this example uses the 1310 nm and 1330 nm lasing wavelengths, any other desired lasing wavelengths and spacing between the wavelengths can be used without departing from the scope of the present disclosure.

In the illustrated embodiment, pairs of outputs from laser diodes 202 are combined using polarization combiners 206. Polarization combiners 206 could comprise, for example, polarization beam splitters, polarization multiplexers, or birefringent elements. Using a pair of outputs from laser diodes 202a and 202b to generate a specific lasing wavelength is advantageous in generating a un-polarized pump, which minimizes polarization dependent gain effects within Raman amplifiers.

First polarization combiner 206a operates to combine lasing wavelengths 212a and 212b received from fiber wavelength selecting elements 204a and 204b, respectively, to generate a first un-polarized pump signal 214a. In a similar manner, second polarization combiner 206b operates to combine lasing wavelengths 212c and 212d and to generate a second un-polarized pump signal 214b.

In this example, pump 200 further includes a wavelength combiner 208 operable to combine un-polarized pump signals 214a and 214b into an un-polarized multiple wavelength pump signal 210. Wavelength combiner 208 may comprise any device capable of combining a plurality of wavelength signals into a multiple wavelength signal, such as, for example, one or more wavelength division multiplexers (WDM).

FIG. 2B depicts a pump source 250 including eight laser diodes 252a–252h, each centered approximately at 1310 nanometers. Although this example utilizes eight laser diodes 252a–252h, any number of laser diodes can be used without departing from the scope of the present disclosure. Each laser diode 252a–252h generates an optical signal 253a–253h, respectively, which ranges over several nanometers of bandwidth. The structure and function of each laser diode 252a–252h can be substantially similar to laser diodes 202a–202d of FIG. 2A.

In this embodiment, pump source 250 includes a plurality of wavelength selecting elements 254a–254h coupled to outputs of laser diodes 252a–252h and each operable to more narrowly focus the wavelength range from each laser diode. In this particular example, wavelength selecting elements 254 each comprise an external fiber grating device. To enable the fiber grating device to control the lasing wavelength, this example avoids distributed feedback and/or a distributed Bragg reflector type laser diodes. In some embodiments, one or more anti-reflective coatings may be located between laser diode 252 and fiber wavelength selecting element 254.

In various embodiments, each wavelength selecting element 254 is capable of reflecting at least five (5) percent of the desired lasing center wavelength 262. In some embodiments, each wavelength selecting element 254 is capable of tuning the lasing center wavelength 262 at least 30 nm from the gain peak of laser diode 252 coupled to wavelength selecting element 254. Maintaining a desired lasing wavelength when it is within 30 nm of the gain peak of a laser diode is advantageous in ensuring wavelength and output power stability over changes in drive current and/or temperature.

In some embodiments, wavelength selecting elements 254 are capable of maintaining the polarization of lasing wavelengths 262. For example, in the illustrated embodiment, polarization maintaining fibers 251 couple wavelength selecting elements 254 to laser diodes 252. Although not required in any embodiments, using polarization maintaining fiber to couple laser diodes 252 and wavelength selecting elements 254 can ensure substantially linearly polarized signals exiting wavelength selecting elements 254. In this example, the fiber pigtails of laser diodes 252 comprise polarization maintaining fibers 251 which are coupled to or further comprise wavelength selecting elements 254. In some embodiments, polarization maintaining fibers 251 can comprise one or more gratings. Where polarization maintaining fiber is not used, polarization can be substantially maintained by keeping the length of the external cavity sufficiently short. The external cavities formed between laser diodes 252 and wavelength selecting elements 254.

In this example, signals output from wavelength selecting elements 254a and 254b comprise wavelengths of approximately 1295 nm, while signals output from selecting elements 254c and 254d comprise wavelengths of approximately 1310 nm. In addition, output signals from wavelength selecting elements 254e and 254f comprise wavelengths of approximately 1325 nm, while signals output from selecting elements 254g and 254h comprise wavelengths of approximately 1340 nm. Although this example uses the 1295 nm, 1310 nm, 1325 nm, and 1340 nm lasing wavelengths, any other desired lasing wavelengths and wavelength spacing can be used without departing from the scope of the present disclosure.

In the illustrated embodiment, pairs of outputs from laser diodes 252 are combined using polarization combiners 256. Polarization combiners 256 could comprise, for example, polarization beam splitters, polarization multiplexers, or birefringent elements. Using a pair of outputs from laser diodes 252a and 252b to generate a specific lasing wavelength is advantageous in generating an un-polarized pump, which minimizes polarization dependent gain effects within Raman amplifiers.

In this example, pump 250 includes four (4) polarization combiners 256a–256d operable to combine a pair of lasing wavelengths 262 received from its respective wavelength selecting element 254 and to generate an un-polarized pump signal 264. For example, first polarization combiner 256a operates to combine lasing wavelengths 262a and 262b received from wavelength selecting elements 254a and 254b, respectively, to generate a first un-polarized pump signal 264a.

In this example, pump source 250 further includes a wavelength combiner 258 operable to combine un-polarized pump signals 264a, 264b, 264c, and 264d into an un-polarized multiple wavelength pump signal 260. Wavelength combiner 258 may comprise any device capable of combining a plurality of wavelength signals into a multiple wavelength signal, such as, for example, one or more wavelength division multiplexers (WDM).

Figure 2D:
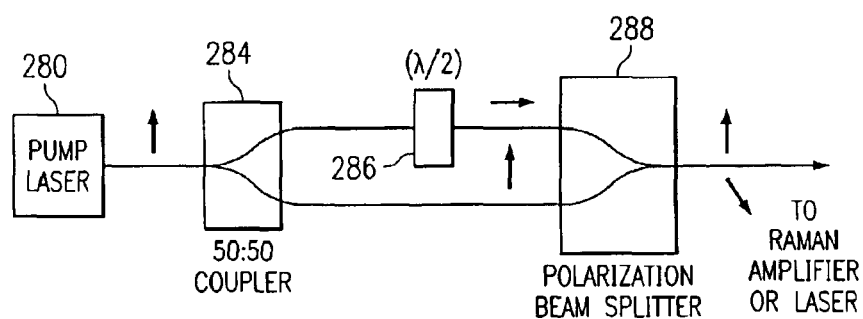

FIGS. 2C and 2D illustrate two embodiments of techniques to create polarization diversity pumping. A pump laser 280, such as a cladding-pumped fiber laser, can be linearly polarized. As depicted in FIG. 2C, pump laser 280 is coupled to a length of polarization maintaining fiber 282, where the light is coupled at forty-five (45) degrees to the fiber axes, and the birefringence of the polarization maintaining fiber splits the two polarizations. The fiber can be rotated to accommodate the launch angle, or a quarter or half-wave retarder 290 can be used at the entrance end of the polarization maintaining fiber to adjust the polarization. Alternately, as shown in FIG. 2D, a 50:50 coupler 284 is used to split the pump light into two beams. The polarization of one of the beams is then rotated by a quarter or half-wave retarder 286, and the two beams are then combined using a polarization beam splitter 288. Once separated along two axes, the pump light is then delivered to the Raman amplifier or laser configurations. The polarization diversity scheme can be combined with other improvements disclosed in the specification.

FIG. 3 is a chart illustrating three exemplary Raman cascade orders starting from laser diodes centered at approximately the 1310 nm wavelength and exemplary applications for each order. In this example, the pump comprises a plurality of laser diodes centered approximately at the 1310 nm wavelength. The 1310 nm laser diode pump is capable of directly pumping a Raman amplifier or capable of use in a broadband Raman oscillator. The broadband Raman oscillator operates to wavelength shift the Raman gain spectrum to the desired wavelength window. In this example, each of the plurality of laser diodes is combined with another laser diode to form a pair of laser diodes. In this example, the pump comprises five (5) pairs of laser diodes each pair of laser diodes generates a lasing wavelength that spaced approximately 15 nm from the adjacent lasing wavelength.

As illustrated in this chart, each Raman order shifts by a photon energy of approximately 13.2 THz. This shift corresponds roughly to about 80 nm, about 90 nm, and about 100 nm at approximately the 1310 nm, 1400 nm, and 1460 nm wavelengths, respectively. In this example, the 1310 nm laser diode pump can be used to directly pump a Raman amplifier for the 1400 nm window or as a Raman oscillator pump for the "violet" window. The second cascade order can be used as a Raman amplifier for the "violet" window or a Raman oscillator pump for supplementing the EDFA window with either active gain equalization, dispersion compensating fiber, or distributed Raman amplification. Finally the third cascade order can be used for an amplifier to supplement the EDFA band, either with discrete or distributed gain, using Raman or other types of amplification.

IV. Wavelength Shifters

Figure 4A:
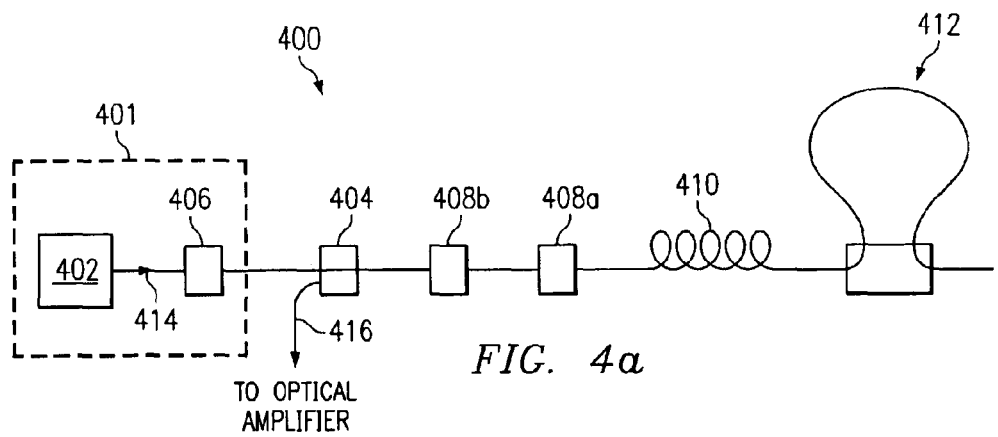
FIGS. 4A through 4C are block diagrams illustrating example embodiments of wavelength shifters capable of generating a multiple wavelength output signal from a single wavelength input signal.
Figure 4B:
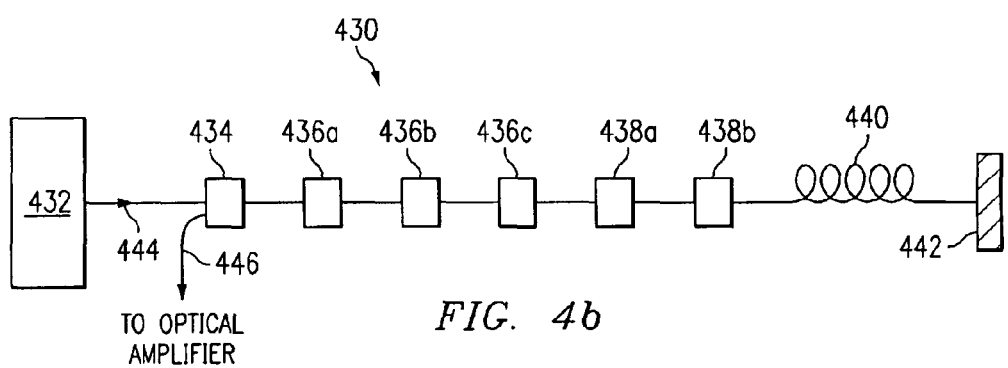
Figure 4C:
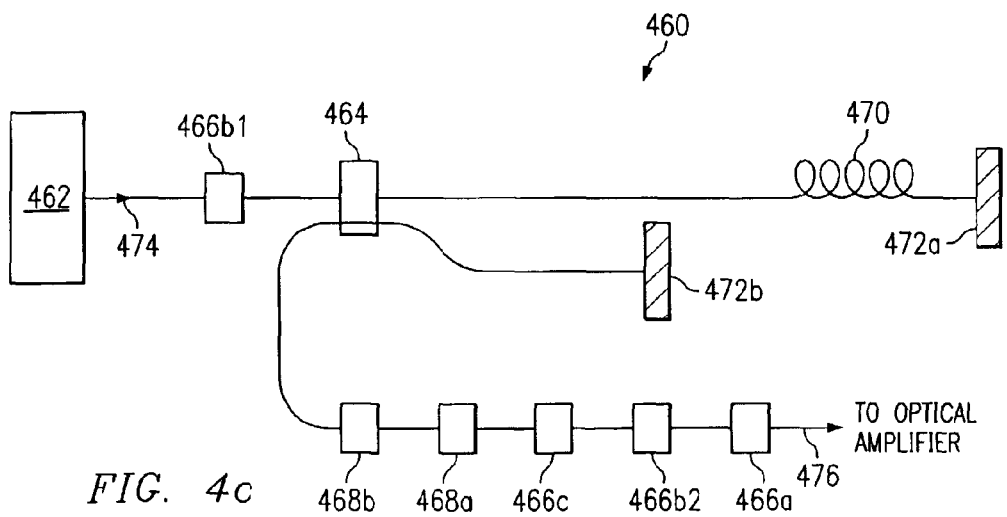

FIGS. 4A through 4C are block diagrams illustrating example embodiments of wavelength shifters capable of generating a multiple wavelength output signal from a single wavelength input signal. Although FIGS. 4A through 4C describe particular examples of wavelength shifters, other wavelength shifter designs can be implemented without departing from the scope of the present disclosure. The wavelength shifter designs described in FIGS. 4A through 4C are for illustrative purposes only. In various embodiments, the wavelength shifters illustrated in FIGS.

4A through 4C can control the power level for each wavelength in the output signal. Generating a multiple wavelength output signal from a single pump input signal and controlling the output power of each wavelength advantageously enables tailoring of the gain spectrum of an optical amplifier coupled to the wavelength shifter.

FIG. 4A is a block diagram illustrating an example embodiment of a wavelength shifter 400 capable of generating a multiple wavelength output signal 416 from a single pump input signal 414. In this particular embodiment, wavelength shifter 400 operates to generate multiple wavelength output signal 416 with at least 1314 nanometer and 1324 nanometer wavelengths. In this example, wavelength shifter 400 includes pump source 401 operable to generate a pump input signal 414. In this particular embodiment, pump source 401 comprises fiber laser 402 capable of generating an 1117 nanometer pump signal, and a Raman resonator 406 capable of shifting pump signal 414 at least one Raman cascade orders. Raman resonator 406 may comprise any device capable of shifting pump signal 414 at least one Raman cascade order. In this particular embodiment, Raman resonator 406 operates to shift the 1117 nanometer pump signal two Raman cascade orders (e.g., to 1240 nanometers). In some embodiments, varying the current supplied to fiber laser 402 can operate to control the power level for each wavelength in output signal 416.

In this example, wavelength shifter 400 includes at least a first selecting element 408a and a second selecting element 408b. Selecting elements 408a and 408b can comprise any device, such as, for example, a dielectric grating or one or more Fabry Perot filters. Each selecting element 408a and 408b operates to transmit a portion of a desired wavelength to be output from wavelength shifter 400. In addition, each selecting element 408a and 408b operates to at least partially reflect a desired wavelength to a gain medium 410 to allow wavelength shifter 400 to continue lasing at the desired wavelength or wavelengths. In this example, elements 408a and 408b comprise partially transmitting gratings approximately centered on the 1314 and 1324 nanometer wavelengths, respectively.

Raman gain fiber 410 operates to shift the frequency response of pump input signal 414 to one or more desired wavelengths to form multiple wavelength output signal 416. Gain fiber 410 may comprise any fiber type capable of wavelength shifting pump input signal 414 to a different Raman cascade order. In various embodiments, gain fiber 410 may comprise, for example, a dispersion compensating fiber or dispersion shifted fiber. In one particular embodiment, gain fiber 410 comprises a dispersion shifted fiber with a fiber length of approximately two kilometers. Wavelength shifter 400 also includes a reflector 412 operable to at least partially reflect pump input signal 414. In this particular embodiment, reflector 412 comprises a Sagnac mirror with a 50:50 coupler. Selecting elements 408 and reflector 412 form optical cavities where output signals 416 are generated within gain medium 410.

In this example, wavelength shifter 400 includes a wavelength separator 404 capable of de-coupling the desired pump wavelengths received from selecting elements 408. Separator 404 could comprise, for example, a wavelength division demultiplexer or an optical coupler.

FIG. 4B is a block diagram illustrating an example embodiment of a wavelength shifter 430 capable of generating a multiple wavelength output signal 446 from a single pump input signal 444. In this example, wavelength shifter 430 is similar in structure and function to wavelength shifter 400 of FIG. 4A. Like shifter 400, wavelength shifter 430 includes a fiber laser 432, a Raman gain fiber 440, a wavelength separator 434, and a reflector 442. In this particular example, gain fiber 440 comprises a dispersion compensating fiber with a fiber length of approximately one-half kilometer, while reflector 442 comprises a reflective mirror. In this particular embodiment, wavelength shifter 430 operates to generate multiple wavelength output signal 446 with at least 1396 nanometer and 1421 nanometer wavelengths.

Wavelength shifter 430 also includes at least a first selecting element 438a and a second selecting element 438b. Although this example includes two selecting elements 438a and 438b, any number of selecting elements can be used without departing from the scope of the present disclosure. The structure and function of selecting elements 438a and 438b can be substantially similar to selecting elements 408a and 408b of FIG. 4A. In this example, selecting element 438a comprises a grating that is approximately twenty (20) percent reflective and is approximately centered on the 1396 nanometer wavelength. Selecting element 408b comprises a grating that is approximately forty (40) percent reflective and is approximately centered on the 1421 nanometer wavelength.

The example shown in FIG. 4B differs from the example shown in FIG. 4A in that wavelength shifter 430 implements a plurality of reflective gratings 436a–436c each centered on a different wavelength of a reflection band. Although this example includes three gratings 436a–436c, any number of gratings can be used without departing from the scope of the present disclosure. Gratings 436a–436c can comprise any device, such as, for example, a high-reflectivity dielectric grating. In this particular example, each of gratings 436a–436c comprises a grating with a reflectivity between ninety-five (95) to one hundred (100) percent at the center wavelength. Gratings 436a–436c operate to facilitate cascading of pump input signal 444 to a desired lasing wavelength. In this example, gratings 436a, 436b, and 436c are approximately centered on the 1175, 1240, and 1311 nanometer wavelengths, respectively.

In some embodiments, varying the current supplied to fiber laser 432 can operate to control the power level for each wavelength in output signal 446. An illustrative example of how varying the current supplied to fiber laser 432 can affect the power level of each output wavelength in output signal 446 is set forth in Table 1.

TABLE 1

| Drive Current | Total Pump Signal Power | 1396 nm Wavelength Power Level | 1421 nm Wavelength Power Level |
| --- | --- | --- | --- |
| 14.0 amps | 369 mW | 57.8% | 38.0% |
| 14.5 amps | 414 mW | 47.6% | 48.5% |
| 15.0 amps | 460 mW | 38.6% | 57.5% |
| 16.0 amps | 560 mW | 22.8% | 73.3% |

FIG. 4C is a block diagram illustrating an example embodiment of a wavelength shifter 460 capable of generating a multiple wavelength output signal 476 from a single pump input signal 474. In this example, wavelength shifter 460 is similar in structure and function to wavelength shifter 430 of FIG. 4B. Like shifter 430, wavelength shifter 460 includes a fiber laser 462, a wavelength separator 464, a Raman gain fiber 470, reflectors 472, selecting elements 468a–468b, and a plurality of reflective gratings 466a–466c. Gratings 466a, 466b1, 466b2, and 466c are approximately centered on the 1175, 1240, 1240, and 1311 nanometer wavelengths, respectively. In this particular embodiment, wavelength shifter 460 operates to generate multiple wavelength output signal 476 with at least 1396 nanometer and 1421 nanometer wavelengths.

The example shown in FIG. 4C differs from the example shown in FIG. 4B in that wavelength shifter 460 implements separator 464 within the laser cavity. In this example, the laser cavity comprises that portion of wavelength shifter 460 residing between reflective gratings 466a and 466b1 on one end and reflectors 472 on the other end. Separator 464 can comprises any device capable of de-coupling multiple Raman cascade orders and the desired pump wavelengths from wavelength shifter 460. In this particular example, separator 464 comprises a wavelength division multiplexer coupler with a sinusoidal filter function.

Figure 5:
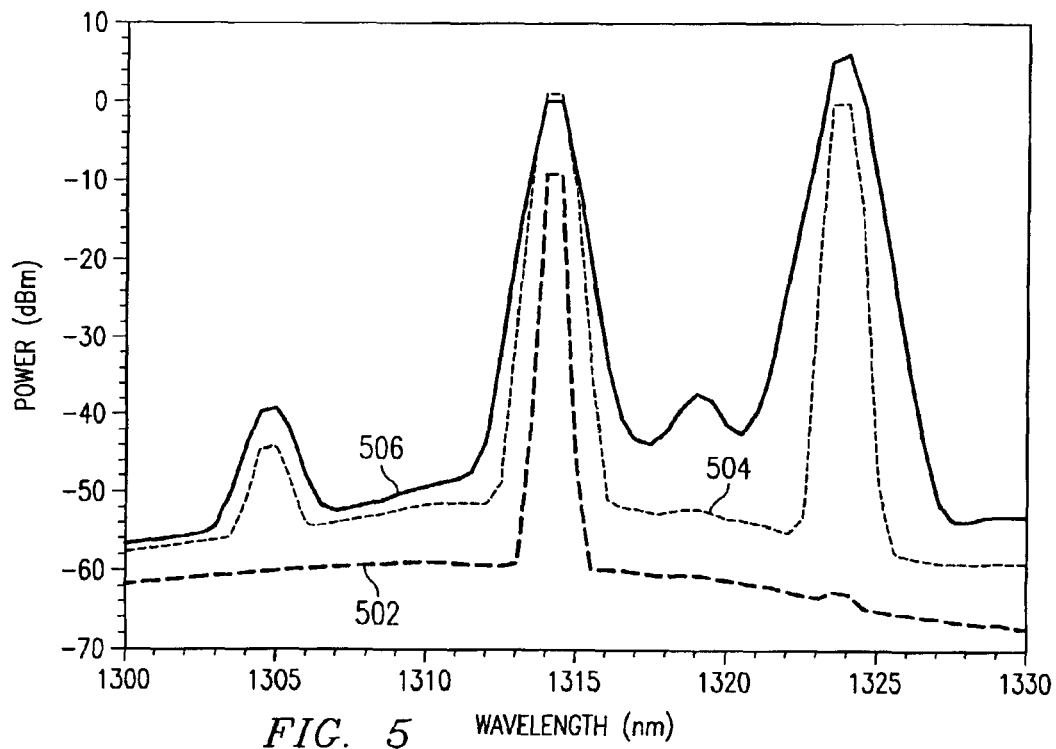
FIG. 5 is a graph illustrating example wavelength spectra generated by a wavelength shifter from a single pump input wavelength.

FIG. 5 is a graph illustrating example output spectra generated by a wavelength shifter from a single pump input wavelength. In this particular embodiment, the wavelength shifter comprises at least a first grating approximately centered on the 1314 nanometer wavelength and a second grating approximately centered on the 1324 nanometer wavelength. In various embodiments, the structure and function of the wavelength shifter can be substantially similar to any the wavelength shifters depicted in FIGS. 4A through 4C. In this example, each of lines 502, 504, and 506 represents an output spectrum that was generated from a single pump input wavelength. Line 502 represents the output spectrum generated while the fiber laser is receiving a current of approximately nine (9) amps. Line 504 represents the output spectrum generated while the fiber laser is receiving a current of approximately twelve (12) amps. Line 506 represents the output spectrum generated while the fiber laser is receiving a current of approximately eighteen (18) amps. The horizontal axis represents the output lasing wavelength, while the vertical axis represents the output signal power.

This graph illustrates that modifying the current supplied to the fiber laser can result in a change of the power of each of the desired output wavelengths generated by the wavelength shifter. In most cases, the wavelength shifter causes the shorter wavelength to lase within the laser cavity at a lower fiber laser power than the longer wavelength. As illustrated by output spectrum 502, only the 1314 nanometer wavelength lases within the laser cavity while the fiber laser is receiving a current of approximately nine (9) amps. As the current supplied to the fiber laser increases, the wavelength shifter causes the longer wavelength to lase and increases the overall power level of the shorter wavelength. Output spectrum 504 shows that the 1324 nanometer wavelength lases and the power level of the 1314 nanometer wavelength increases by approximately ten (10) decibels after the current supplied to the fiber laser has been increased to twelve (12) amps.

This graph further illustrates that at some point the longer wavelength signal begins to deplete the shorter wavelength signal as the current supplied to the fiber laser is increased. For example, output spectrum 506 shows that the power level associated with the 1324 nanometer wavelength is approximately six (6) decibels higher than the power level associated with the 1314 nanometer wavelength. Modifying the power levels associated with each of the lasing wavelengths can advantageously enable tailoring of the gain spectrum of an optical amplifier coupled to the wavelength shifter.

V. Broadband Raman Oscillators as Wavelength Shifters

Figure 6A:
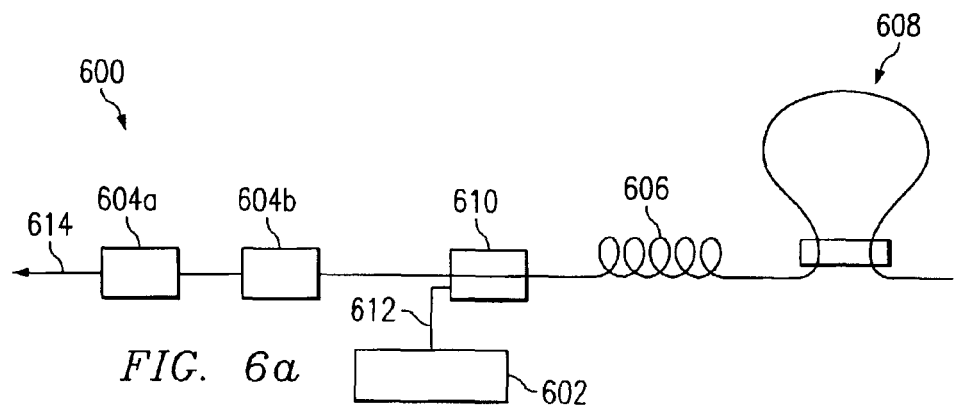
FIGS. 6A and 6B are block diagrams illustrating exemplary embodiments of broadband Raman oscillators.
Figure 6B:
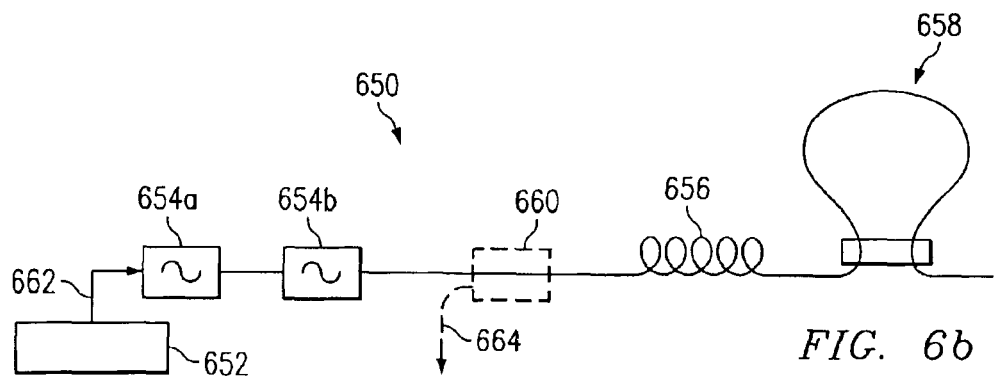

FIGS. 6A and 6B are block diagrams illustrating exemplary embodiments of broadband Raman oscillators. In these embodiments, each broadband Raman oscillator 600 and 650 comprises a pump 602 and 652, respectively, capable of generating a relatively low noise pump signal. In various embodiments, the structure and function of pumps 602 and 652 can be substantially similar to any of the pump sources in FIGS. 2A through 2D. Broadband Raman oscillator 600 and 650 each operate to wavelength shift the lasing wavelengths generated by pumps 602 and 652, which produces an oscillator output signal 614 and 664, respectively, at a desired frequency for Raman amplification.

In these embodiments, each broadband Raman oscillator 600 and 650 comprises at least one wavelength control element 604 and 654 coupled to one end of a Raman gain fiber 606 and 656, respectively. Oscillators 600 and 650 also include a reflector 608 and 658, such as, for example, a Sagnac mirror coupled to the other end of Raman gain fiber 606 and 656, respectively. Gain is provided by a Raman gain fiber that is pumped by pump 602 and 652.

FIG. 6A is a block diagram illustrating an exemplary embodiment of a broadband Raman oscillator 600 implementing a pump 602. In this example, oscillator 600 includes pump 602 operable to generate a pump signal 612 and a Raman gain fiber 606 operable to facilitate shifting the frequency response of pump signal 612. Pump signal 612 can comprise, for example, a multiple wavelength signal generated by a plurality of laser diodes or a single pump source as in FIGS. 4A through 4C. In one particular example, pump signal 612 comprises at least one wavelength approximately centered at the 1310 nm wavelength. Gain fiber 606 may comprise any fiber type capable of wavelength shifting pump signal 612 to a different Raman cascade order. In various embodiments, gain fiber 606 may comprise, for example, an optical fiber comprising a high germanium content, a large core-cladding index difference, and a small effective area. In one particular embodiment, gain fiber 606 comprises a fiber length of at least one (1) kilometer.

In this embodiment, oscillator 600 includes a wavelength combiner 610 capable of coupling pump signal 612 to oscillator 600 and transmitting all other Raman cascade orders. Wavelength combiner 610 may comprise any device, such as, for example, a wavelength division multiplexer. Oscillator 600 also includes a reflector 608 operable to at least partially reflect pump signal 612 and a plurality of wavelength control elements 604. In this particular embodiment, reflector 608 comprises a Sagnac mirror with a 50:50 coupler. Although this example uses two control elements 604a and 604b, any number of elements may be used without departing from the scope of the present disclosure. Control elements 604 may comprise any device, such as, for example, a broadband grating, a dielectric filter, or a wavelength division multiplexer filter. In this example, elements 604a and 604b are partially transmitting gratings. Control elements 604a and 604b operate to communicate the desired Raman cascade order from broadband Raman oscillator 600. In this example, elements 604a and 604b are centered on the desired Raman cascade order.

FIG. 6B is a block diagram illustrating an exemplary embodiment of a broadband Raman oscillator 650 implementing a pump 652. In this example, oscillator 650 includes pump 652 operable to generate a pump signal 662 and a plurality of wavelength control elements 654 operable to couple one or more selected wavelengths of pump signal 662 to oscillator 650. Pump signal 662 can comprise, for example, a multiple wavelength signal generated by a plurality of laser diodes or a single pump source as in FIGS. 4A through 4C. In one particular example, pump signal 662 comprises at least one wavelength approximately centered at the 1310 nm wavelength. Although this example uses two control elements 654a and 654b, any number of elements may be used without departing from the scope of the present disclosure. In this example, elements 654a and 654b also operate to reject all other Raman cascade orders. Control elements 654a and 654b enable pump signal 662 to pass and substantially reflect the cascaded signals generated within oscillator 650.

In this embodiment, oscillator 650 also includes a Raman gain fiber 656 operable to shift the frequency response of pump signal 662. Gain fiber 656 may comprise any fiber type capable of wavelength shifting pump signal 662 to a different Raman cascade order. In various embodiments, gain fiber 656 may comprise, for example, an optical fiber comprising a high germanium content, a large core-cladding index difference, and a small effective area. In one particular embodiment, gain fiber 656 comprises a fiber length of at least one (1) kilometer.

In this embodiment, oscillator 650 also includes a reflector 658 operable to at least partially reflect pump signal 662, and at least one wavelength division multiplexer 660 capable of de-coupling the desired Raman cascade order. In this particular embodiment, high reflector 658 comprises a Sagnac mirror with a 50:50 coupler.

Figure 7A:
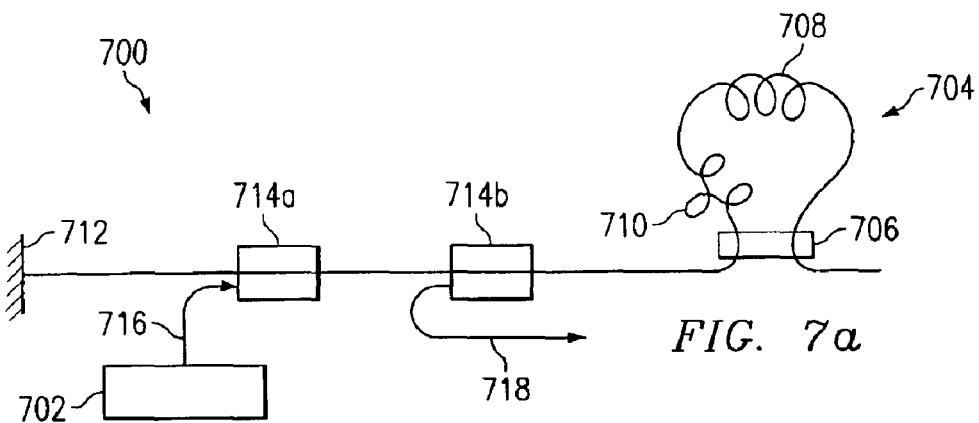
FIGS. 7A through 7C are block diagrams illustrating exemplary embodiments of broadband Raman oscillators implementing Sagnac Raman cavities.
Figure 7B:
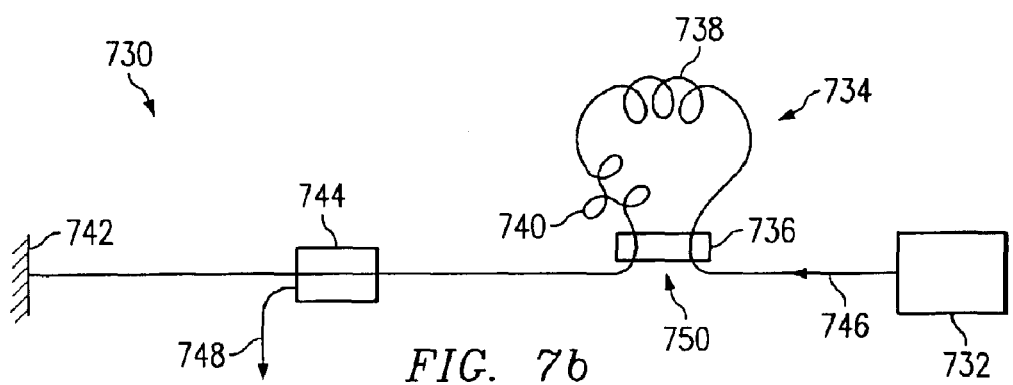
Figure 7C:
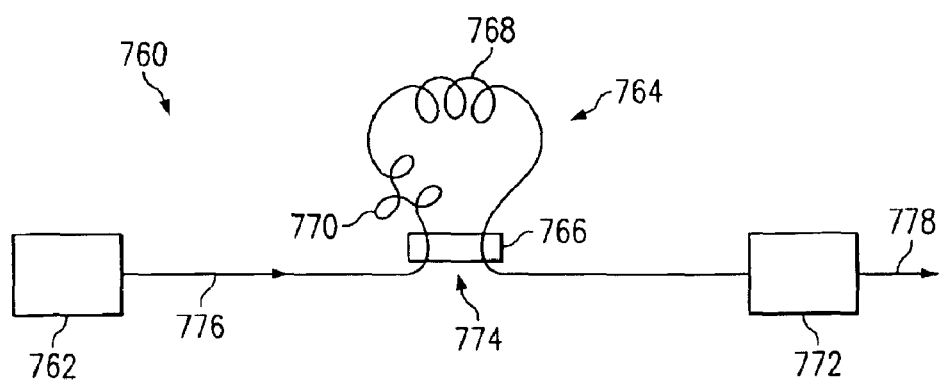

FIGS. 7A through 7C are block diagrams illustrating exemplary embodiments of broadband Raman oscillators implementing Sagnac Raman cavities. In these embodiments, each broadband Raman oscillator 700, 730, and 760 comprises a pump 702, 732, and 762, respectively, capable of generating a relatively low noise pump signal. In various embodiments, the structure and function of pumps 702, 732, and 762 can be substantially similar to any of the pump sources in FIGS. 2A through 2D. Each broadband Raman oscillator 700, 730, and 760 operates to wavelength shift the lasing wavelengths generated by pumps 702, 732, and 762 to the desired Raman cascade order. Each broadband Raman oscillator 700, 730, and 760 is capable of producing an oscillator output signal 718, 748, and 778, respectively, at a desired lasing wavelength or wavelengths.

In these embodiments, each broadband Raman oscillator 700, 730, and 760 comprises a Sagnac Raman mirror 704, 734, and 764. Each Sagnac Raman mirror comprises a gain fiber 708, 738, and 768 operable to facilitate shifting the pump signals received from pumps 702, 732, and 762. In these examples, the ends of each Sagnac Raman mirror are coupled to an optical coupler 706, 736, and 766. Optical coupler 706, 736, and 766 may comprise an approximately 50:50 coupler from the pump signal wavelength to the output signal wavelength. Although this example uses a 50:50 coupler to connect the ends of the Sagnac Raman mirror, any other coupler may be used without departing from the scope of the present disclosure.

In some embodiments, each Sagnac Raman mirror 704, 734, and 764 may include a polarization controller 710, 740, and 770 operable to control a polarization state of the desired Raman cascade order. In other embodiments, each gain fiber 708, 738, and 768 may comprise a polarization maintaining fiber operable to control a polarization state of the desired Raman cascade order. Using Sagnac Raman mirrors 704, 734, and 764 provides the advantage of generating a passive noise dampening property, which tends to lead to relatively quiet cascading of various Raman orders.

FIG. 7A is a block diagram illustrating an exemplary embodiment of a broadband Raman oscillator 700 implementing a Sagnac Raman mirror 704. In this example, oscillator 700 comprises at least a first wavelength combiner 714a and a second wavelength combiner 714b. Although this example uses two wavelength combiners 714a and 714b, any other number of combiners may be used without departing from the scope of the present disclosure. Wavelength combiners 714a and 714b may comprise any device capable of coupling and/or de-coupling one or more wavelength signals to and/or from oscillator 700, for example, a wavelength division multiplexer. In this example, first combiner 714a operates to couple a particular Raman cascade order pump signal 716 to oscillator 700 and to transmit all other Raman cascade orders. In one particular embodiment, pump signal 716 comprises at least one lasing wavelength approximately centered at the 1310 nm wavelength. Second combiner 714b operates to de-couple oscillator output signal 718 from oscillator 700 and to transmit all other wavelength signals. Oscillator output signal 718 may comprise, for example, a desired Raman cascade order.

In this particular embodiment, broadband Raman oscillator includes a reflector 712 operable to substantially reflect all wavelength signals contained within oscillator 700. Reflector 712 may comprise any device capable of reflecting a wide range of wavelength signals, such as, for example, a mirror.

FIG. 7B is a block diagram illustrating an exemplary embodiment of a broadband Raman oscillator 730 implementing a Sagnac Raman mirror 734. In this example, oscillator 730 includes a laser diode pump 732 coupled to a port 750 of optical coupler 736. Port 750 of optical coupler 736 operates to couple a pump signal 746 to oscillator 730. In one particular embodiment, pump signal 746 comprises at least one lasing wavelength approximately centered at the 1310 nm wavelength.

In the illustrated embodiment, oscillator 730 includes a wavelength combiner 744 operable to de-couple oscillator output signal 748 and to transmit all other Raman cascade orders. Wavelength combiner 744 may comprise any device capable of de-coupling one or more wavelength signals from oscillator 730, for example, a wavelength division demultiplexer. Oscillator output signal 748 may comprise, for example, a desired Raman cascade order.

In this particular embodiment, broadband Raman oscillator 730 includes a reflector 742 operable to substantially reflect all wavelength signals contained within oscillator 730. Reflector 742 may comprise any device capable of reflecting a wide range of wavelength signals, such as, for example, a mirror.

FIG. 7C is a block diagram illustrating an exemplary embodiment of a broadband Raman oscillator 760 implementing a Sagnac Raman mirror 764. In this example, oscillator 760 includes a laser diode pump 762 coupled to a port 774 of optical coupler 766. Port 774 of optical coupler 766 operates to couple a pump signal 776 to oscillator 760. In one particular embodiment, pump signal 766 comprises at least one lasing wavelength approximately centered at the 1310 nm wavelength.

In the illustrated embodiment, oscillator 760 includes a wavelength control element 772 operable to de-couple oscillator output signal 778 and to reflect all other Raman cascade orders and wavelength signals. Control element 772 may comprise any device, such as, for example, a broadband grating, a dielectric filter, or a wavelength division multiplexer filter. In this example, element 772 comprises a partially transmitting grating. In this example, element 772 is centered on the desired Raman cascade order.

Figure 8:
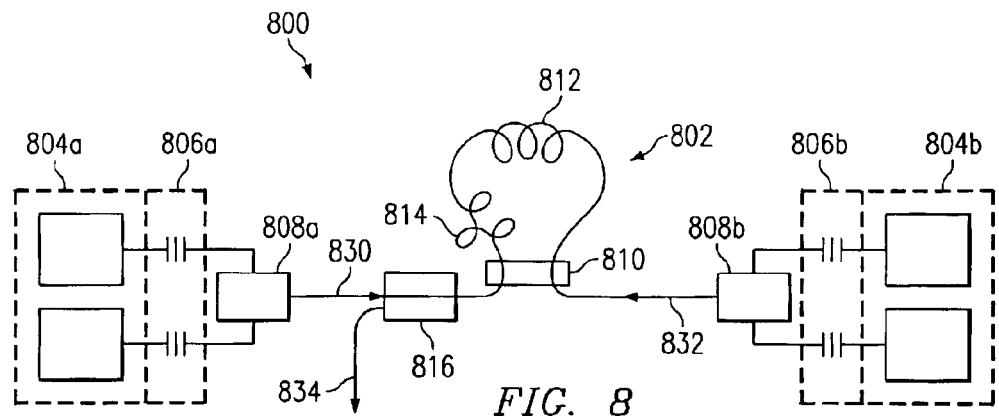
FIG. 8 is a block diagram illustrating an exemplary embodiment of a broadband Raman oscillator implementing a Sagnac Raman mirror.

FIG. 8 is a block diagram illustrating an exemplary embodiment of a broadband Raman oscillator 800 implementing a Sagnac Raman mirror 802. In this example, broadband Raman oscillator 800 includes at least a first pair of laser diodes 804a and a second pair of laser diodes 804b. Although this example includes two pairs of laser diodes 804a and 804b, any additional number of laser diode pairs can be used without departing from the scope of the present disclosure. Each pair of laser diodes 804a and 804b is capable of producing an un-polarized pump signal 830 and 832, respectively, at a desired lasing wavelength or wavelengths. In one particular embodiment, each pair of laser diodes 804 is capable of generating a lasing wavelength centered at approximately 1310 nm. In some embodiments, the lasing wavelengths can be chosen to provide a desired Raman gain spectrum.

In this embodiment, broadband Raman oscillator 800 includes at least a first pair of fiber grating devices 806a and a second pair of fiber grating devices 806b. Although this example includes two pairs of fiber grating devices 806a and 806b, any additional number of grating device can be used without departing from the scope of the present disclosure. The structure and function of each fiber grating device within pairs of fiber grating devices 806a and 806b can be substantially similar to wavelength selecting elements 204a–204d of FIG. 2A.

In this embodiment, broadband Raman oscillator 800 includes at least a first polarization combiner 808a and a second polarization combiner 808b. Although this example includes two polarization combiners 808a and 808b, any additional number of polarization combiners may be used without departing from the scope of the present disclosure. The structure and function of polarization combiners 808a and 808b can be substantially similar to polarization combiners 206 of FIG. 2A. In this particular embodiment, first polarization combiner 808a operates to generate pump signal 830, while second polarization combiner 808b operates to generate pump signal 832.

In this embodiment, broadband Raman oscillator 800 includes a Sagnac Raman mirror 802 operable to wavelength shift pump signals 830 and 832 generated by laser diode pairs 804a and 804b to the desired Raman cascade order. Sagnac Raman mirror 802 also operates to combine pump signals 830 and 832. Sagnac Raman mirror 802 comprises a gain fiber 812 operable to wavelength shift pump signals 830 and 832 to the desired Raman cascade order.

In some embodiments, Sagnac Raman mirror 800 may include a polarization controller 814 operable to control a polarization state of the desired Raman cascade order. In other embodiments, gain fiber 812 may comprise a polarization maintaining fiber operable to control a polarization state of the desired Raman cascade order. Using Sagnac Raman mirror 802 provides the advantage of generating a passive noise dampening property, which tends to lead to relatively quiet cascading of various Raman orders.

In this embodiment, broadband Raman oscillator 800 includes an optical coupler 810 coupled to the ends of Sagnac Raman mirror 802 and operable to combine pump signals 830 and 832 to form a multiple wavelength pump signal. Optical coupler 810 may comprise any coupling device, such as, for example, an approximately 50:50 coupler from the wavelengths of pump signals 830 and 832 to the wavelengths of oscillator output signal 834. Although this example uses a 50:50 coupler, any other coupler may be used without departing from the scope of the present disclosure.

In this embodiment, broadband Raman oscillator 800 includes a wavelength combiner 816 operable to de-couple oscillator output signal 834 and to transmit all other Raman cascade orders and pump signals 830 and 832. Wavelength combiner 816 may comprise any device capable of de-coupling one or more wavelength signals from oscillator 800, for example, a wavelength division demultiplexer. Oscillator output signal 834 may comprise, for example, a desired Raman cascade order.

Figure 9:
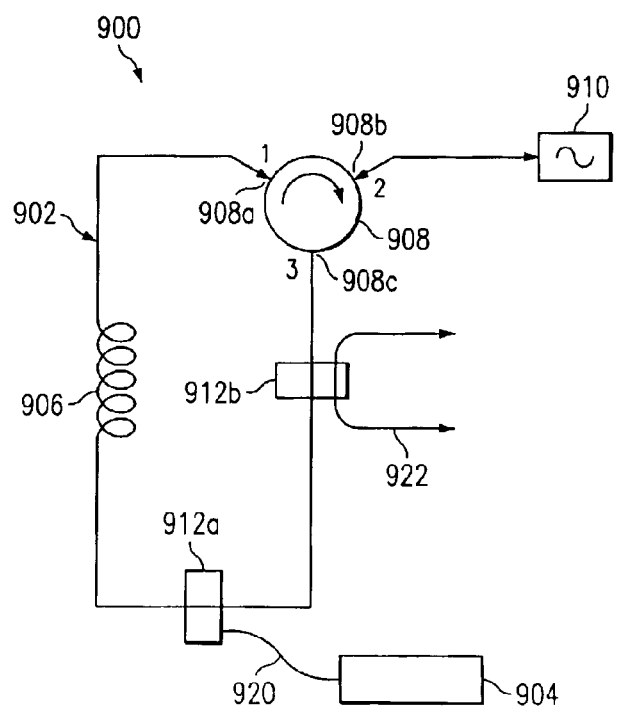
FIG. 9 is a block diagram illustrating an exemplary embodiment of a broadband Raman oscillator implementing a circulator loop cavity.

FIG. 9 is a block diagram illustrating an exemplary embodiment of a broadband Raman oscillator 900 implementing a circulator loop cavity 902. In this example, broadband Raman oscillator 900 includes a laser diode pump 904 capable of generating a relatively low noise pump signal 920. In one particular embodiment, pump signal 920 comprises at least one lasing wavelength approximately centered at the 1310 nm wavelength. In various embodiments, the structure and function of laser diode pump 904 can be substantially similar to any of the pump sources in FIGS. 2A through 2D. In this example, pump signal 920 circulates within circulator cavity 902 in a clockwise direction.

In this embodiment, broadband Raman oscillator 900 includes circulator cavity 902 operable to wavelength shift the lasing wavelengths generated by laser diode pump 904 to the desired Raman cascade order. Circulator cavity 904 comprises a circulator 908, a gain fiber 906 coupled between port 908c and 908a of circulator 908, and a wavelength control element 910 coupled to port 908b of circulator 908. Although in this example circulator 908 comprises three ports 908a–908c, any other number of ports may be used without departing from the scope of the present disclosure.

Circulator 908 may comprise any non-reciprocal device capable of sequentially transmitting wavelength signals from one port to another port. For example, port 908a can only transmit a wavelength signal to port 908b, while port 908b can only transmit a wavelength signal to port 908c. Port 908a and port 908c are typically isolated from one another. In various embodiments, circulator 908 can comprise a polarization independent device with a relatively low insertion loss. In other embodiments, circulator 908 can comprise a broadband device capable of transmitting the desired Raman cascade order and the lasing wavelengths of pump signal 920.

In the illustrated embodiment, circulator cavity 902 includes a wavelength control element 910 operable to reflect the desired Raman cascade order. In this embodiment, control element 910 operates to provide broadband reflection at selected Raman cascade orders. Control element 910 may comprise any device, such as, for example, a chirped fiber grating, a wavelength control filter, a combination of these or other devices.

In one particular embodiment, control element 910 comprises a plurality of chirped Bragg gratings. Chirped Bragg gratings comprise a length and a variation in periodicity along that length that allows the gratings to control the bandwidth of the output Raman cascade order. In some embodiments, the Bragg condition at the center of chirped grating can coincide with the maximum gain wavelengths of the desired Raman cascade order. The use of chirped Bragg gratings as element 910 is advantageous in providing a mechanism to tailor the bandwidth of the desired Raman cascade order. In addition, chirped Bragg gratings also tend to reduce fiber insertion loss. In another embodiment, wavelength control element 910 can comprise a plurality of serially coupled gratings each comprising a different center wavelength.

Coupling wavelength control element 910 to port 908b enables pump signal 920 and/or a Raman cascade order to partially counter-propagate with oscillator output signal 922. In this example, oscillator output signal 922 comprises a desired Raman cascade order.

In this example, circulator cavity 902 comprises at least a first wavelength combiner 912a and a second wavelength combiner 912b. Although this example uses two wavelength combiners 912a and 912b, any other number of combiners may be used without departing from the scope of the present disclosure. Wavelength combiners 912a and 912b may comprise any device capable of coupling and/or de-coupling one or more wavelength signals from cavity 902, for example, a wavelength division demultiplexer. In this example, first combiner 912a operates to couple a pump signal 920 to cavity 902 and to transmit all other Raman cascade orders. Second combiner 912b operates to de-couple oscillator output signal 922 from cavity 902 and to transmit all other wavelength signals. Oscillator output signal 922 may comprise, for example, a desired Raman cascade order.

VI. Broadening the Output Bandwidth from a BBRO

Figure 10A:
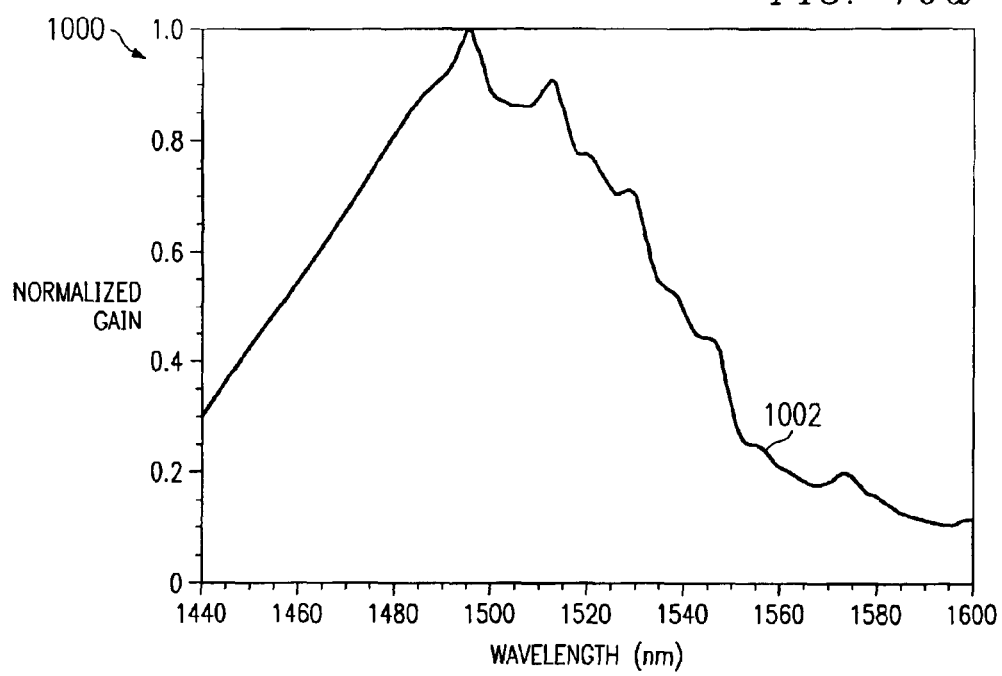
FIGS. 10A through 10C are graphs illustrating exemplary Raman gain spectra for laser diode pumps.
Figure 10B:
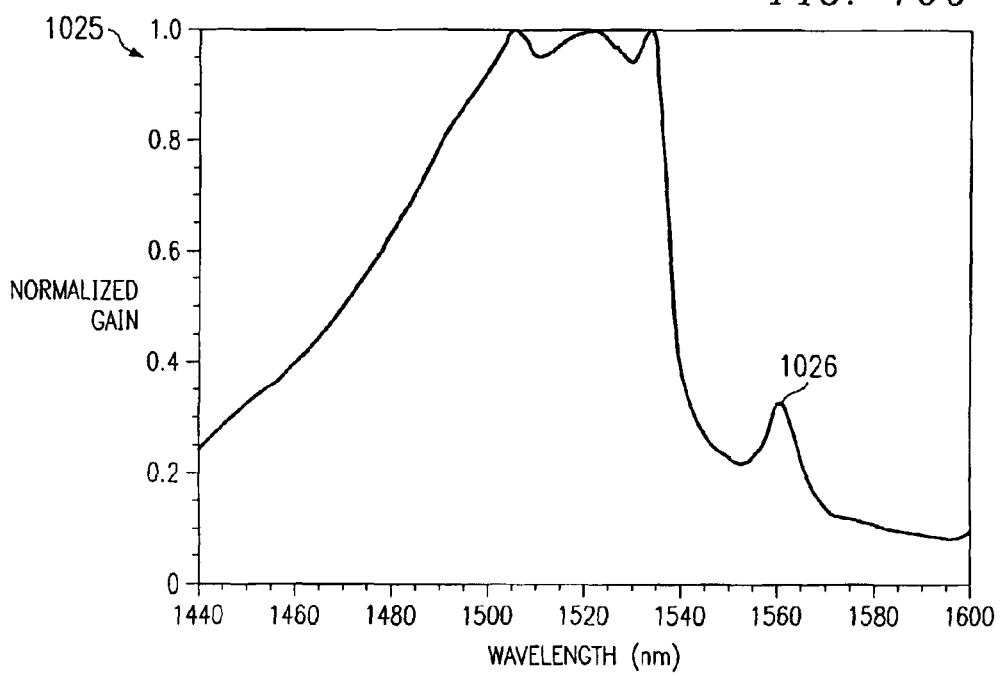
Figure 10C:
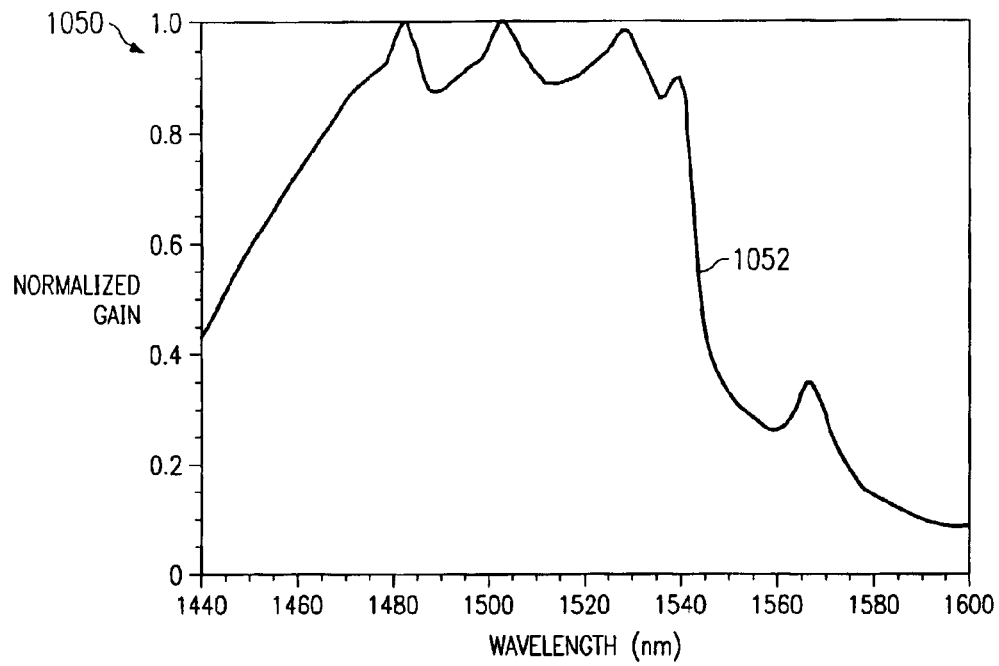

FIGS. 10A through 10C are graphs illustrating exemplary Raman gain spectra for laser diode pumps. In these embodiments, the structure and function of the laser diode pumps can be substantially similar to any of the pump sources in FIGS. 2A through 2D.

In various embodiments, the laser diode pump can be wavelength shifted in a broadband Raman oscillator. In those embodiments, the structure and function of the Raman oscillator can be substantially similar to any of the Raman oscillators of FIGS. 6 through 9. In some cases, the broadband Raman oscillator can achieve an increased bandwidth by selecting a gain fiber that has an appropriate zero dispersion wavelength. For example, where the zero dispersion wavelength of the gain fiber is in close wavelength proximity to the pump signal, say within 30 nm, the pump will spectrally broaden through phase matching and/or four-wave mixing. Phase matching generates long and short side-band wavelengths that spectrally broaden of the pump signal. In turn, this broadened pump signal leads to a broadening of the gain band through the Raman process.

In some embodiments, the laser diode pump itself can broaden the output bandwidth from the broadband Raman oscillator. The gain spectrum of Raman gain tends to follow the pump spectrum and broadens at each consecutive Raman cascade order. Thus, if the laser diode pump implements a series of laser diodes at varying wavelengths or if a single pump source is used to generate multiple pump wavelengths, then the Raman gain will correspondingly broaden.

FIG. 10A is a graph illustrating an exemplary Raman gain spectrum 1002 for a laser diode pump implementing four equal amplitude pairs of laser diodes. In this particular example, laser diode pump 1002 generates a multiple wavelength signal comprising the 1391 nm, 1406 nm, 1421 nm, and 1436 nm wavelengths. Although this example includes four wavelengths each separated by 15 nm, any additional number of wavelengths or different wavelength spacing can be used without departing from the scope of the present invention.

This graph shows that the spectral width of gain spectrum 1002 at full width half maximum comprises approximately 84 nm at a wavelength of approximately 1500 nm. In contrast, a typical fused-silica optical fiber has a peak gain at approximately 13.2 THz, while the spectral width at full width half maximum comprises approximately 7 THz or approximately 53 nm at a wavelength of 1500 nm. Thus, the gain spectral width has broadened by an amount equal to the square root of the sum of squares of the pump signal width and the Raman gain width.

FIG. 10B is a graph illustrating an exemplary Raman gain spectrum 1026 for a laser diode pump implementing two pairs of laser diodes with different relative intensities. In this example, the laser diode pump comprises at least a first pair of laser diodes and a second pair of laser diodes. The first pair of laser diodes generates a pump signal centered at approximately the 1400 nm wavelength. In addition, the first pair of laser diodes comprises a relative intensity of about 1. Similarly the second pair of laser diodes generates a pump signal centered at approximately the 1425 nm wavelength and comprises a relative intensity of about 4.7.

This graph shows that the uniformity of Raman gain spectrum 1026 can be improved by tailoring the amplitudes and/or power of the different wavelengths and the wavelength spacing. For example, gain spectrum 1026 comprises a relatively flat gain between approximately 1497 nm and 1535 nm wavelengths. In this particular example, the spectral width of gain spectrum 1026 at full width half maximum comprises approximately 68 nm.

FIG. 10C is a graph illustrating an exemplary Raman gain spectrum 1052 for a laser diode pump implementing a plurality of pairs of laser diodes with different relative intensities. In this example, the laser diode pump comprises three pairs of laser diodes. The first pair of laser diodes generates a pump signal centered at approximately the 1380 nm wavelength and comprises a relative intensity of about 1. The second pair of laser diodes generates a pump signal centered at approximately the 1397.5 nm wavelength and comprises a relative intensity of about 0.9. The third pair of laser diodes generates a pump signal centered at approximately the 1430 nm wavelength and comprises a relative intensity of about 2.5.

This graph shows that the uniformity of Raman gain spectrum 1052 can be improved by tailoring the amplitudes and/or intensities of the different pump wavelengths as well as the wavelength spacing. As used in this document, the terms "amplitude" and "intensity" at a pump wavelength refer to the pump output power at that wavelength. Likewise, the terms "amplitude" and "intensity" of laser or pump source refer to the output power of that laser or pump source. For example, gain spectrum 852 comprises a relatively flat gain between approximately 1475 nm and 1540 nm wavelengths. In this particular example, the spectral width of gain spectrum 1052 at full width half maximum comprises approximately 100 nm.

VII. Gain Control by Varying Pump Powers

FIGS. 11A through 11D are block diagrams illustrating example optical amplifiers capable of varying the amplifier gain spectrum by controlling pump wavelength power levels.

FIG. 11A is a block diagram illustrating an example optical amplifier 1100 capable of varying a gain spectrum associated with amplifier 1100 by controlling pump wavelength power levels. In this example, amplifier 1100 includes a pump source 1102 operable to generate a multiple wavelength pump signal 1114. Pump source 1102 may comprise any device capable of generating the desired pump signal 1114, such as, for example, a plurality of laser diodes, a laser diode combined with a wavelength shifter, or a broadband Raman oscillator. In this particular embodiment, pump source 1102 generates a multiple wavelength pump signal 1114 operable to control a gain spectrum of amplifier 1100. In various embodiments, pump source 1102 controls the gain spectrum of amplifier 1100 by modifying a power level and/or amplitude of one or more wavelengths of pump signal 1114.

In this particular embodiment, pump source 1102 comprises a plurality of laser diodes, each operable to generate a pump wavelength. In other embodiments, the structure and function of pump source 1102 can be substantially similar to any one of wavelength shifters depicted in FIGS. 4A through 4C, to any of the pump sources in FIGS. 2A through 2D, or to any of the broadband Raman oscillators illustrated in FIGS. 6 through 9. In this example, pump source 1102 operates to generate multiple wavelength pump signal 1114 comprising at least the 1396 nanometer and 1421 nanometer wavelengths.

In this embodiment, multiple wavelength pump signal 1114 amplifies optical signal 1110 in a gain medium 1106. In various embodiments, gain medium 1106 may comprise a gain fiber or at least a portion of a fiber span or transmission link. In some embodiments, at least a portion of gain medium 1106 may comprise a dispersion compensating fiber. Implementing a dispersion compensating fiber as at least a portion of gain medium 1106 is advantageous in enabling dispersion compensation.

In this example, amplifier 1100 includes an input coupler 1104a and an output coupler 1104b. Couplers 1104a and 1104b can comprise any device capable of coupling and/or de-coupling optical signal 1110 to and/or from amplifier 200. In this particular embodiment, coupler 1104a comprises a wavelength division multiplexer, while coupler 1104b comprises a wavelength division demultiplexer. Input coupler 1104a operates to introduce an input signal 1110 for amplification and output coupler 1104b operates to remove signal 1110 from amplifier 1100 after amplification.

FIG. 11B is a block diagram illustrating an exemplary two-stage optical amplifier 1130 capable of varying a gain spectrum associated with amplifier 1130 by controlling pump wavelength power levels. In this example, amplifier 1130 includes a pump source 1132 operable to generate a multiple wavelength pump signal 1144. In various embodiments, the structure and function of pump source 1132 can be substantially similar to pump source 1102 of FIG. 11A. In some embodiments, the structure and function of pump source 1132 can be substantially similar to any one of wavelength shifters depicted in FIGS. 4A through 4C. In other embodiments, the structure and function of pump source 1132 can be substantially similar to any of the pump sources in FIGS. 2A through 2D. In some embodiments, the structure and function of pump source 1132 can be substantially similar to any of the broadband Raman oscillators illustrated in FIGS. 6 through 9.

In this particular embodiment, pump source 1132 comprises a plurality of laser diodes 1146a–1146d, each pair approximately centered on a particular desired wavelength. Although this example uses four (4) laser diodes, any number of laser diodes can be used without departing from the scope of the present disclosure. In this example, pump source 1132 generates a multiple wavelength pump signal 1144 operable to control a gain spectrum of amplifier 1130. In various embodiments, pump source 1132 controls the gain spectrum of amplifier 1130 by modifying a power level and/or amplitude of each wavelength generated by laser diodes 1146a–1146d.

In this particular example, wavelength signals generated by laser diodes 1146a and 1146b comprise wavelengths of approximately 1396 nanometers, while wavelength signals generated by laser diodes 1146c and 1146d comprise wavelengths of approximately 1421 nanometers. Although this examples uses 1396 and 1421 nanometer wavelengths, any other desired wavelengths can be used without departing from the scope of the present disclosure.

In this embodiment, pump source 1132 includes at least a first polarization combiner 1148a and a second polarization combiner 1148b. Although this example uses two polarization combiners 1148a and 1148b, any number of polarization combiners can be used without departing from the scope of the present disclosure. Polarization combiners 1148a and 1148b could comprise, for example, polarization beam splitters, polarization multiplexers, or birefringent elements. Using a pair of outputs from laser diodes 1146a and 1146b to generate a specific lasing wavelength is advantageous in generating an un-polarized pump signal, which minimizes polarization dependent gain effects within Raman amplifiers.

First polarization combiner 1148a operates to combine lasing wavelengths 1147a and 1147b received from laser diodes 1146a and 1146b, respectively, to generate a first un-polarized pump signal 1149a. In a similar manner, second polarization combiner 1148b operates to combine lasing wavelengths 1147c and 1147d received from laser diodes 1146c and 1146d, respectively, to generate a first un-polarized pump signal 1149b.

In this example, pump source 1132 further includes a wavelength combiner 1150 operable to combine un-polarized pump signals 1149a and 1149b into an un-polarized multiple wavelength pump signal 1144. Wavelength combiner may comprise any device capable of combining a plurality of wavelength signals into a multiple wavelength signal, such as, for example, a wavelength division multiplexer. In this particular embodiment, multiple wavelength pump signal 1144 operates to control the gain spectrum of amplifier 1130.

In this embodiment, multiple wavelength pump signal 1144 amplifies an optical signal 1140 in at least a first gain medium 1136a and a second gain medium 1136b. Although this example includes two gain media 1136a and 1136b, any additional number of gain media can be used without departing from the scope of the present disclosure. The type and length of optical fiber used to form gain medium 1136a and 1136b depends at least in part on the desired gain spectrum of amplifier 1130.

In this particular embodiment, first gain medium 1136a comprises dispersion compensating fiber with a length of approximately three (3) kilometers, while second gain medium 1136b comprises dispersion compensating fiber with a length of approximately five (5) kilometers. Although this example implements dispersion compensating fibers with lengths of three and five kilometers, any desired optical fiber of a sufficient length can be used without departing from the scope of the present disclosure.

In this embodiment, pump signal 1144 propagates in each gain medium 1136a and 1136b counter to optical signal 1140. A counter-propagating pump signal is advantageous in substantially minimizing the coupling fluctuations in pump signal 1144 to optical signal 1140. In addition, counter-propagating pump signals tend to minimize cross-talk between closely spaced wavelength channels.

Amplifier 1130 also includes an isolator 1138 capable of minimizing pump signal feedback and amplifier multi-path interference. In this example, amplifier 1130 includes at least a first coupler 1134a, a second coupler 1134b, and a third coupler 1134c. Although this example uses three couplers 1134a–1134c, any number of couplers may be used without departing from the scope of the present disclosure. Couplers 1134a–1134c can comprise any device capable of coupling and/or de-coupling an optical signal to and/or from amplifier 1130. In this particular embodiment, coupler 1134a operates to couple multiple wavelength pump signal 1144 to amplifier 1130, while couplers 1134b and 1134c operate to couple and de-couple multiple wavelength optical signal 1140, respectively, to/from amplifier 1130. In this example, couplers 1134a and 1134b comprise wavelength division multiplexers, while coupler 1134c comprises a wavelength division demultiplexer.

FIG. 11C is a block diagram illustrating an exemplary two-stage optical amplifier 1160 capable of varying a gain spectrum associated with amplifier 1160 by controlling pump wavelength power levels. In this example, amplifier 1160 is similar in structure and function to amplifier 1130 of FIG. 11B. Like amplifier 1130, amplifier 1160 includes a pump source 1162, a plurality of couplers 1164a–1164c, and a plurality of gain media 1166a and 1166b. In this particular embodiment, pump source 1162 operates to vary the gain spectrum of amplifier 1160 by changing the current supplied to pump source 1162.

The example shown in FIG. 11C differs from the example shown in FIG. 11B in that amplifier 1160 includes an isolator 1168b between gain medium 1166a and gain medium 1166b. Isolator 1166b operates to minimize optical signal feedback.

Figure 11D:
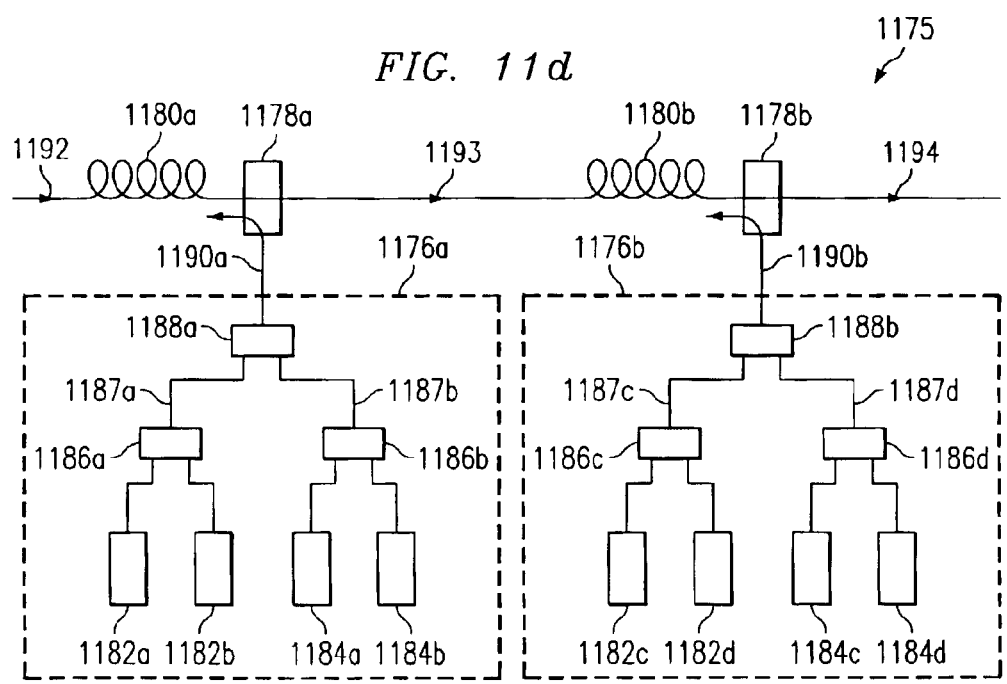

FIG. 11D is a block diagram illustrating an exemplary two-stage optical amplifier 1175 capable of varying a gain spectrum associated with amplifier 1175 by controlling pump wavelength power levels. In this example, amplifier 1175 includes at least a first pump source 1176a and a second pump source 1176b. Although this example includes two pump sources 1176a and 1176b, any number of pump sources can be used without departing from the scope of the present disclosure. In various embodiments, the structure and function of pump sources 1176a and 1176b can be substantially similar to pump source 1102 of FIG. 11A. In some embodiments, the structure and function of pump sources 1176a and 1176b can be substantially similar to any one of wavelength shifters depicted in FIGS. 4A through 4C. In other embodiments, the structure and function of pump sources 1176a and 1176b can be substantially similar to any of the pump sources in FIGS. 2A through 2D. In some embodiments, the structure and function of pump sources 1176a and 1176b can be substantially similar to any of the broadband Raman oscillators illustrated in FIGS. 6 through 9.

In this example, first pump source 1176a generates a first multiple wavelength pump signal 1190a and second pump source 1176b generates a second multiple wavelength pump signal 1190b. Each of pump signals 1190a and 1190b can control a gain spectrum of amplifier 1175. In various embodiments, pump sources 1176a and 1176b control the gain spectrum of amplifier 1175 by modifying a power level and/or amplitude of each wavelength generated by laser diodes 1182 and 1184.

In one example (not explicitly shown), first pump source 1176a and second pump source 1176b can each include a plurality of laser diodes each capable of generating a lasing wavelength. In that example, the lasing wavelengths generated by the plurality of laser diodes of first pump source 1176a can be combined to form first multiple wavelength pump signal 1190a. Similarly, the lasing wavelengths generated by the plurality of laser diodes of second pump source 1176b can be combined to form second multiple wavelength pump signal 1190b.

In this particular embodiment, first pump source 1176a includes at least a first pair of laser diodes 1182a and 1182b and a second pair of laser diodes 1184a and 1184b. Similarly, second pump source 1176b includes at least a first pair of laser diodes 1182c and 1182d and a second pair of laser diodes 1184c and 1184d. Although each pump source 1176a and 1176b includes two pairs of laser diodes, any number of laser diodes can be used without departing from the scope of the present disclosure.

In this particular example, wavelength signals generated by laser diodes 1182a–1182d comprise wavelengths of approximately 1395 nanometers, while wavelength signals generated by laser diodes 1184a–1184d comprise wavelengths of approximately 1420 nanometers. Although this examples uses 1395 and 1420 nanometer wavelengths, any other desired wavelengths can be used without departing from the scope of the present disclosure. Using pairs of outputs from laser diodes 1182 and 1184 to generate a specific lasing wavelength is advantageous in generating an un-polarized pump signal, which minimizes polarization dependent gain effects within Raman amplifiers.

In this embodiment, first pump source 1176a includes at least a first polarization combiner 1186a and a second polarization combiner 1186b. Similarly, second pump source 1176b includes at least a third polarization combiner 1186c and a fourth polarization combiner 1186d. Although each pump source 1176a and 1176b includes two polarization combiners, any number of polarization combiners can be used without departing from the scope of the present disclosure. Polarization combiners 1186a–1186d could comprise, for example, polarization beam splitters, polarization multiplexers, wavelength division multiplexers, or birefringent elements.

First polarization combiner 1186a operates to combine the lasing wavelengths generated by laser diodes 1182a and 1182b, while second polarization combiner 1186b operates to combine the lasing wavelengths generated by laser diodes 1184a and 1184b. Similarly, third polarization combiner 1186c operates to combine the lasing wavelengths generated by laser diodes 1182c and 1182d, while fourth polarization combiner 1186d operates to combine the lasing wavelengths generated by laser diodes 1184c and 1184d.

In this example, first pump source 1176a further includes a first wavelength combiner 1188a operable to combine substantially un-polarized pump signals 1187a and 1187b generated by polarization combiners 1186a and 1186b, respectively, into a substantially un-polarized multiple wavelength pump signal 1190a. Similarly, second pump source 1176b further includes a second wavelength combiner 1188b operable to combine substantially un-polarized pump signals 1187c and 1187d generated by polarization combiners 1186c and 1186d, respectively, into a substantially un-polarized multiple wavelength pump signal 1190b. Wavelength combiners 1188a and 1188b may comprise any device capable of combining a plurality of wavelength signals into a multiple wavelength signal, such as, for example, a wavelength division multiplexer. In this particular embodiment, multiple wavelength pump signals 1190a and 1190b operate to control the gain spectrum of amplifier 1175.

In this embodiment, amplifier 1175 includes at least a first wavelength combiner 1178a and a second wavelength combiner 1178b. Although this example implements two wavelength combiners 1178a and 1178b, any additional number of combiners can be used without departing from the scope of the present disclosure. In this example, first wavelength combiner 1178a operates to couple spectrally tailored pump signal 1190a to a first Raman gain medium 1180a. In a similar manner, second wavelength combiner 1178b operates to couple spectrally tailored pump signal 1190b to a second Raman gain medium 1180b. Wavelength combiners 1178a and 1178b may comprise any device, such as, for example, a wavelength division multiplexer or optical circulator.

In this embodiment, multiple wavelength pump signals 1190a and 1190b amplify an optical signal 1192 in at least first Raman gain medium 1180*a* and second Raman gain medium 1180*b*, respectively. Although this example includes two gain media 1180*a* and 1180*b*, any additional number of gain media can be used without departing from the scope of the present disclosure. The type and length of optical fiber used to form gain medium 1180*a* and 1180*b* depends at least in part on the desired gain spectrum of amplifier 1175. First Raman gain medium 1180*a* and second Raman gain medium 1180*b* can comprise, for example, a distributed transmission fiber, a discrete fiber, or a combination of these or other fiber types.

In this embodiment, first pump signal 1190*a* propagates within first Raman gain medium 1180*a* counter to optical signal 1192. Similarly, second pump signal 1190*b* propagates within second Raman gain medium 1180*b* counter to optical signal 1192. A counter-propagating pump signal is advantageous in substantially minimizing the coupling of fluctuations in pump signals 1190 to optical signal 1192. In addition, counter-propagating pump signals tend to minimize cross-talk between closely spaced wavelength channels of optical signal 1192.

In operation, spectrally tailored pump signal 1190*a* generates a spectrally shaped gain spectrum within first Raman gain medium 1180*a*. The spectrally shaped gain spectrum of Raman gain medium 1180*a* operates on optical signal 1192 to form a spectrally tailored output optical signal 1193. Spectrally tailored pump signal 1190*b* generates a spectrally shaped gain spectrum within second Raman gain medium 1180*b*. The spectrally shaped gain spectrum of Raman gain medium 1180*b* operates on signal 1193 output from first Raman gain medium 1180*a* to form a spectrally tailored output optical signal 1194. Through appropriate control of the gain spectra of amplifier 1175, output signal 1194 can experience an approximately flat overall gain profile.

FIG. 12 is a graph illustrating example gain spectra of an optical amplifier generated by varying the power levels of the wavelengths of a multiple wavelength pump signal. In this particular embodiment, the structure and function of the optical amplifier can be substantially similar to amplifier 1100 of FIG. 11A. In this example, line 1202 represents the gain spectrum generated by the optical amplifier while the pump source receives a current of approximately fourteen and one-half (14.5) amps. Line 1204 represents the gain spectrum generated by the optical amplifier while the pump source receives a current of approximately fifteen (15) amps. The horizontal axis represents the optical signal wavelengths, while the vertical axis represents the gain generated by the amplifier.

In this example, the multiple wavelength pump signal comprises a 1396 nanometer and a 1421 nanometer wavelength. This graph illustrates that varying the power levels of each wavelength of the multiple wavelength pump signal results in a change to the gain spectrum of an optical amplifier. Varying the power levels associated with each of the pump signal wavelengths can advantageously enable tailoring of the gain spectrum of the optical amplifier.

VIII. Active Gain Equalization

FIGS. 13A and 13B are block diagrams illustrating exemplary embodiments of Raman amplifiers implementing active gain equalization. In various embodiments, Raman amplifiers 1300 and 1350 can be implemented as a stage of an existing multiple-stage amplifier or as a pre-amplifier for an existing single stage amplifier. In some embodiments, a Raman gain spectrum of Raman amplifiers 1300 and 1350 combines with the gain spectrum of the existing amplifier to generate a substantially uniform gain over the spectral range of an amplified optical signal.

FIG. 13A is a block diagram illustrating an exemplary embodiment of a Raman amplifier 1300 implementing an active gain equalization element 1304. In this example, Raman amplifier 1300 includes a pump source 1302 operable to generate a pump signal 1312. Pump source 1302 may comprise any device capable of generating the desired pump signal, such as, for example, a laser diode pump, a wavelength shifter, or broadband Raman oscillator. In one particular embodiment, the structure and function of pump source 1302 can be substantially similar to any of the pump sources in FIGS. 2A through 2D. In various embodiments, the structure and function of pump source 1302 can be substantially similar to any of the wavelength shifters illustrated in FIG. 4. In other embodiments, the structure and function of pump source 1302 can be substantially similar to any of the broadband Raman oscillators illustrated in FIGS. 6 through 9. In some embodiments, pump source 1302 may comprise at least one pump wavelength generated by a laser diode approximately centered on the 1310 nm wavelength.

In this embodiment, Raman amplifier 1300 includes active gain equalization element 1304 operable to spectrally tailor the wavelength spectrum of pump signal 1312 received from pump source 1302 and to generate a spectrally tailored pump signal 1310. Active gain equalizing element 1304 may comprise any device capable of spectrally tailoring pump signal 1312, by controlling the wavelength and/or the power of one or more pump signals. For example, to control pump signal wavelengths active gain equalizing element 1304 may comprise a Mach-Zehnder type filter, a dielectric filter, a lattice device, or a long-period grating. Pump signal powers can be controlled, for example, by regulating laser drive current or using variable attenuators on the pump signals. Although this example depicts active gain equalization filter 1304 as residing externally to pump source 1302, in other embodiments active gain equalization filter 1304 can be integrated into pump source 1302.

In this embodiment, Raman amplifier 1300 generates a spectrally tailored pump signal 1310 operable to shape the gain spectrum of Raman amplifier 1300. In some embodiments, the spectrally tailored pump signal 1310 can operate to increase the bandwidth amplified by amplifier 1300. In one particular embodiment, spectrally tailored pump signal 1310 can shape the gain spectrum of the Raman amplifier to be approximately complimentary to a gain spectrum of an existing optical amplifier. In various embodiments, the spectrally shaped Raman gain spectrum can be used to augment an existing amplifier to generate an approximately uniform gain over a desired spectral range. Spectrally tailoring the gain spectrum of Raman amplifier 1300 is advantageous in improving the efficiency and/or noise figure of Raman amplifier 1300 and possibly the signal to noise ratio of the optical system.

In this embodiment, spectrally tailored pump signal 1310 amplifies multiple wavelength optical signal 1316 in a Raman gain medium 1306. In various embodiments, Raman gain medium 1306 may comprise a gain fiber or at least a portion of a fiber span or transmission link. In some embodiments, at least a portion Raman gain medium 1306 may comprise a dispersion compensating fiber. Implementing a dispersion compensating fiber as at least a portion of Raman gain medium 1306 is advantageous in enabling gain equalization and dispersion compensation. In other embodiments, Raman gain medium 1306 may comprise a high germanium content, large core-cladding index difference, and small effective area, which can advantageously enhance Raman gain.

In this embodiment, pump signal 1310 propagates gain medium 1306 counter to a multiple wavelength signal 1316.

A counter-propagating pump signal is advantageous in substantially minimizing the coupling of fluctuations in pump signal 1310 to multiple wavelength signal 1316. In addition, counter-propagating pump signals tend to minimize crosstalk between closely spaced wavelength channels.

In this embodiment, Raman amplifier 1300 includes a wavelength combiner 1308. Wavelength combiner 1308 may comprise any device capable of coupling one or more wavelength signals to Raman gain medium 1306, such as, for example, a wavelength division multiplexer.

FIG. 13B is a block diagram illustrating an exemplary embodiment of a Raman amplifier 1350 implementing a spectrally tailored pump signal 1360. In this example, the structure and function of Raman amplifier 1350 can be substantially similar to Raman amplifier 1300 of FIG. 13A. In this particular embodiment, Raman amplifier 1350 includes a pump source 1352 operable to generate pump signal 1360 and to spectrally tailor the wavelength spectrum of pump signal 1360.

In various embodiments, pump source 1352 includes an active gain equalization element operable to generate spectrally tailored pump signal 1360. The active gain equalizing element may comprise any device capable of spectrally tailoring pump signal 1360 to a pump signal wavelength profile that spectrally shapes the gain spectrum of Raman amplifier 1350. For example, the active gain equalizing element may comprise a Mach-Zehnder type filter, a dielectric filter, a lattice device, or a long-period grating.

In other embodiments, pump source 1352 comprises a plurality of laser diodes capable of tailoring the wavelength spectrum of pump signal 1360 by manipulating the output power of each of the plurality of laser diodes. In this example, each of the plurality of laser diodes is grating tuned and operates to generate a specific lasing center wavelength. In one particular embodiment, each of the plurality of laser diodes generates a lasing center wavelength that is approximately 1310 nm.

FIGS. 14 and 15 illustrate example embodiments of amplifiers implementing active gain equalization and capable of amplifying relatively large bandwidths. In various embodiments, system 10 of FIG. 1 may implement one or more of the amplifiers described below. Although FIGS. 14 and 15 describe particular examples of wider band amplifiers, other amplifier designs can be implemented without departing from the scope of this disclosure. The amplifier designs described with respect to FIGS. 14 and 15 are for illustrative purposes only. Moreover, although these examples depict single amplifiers operable to amplify all signal wavelengths received, a plurality of these wider band amplifiers could be used in parallel to further increase the amplifying bandwidth of the system.

Figure 14A:
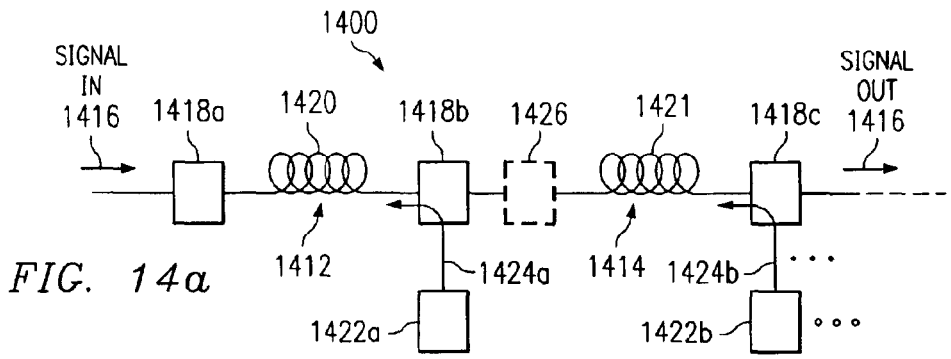
FIGS. 14A through 14C illustrate an example multiple stage amplifier with a plurality of gain profiles associated with various amplification stages and an overall gain profile for the amplifier.
Figure 14B:
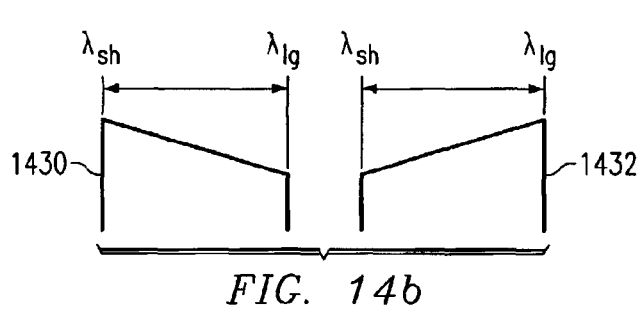
Figure 14C:
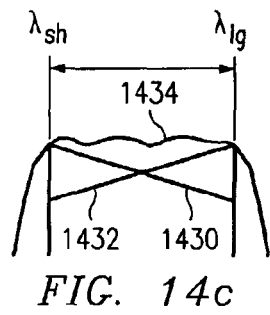

FIGS. 14A through 14C illustrate an example multiple stage amplifier 1400 with a plurality of gain profiles 1430 and 1432 associated with various amplification stages and an overall gain profile 1434 for the amplifier. In this particular example, amplifier 1400 is capable of amplifying at least 180 channels spanning 100 nanometers or more of bandwidth, while maintaining an acceptable signal-to-noise ratio and an approximately flat gain profile. Any other number of channels and/or bandwidths may be used without departing with the scope of this disclosure.

Conventional designs of multi-stage amplifiers have experienced difficulties in attempting to process wide bandwidths with a signal amplifier while maintaining approximately flat and/or uniform gain profiles, acceptable noise figures, or acceptable bit error rates. For example, in Raman amplifiers, a major culprit in noise figures is the phonon-stimulated optical noise created when wavelength signals being amplified reside spectrally close to pump wavelengths used for amplification. The embodiment shown in FIG. 14A reduces adverse effects of this noise by enhancing the Raman amplification of signal wavelengths near the pump wavelengths to overcome the effects of the noise. This embodiment applies an approximately complementary gain profile in another stage of the amplifier to result in an approximately flat and/or uniform overall gain profile with a reduced noise figure.

In this document, the phrase "approximately complementary" refers to a situation where, at least in general, wavelength signals that are more highly amplified in a first stage are less amplified in a second complementary stage, and wavelength signals that are more highly amplified in the second stage are less amplified in the first stage. Note that the use of the terms "first" and "second" to describe the amplifier stages here is not meant to specify any particular order of stages in the amplifier. Two gain profiles said to be "approximately complementary" need not have equal and opposite slopes. Moreover, equal amplification of any particular wavelengths in both gain profiles does preclude those gain profiles from being "approximately complementary."

Approximately complementary gain profiles may have one or more slopes associated with each gain profile. For example, approximately complementary gain profiles could comprise a "W" shaped profile followed by an "M" shaped profile, or an "M" shaped profile followed by a "W" shaped profile. Furthermore, the approximately complementary gain profiles may become approximately complementary only after traversing all or a portion of the transmission medium. In those cases, the gain profiles launched at the beginning of the amplifier stage may not be approximately complementary, but may become approximately complementary after signals traverse all or a portion of the transmission medium.

While better results could be obtained by applying approximately complimentary gain profiles to all or nearly all of the same signal wavelengths, some portion of wavelengths can be omitted from one gain profile and included in the other gain profile without departing from the scope of this disclosure.

In this example, amplifier 1400 comprises a two-stage amplifier having a first stage 1412 and a second stage 1414 cascaded with first stage 1412. There is no limit to a particular number of amplifier stages. For example, additional amplification stages could be cascaded onto second stage 1414. Moreover, although the illustrated embodiment shows second stage 1414 cascaded directly to first stage 1412, additional amplification stages could reside between first stage 1412 and second stage 1414 without departing from the scope of this disclosure.

Amplifier 1400 could comprise a distributed Raman amplifier, a discrete Raman amplifier, a hybrid Raman amplifier having both discrete and distributed stages, a rare earth doped amplifier, a semiconductor optical amplifier, or another amplifier type or combination of amplifier types. Each stage 1412, 1414 of amplifier 1400 includes an input operable to receive a multiple wavelength optical input signal 1416. As particular examples, signal 1416 could include wavelengths ranging over 32, 60, 80, or 100 nanometers.

Each stage 1412 and 1414 also includes a gain medium 1420 and 1421, respectively. Depending on the type of amplifier being implemented, media 1420 and 1421 may comprise, for example, a gain fiber or a transmission fiber. In some embodiments, all or portions of media 1420, 1421 may comprise dispersion compensating fibers.

Each stage 1412, 1414 further includes one or more wavelength pumps 1422. Pumps 1422 generate pump light 1424 at specified wavelengths, which are pumped into gain media 1420, 1421. Pumps 1422 may comprise, for example, one or more laser diodes, a wavelength shifter, or a broadband Raman oscillator. Although the illustrated embodiment shows the use of counter propagating pumps, under at least some circumstances using a relatively quiet pump, co-propagating pumps could also be used without departing from the scope of the disclosure.

In one particular embodiment, pump wavelengths 1424 can be selected so that the longest wavelength of pump signal 1424 has a wavelength that is shorter than the shortest wavelength of signal 1416. As one specific example, the longest wavelength of pump light 1424 could be selected to be, for example, at least ten (10) nanometers shorter than the shortest wavelength of signal 1416. In this manner, amplifier 1400 can help to avoid phonon stimulated noise that otherwise occurs when pump wavelengths interact with wavelengths of the amplified signal.

Couplers 1418b and 1418c couple pump wavelengths 1424a and 1424b to gain media 1420 and 1421, respectively. Couplers 1418 could comprise, for example, wavelength division multiplexers or optical couplers. A lossy element 1426 can optionally reside between amplifier stages 1412 and 1414. Lossy element 1426 could comprise, for example, an isolator, an optical add/drop multiplexer, or a gain equalizer.

The number of pump wavelengths 1424, their launch powers, their spectral and spatial positions with respect to other pump wavelengths and other wavelength signals, and the bandwidth and power level of the signal being amplified can all contribute to the shape of the gain profile for the respective amplifier stage.

FIG. 14B shows example gain profiles 1430 and 1432 for the first stage 1412 and the second stage 1414, respectively, of amplifier 1400. Gain profile 1430 shows the overall gain of first stage 1412 of amplifier 1400 for a bandwidth ranging from the shortest wavelength of signal 1416 ($\lambda_{sh}$) to the longest wavelength of signal 1416 ($\lambda_{lg}$). Gain profile 1432 shows the overall gain of second stage 1414 of amplifier 1400 for a bandwidth ranging from the shortest wavelength of signal 1416 ($\lambda_{sh}$) to the longest wavelength of signal 1416 ($\lambda_{lg}$). Each of gain profiles 1430 and 1432 reflects the effects of the other gain profile acting upon it.

In this example, gain profile 1430 of first stage 1412 has primarily a downward slope, where a majority of the shorter signal wavelengths 1416 are amplified more than a majority of the longer signal wavelengths 1416. Gain profile 1432 of second stage 1414 is approximately complimentary to gain profile 1430 of first stage 1412. In this case, gain profile 1432 exhibits primarily an upward slope where a majority of the longer signal wavelengths 1416 are amplified more than a majority of the shorter signal wavelengths 1416.

Although gain profiles 1430 and 1432 are, for simplicity, depicted as each having substantially one slope, the slope of each gain profile may change numerous times. Moreover, it is not necessary that the entire slope of gain profile 1430 be negative, or that the entire slope of gain profile 1432 be positive. Each profile may exhibit any number of peaks and valleys over the amplified bandwidth.

Gain profile 1434 represents an example overall gain profile of amplifier 1400 resulting from the application of gain profiles 1430 and 1432 to signal 1416. Overall gain profile 1434 is approximately flat over at least substantially all of the bandwidth of wavelengths within signal 1416.

This particular example provides a significant advantage in reducing the peak noise figure associated with the amplifier using complementary gain profiles. The complementary gain profiles reduce the peak noise figure by amplifying signals closest to the pump wavelengths at higher levels the signals at wavelengths far from the pump wavelengths. In addition, the noise figure is reduced by amplifying longer wavelength signals in a later amplifier stage. In a discrete amplifier embodiment, using this type of configuration, the noise figure of amplifier 1400 in the small signal limit can be reduced to less than eight decibels, in some cases 7 decibels, even where the bandwidth of signal 1416 exceeds 100 nanometers.

Complementary gain profiles can also be used to reduce the pump power requirements for a given amplifier, thus creating a high efficiency amplifier.

Figure 15A:
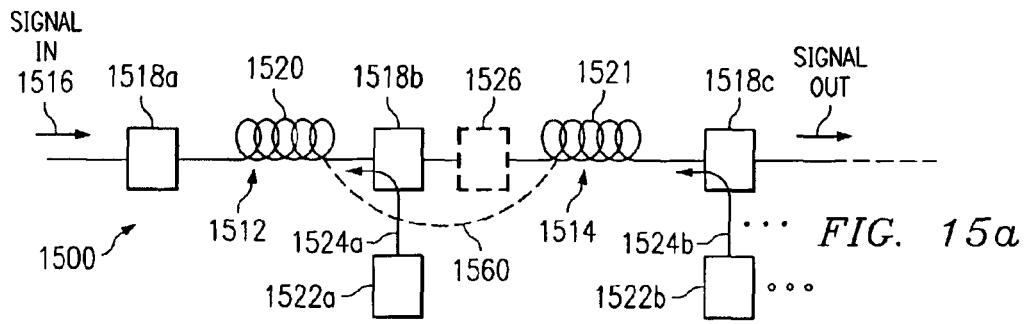
FIGS. 15A through 15C illustrate a high pump efficiency embodiment of a multiple stage wide band amplifier including example gain profiles associated with various amplification stages and an overall gain profile for the amplifier.
Figure 15B:
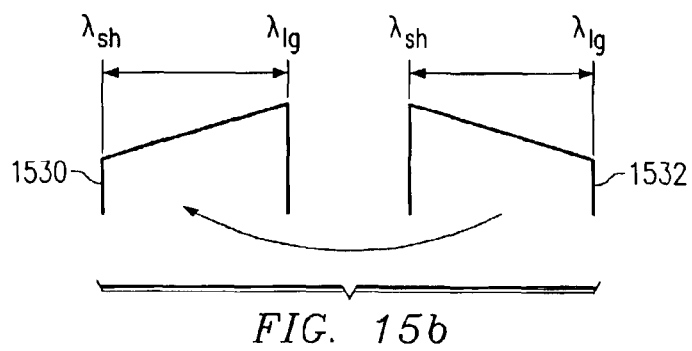
Figure 15C:
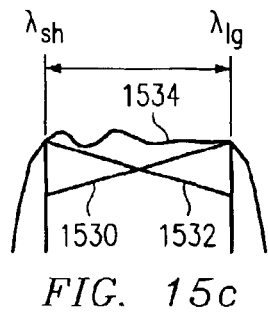

FIGS. 15A through 15C illustrate a high pump efficiency embodiment of a multiple stage wide band amplifier 1500 including example gain profiles 1530 and 1532 associated with various amplification stages and an overall gain profile 1534 for the amplifier. In this example, amplifier 1500 is capable of amplifying at least 180 channels spanning 100 nanometers or more of bandwidth while maintaining an acceptable signal-to-noise ratio and an approximately flat gain profile.

Amplifier 1500 shown in FIG. 15A is similar in structure and function to amplifier 1400 shown in FIG. 14A. Like amplifier 1400 shown in FIG. 14A, amplifier 1500 of FIG. 15A includes a first amplification stage 1512 and a second amplification stage 1514. Each of stages 1512 and 1514 includes a gain medium 1520 and 1521, respectively, which is operable to receive multiple wavelength input signal 1516 and pump wavelengths 1524a and 1524b, respectively.

Each amplifier stage 1512 and 1514 operates to amplify wavelengths of signal 1516 according to gain profiles 1530 and 1532 as shown. In this example, at least first stage 1512 comprises a Raman amplification stage. Second stage 1514 could comprise a Raman amplification stage, or another type of amplification stage.

The example shown in FIG. 15 differs from the example shown in FIG. 14 in that gain profile 1530 (shown in FIG. 15B) of first stage 1512 exhibits primarily an upward slope where a majority of longer wavelengths of signal 1516 are amplified more than the majority of shorter wavelengths of signal 1516. Conversely, gain profile 1532 of second stage 1514 comprises an approximately complementary gain profile to first gain profile 1530 of first stage 1512. Profile 1532 applies a higher gain to a majority of shorter signal wavelengths 1516 than the gain applied to the majority of longer signal wavelengths 1516. In addition, in this embodiment, the power of pumps 1522a driving first gain profile 1530 can be reduced.

The Raman scattering effect transfers energy from shorter wavelength signals 1516 to longer wavelength signals 1516. This embodiment leverages that fact to allow the longer pump wavelengths of Raman first stage 1512 to accept energy from the shorter pump wavelengths of second stage 1514. In a particular embodiment, amplifier 1500 may include a shunt 1560 between second gain medium 1521 and first gain medium 1520 to facilitate the longer pump wavelengths of first stage 1512 accepting power from the shorter pump wavelengths of second stage 1514. The combined effects of first stage 1512 and second stage 1514 result in an overall gain profile 1534 (FIG. 15C) of the amplifier that remains approximately flat.

This embodiment provides significant advantages in terms of efficiency by allowing the use of fewer wavelength pumps 1522a in the first stage 1512, and/or also by allowing each pump 1522a to operate at a lower launch power. By selecting signal launch powers with reference to the noise figure of the amplifier, this embodiment enjoys the further efficiency of reduced overall launched signal power.

The embodiment shown in FIG. 15A can also provide improvements for the noise figure of the amplifier. For example, phonon stimulated noise is created in Raman amplifiers where wavelengths being amplified spectrally reside close to a wavelength of pump signals 1524. By spectrally separating pump wavelengths 1524 from signal wavelengths 1516, phonon stimulated noise can be reduced.

In a particular embodiment, pump wavelengths 1524 are selected to have wavelengths at least ten (10) nanometers shorter than the shortest wavelength in signal 1516 being amplified. Moreover, in a particular embodiment, second stage 1514, where a majority of the gain to short wavelengths of signal 1516 is applied, comprises the last stage of amplifier 1500.

The amplifiers depicted in FIGS. 14 and 15 can comprises wide band amplifiers operable to receive and amplify a relatively large bandwidth of wavelength signals 15. In particular embodiments, the amplifiers can process wavelengths ranging over 32, 60, 80, or 100 nanometers of bandwidth while maintaining an approximately flat overall gain profile over the bandwidth of amplified signal wavelengths.

In this document, the term "approximately flat" and/or "uniform overall gain profile" describes a condition where the maximum signal gain at the output of the amplifier differs from the minimum signal gain at the output of the amplifier by no more than an amount suitable for use in telecommunication systems over an operational bandwidth of information carrying channels. Deviation of the maximum and minimum signal gain over one or two of several channels is not intended to be outside of the scope of an approximately flat overall gain profile. The deviation between minimum and maximum signal gains may comprise, for example, five (5) decibels or less over an operational bandwidth of, for example, 32 nanometers or more. Particular embodiments may achieve gain flatness of approximately three (3) decibels or less over an operational bandwidth.

Although the embodiments shown in FIGS. 14 and 15 show two complementary amplification stages, additional complementary amplification stages could also be implemented.

IX. Upgrading Optical Amplifiers with AGEQ

Figure 16:
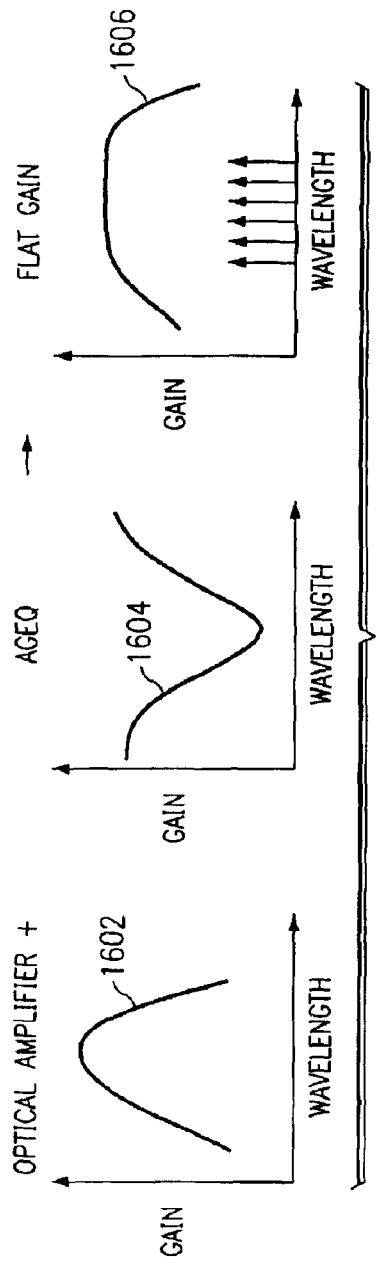
FIG. 16 is a graph illustrating how the use of spectrally tailored pump signals generates a substantially flat gain output.

FIG. 16 is a graph illustrating how a spectrally tailored signal 1604 can be used to generate a substantially uniform overall gain output 1606. In this example, line 1602 represents an amplifier gain spectrum generated by an existing amplifier. Line 1604 represents a spectrally shaped Raman gain spectrum generated through active gain equalization. In this particular example, the gain spectrum of spectrally shaped Raman gain spectrum 1604 is approximately complimentary to gain spectrum 1602 of the existing amplifier. In various embodiments, spectrally tailored signal 1604 can be created by one of the active gain equalization techniques illustrated in FIGS. 13A and 13B.

This graph shows that an approximately uniform gain output 1606 can be achieved by adding amplifier gain spectrum 1602 and the gain spectrum of spectrally tailored signal 1604. Adding spectrally tailored signal 1604 with amplifier gain spectrum 1602 is advantageous in improving the efficiency and noise figure of the Raman amplifier, and the signal to noise ratio of the optical system.

Figure 17:
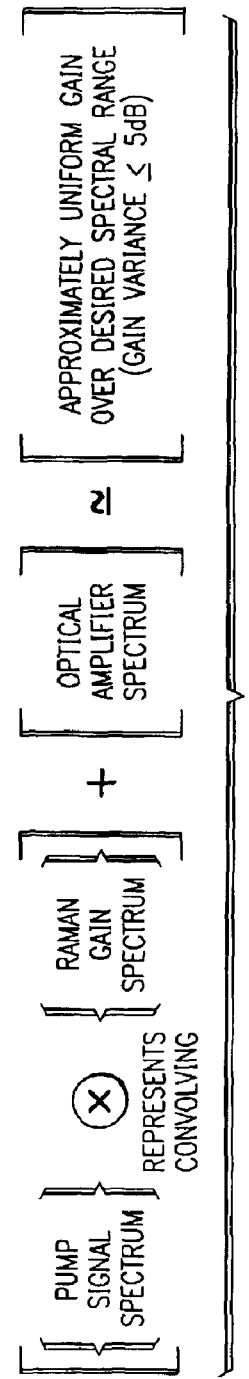
FIG. 17 is a chart illustrating an exemplary formula for selecting the appropriate active gain equalization necessary to achieve an approximately uniform gain over the desired spectral range.

FIG. 17 is a chart illustrating an exemplary formula for selecting the appropriate active gain equalization necessary to achieve an approximately uniform gain over the desired spectral range. In this particular example, a pump signal spectrum generated by a pump source is convolved with a Raman gain spectrum associated with a Raman amplifier. Convolving the pump signal and the Raman gain spectrum generates a spectrally tailored amplifier output signal. In various embodiments, the spectrally tailored pump signal can be created by one of the active gain equalization techniques illustrated in FIGS. 13A and 13B.

The profile of the spectrally tailored output signal can be designed to produce an approximately uniform gain over a desired spectral range when the output signal is added to an existing optical amplifier spectrum. In various embodiments, the approximately uniform gain can comprise a gain variation of five (5) decibels or less, three (3) decibels or less, one (1) decibel or less, or one-half (½) decibel or less over the desired spectral range.

The above methodology for selecting an active gain equalization element comprises a first order iteration. Spectral tailoring of the output signal for wide band amplification may make further iterations desirable to select the appropriate spectral response of the gain equalization element. In some embodiments, spectral tailoring of the output signal may entail an accounting for the variation in fiber loss over the pump spectrum and the Raman gain spectrum. In other embodiments, spectral tailoring of the output signal may involve modifying the spectral response to account for potential skewing of the pump spectrum to the longer wavelength side due to pump interactions in the amplifier gain medium.

Figure 18:
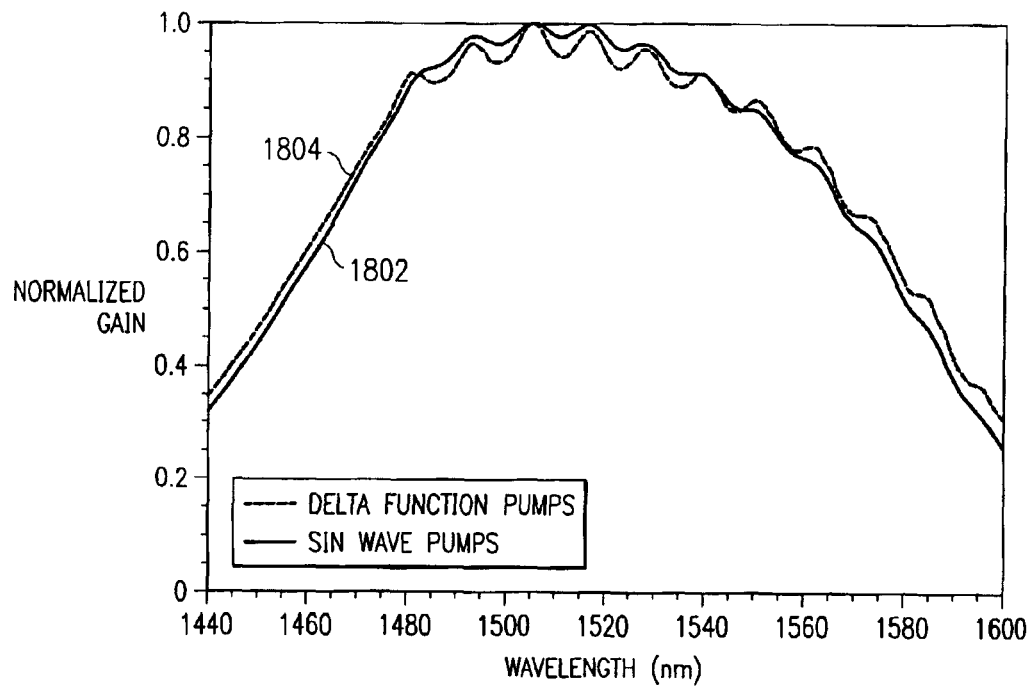
FIG. 18 is a graph comparing a sinusoidal filter function to a delta filter function for active gain equalization elements.

FIG. 18 is a graph comparing a sinusoidal filter function 1802 to a delta filter function 1804 for active gain equalization elements. In this example, line 1802 represents the filter function of a sinusoidal filter. The sinusoidal filter may comprise any device capable of generating a sinusoidal filter response, such as, for example a Mach-Zehnder filter. In this example, the sinusoidal filter comprises a peak every 10 nm. Line 1804 represents the filter function of a delta filter. In this example, the delta filter comprises discrete wavelengths every 10 nm. In this example, each filter function 1802 and 1804 is applied to a pump signal comprising a wavelength spectrum of 1380 nm to 1480 nm.

This graph shows that sinusoidal filter function 1802 yields a less varying gain spectrum than a similar delta filter function 1804. Sinusoidal function 1802 comprises a spectral width at full width half maximum of approximately 126 nm with a gain that is approximately uniform over 62 nm. In this example, the gain spectrum varies within 0.46 decibels over 62 nm. In contrast, delta filter function 1804 comprises a similar spectral width at full width half maximum, but yields a gain spectrum that varies more than 0.46 decibels over 62 nm.

Figure 19:
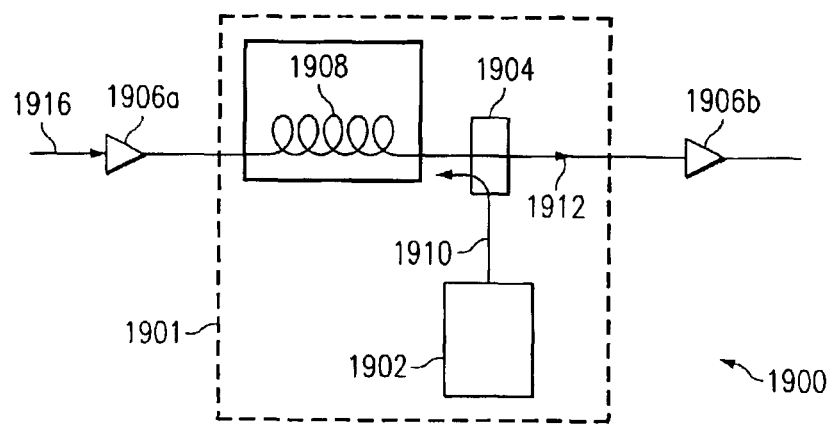
FIG. 19 is a block diagram illustrating an exemplary embodiment of an active gain equalized Raman amplification stage implemented in a pre-existing multiple-stage amplifier.

FIG. 19 is a block diagram illustrating an exemplary embodiment of an active gain equalized Raman amplification stage 1901 implemented in a pre-existing multiple-stage amplifier 1900. In this example, multiple-stage amplifier 1900 comprises at least a first amplification stage 1906a and a second amplification stage 1906b. Although this example uses two amplification stages, any additional number of amplification stages can be used without departing from the scope of the present disclosure. The structure and function of first amplification stage 1906a and second amplification stage 1906b can be substantially similar to amplifier 22 of FIG. 1. In this particular example, first amplification stage 1906a comprises a low-noise pre-amplification stage, while second amplification stage 1906b comprises a high-gain power amplification stage.

As optical communication system designers continue to increase the capacity of optical communication systems, existing optical amplifiers will require either upgrading or replacement to account for the increased capacity. In this embodiment, multiple-stage amplifier 1900 is upgraded to include an active gain equalized Raman amplification stage 1901. In this embodiment, Raman amplification stage 1901 comprises an intermediate amplification-stage of amplifier 1900. In other embodiments, Raman amplification stage 1901 can comprise a pre-amplifier or a final amplification stage of multiple-stage amplifier 1900. Raman amplification stage 1901 may comprise a discrete Raman amplifier or a distributed Raman amplifier.

Raman amplification stage 1901 includes a pump source 1902 capable of generating a spectrally tailored pump signal 1910. Pump source 1902 may comprise any device capable of generating and spectrally tailoring the wavelength spectrum of pump signal 1910. In various embodiments, the structure and function of pump source 1902 can be substantially similar to pump source 1352 of FIG. 13B. In other embodiments, the structure and function of pump source 1902 can be substantially similar to the combination of pump source 1302 and active gain equalization element 1304 of FIG. 13A. In some embodiments, pump source 1902 can generate a pump signal capable of pumping amplification stage 1906*b* and Raman amplification stage 1901. In this particular embodiment, pump source 1902 generates pump signal 1910 operable to pump a Raman gain fiber 1908 associated with Raman amplification stage 1901.

In this embodiment, Raman amplification stage 1901 includes Raman gain fiber 1908 operable to at least partially compensate)for losses experienced by a multiple wavelength signal 1916. Raman gain fiber 1908 may comprise any optical fiber capable of transferring gain from pump signal 1910 to optical signal 1916. In one particular embodiment, upgrading amplifier 1900 to include Raman gain fiber 1908 advantageously enables amplifier 1900 to amplify a larger number of channels in multiple wavelength signal 1916.

In various embodiments, Raman amplification stage 1901 can include a dispersion compensating element coupled to gain fiber 1908 and operable to at least partially compensate for chromatic dispersion that would otherwise be associated with a multiple wavelength signal 1916. Implementing a dispersion compensating element advantageously enables amplifier 1900 to transmit multiple wavelength signal 1916 at a higher rate, for example, at a rate of 9.5 gigabits per second or more.

The dispersion compensating element may comprise any device capable of at least partially counteracting the chromatic dispersion associated with a communication medium traversed by multiple wavelength signal 1916. In one particular embodiment, gain fiber 1908 comprises a length of dispersion compensating fiber having a slope of dispersion that is approximately equal to and opposite from the slope of chromatic dispersion associated with the communication medium traversed by multiple wavelength signal 1916. In an alternative embodiment, the dispersion compensating fiber could comprise a length of dispersion compensating transmission fiber coupled to Raman gain fiber 1908.

In this particular embodiment, spectrally tailored pump signal 1910 operates to spectrally shape a Raman gain spectrum of Raman amplification stage 1901. In various embodiments, the spectrally shaped Raman gain spectrum of Raman amplification stage 1901 can be approximately complimentary to the gain spectrum of multiple-stage amplifier 1900. In some embodiments, the Raman gain spectrum of amplification stage 1901 is combined with the gain spectrum of multiple stage amplifier 1900 to generate an approximately uniform gain over the spectral range of optical signal 1916. In other embodiments, the Raman gain spectrum can be combined with the gain spectrum of multiple stage amplifier 1900 to generate an approximately uniform gain over an increased spectral range.

In this embodiment, Raman amplification stage 1901 comprises a wavelength combiner 1904 capable of coupling spectrally tailored pump signal 1910 to Raman gain fiber 1908. Wavelength combiner 1904 may comprise any device, such as, for example, a wavelength division multiplexer.

FIGS. 20A and 20B are block diagrams illustrating exemplary embodiments of active gain equalization pump sources implemented to upgrade pre-existing optical amplifiers. FIG. 20A is a block diagram illustrating an exemplary embodiment of an active gain equalizing pump source 2002 implemented to upgrade a pre-existing amplifier 2000. In this example, amplifier 2000 includes existing amplification stage 2008. Existing amplification stage 2008 can comprise a single-stage amplifier or multiple-stage amplifier capable of amplifying a multiple wavelength signal 2016. In some embodiments, the structure and function of amplification stage 2008 can be substantially similar to amplifier 22 of FIG. 1.

In this embodiment, amplifier 2000 is upgraded to include a Raman amplification stage 2001. Raman amplification stage 2001 can comprise a distributed Raman pre-amplifier or a discrete Raman pre-amplifier. In this embodiment, Raman amplification stage 2001 comprises a distributed pre-amplification stage of amplifier 2000. Raman amplification stage 2001 includes an active gain equalization pump source 2002. Pump sources 2002 may comprise any device capable of spectrally tailoring pump signal 2010. In various embodiments, the structure and function of pump source 2002 can be substantially similar to pump source 1352 of FIG. 13B. In other embodiments, the structure and function of pump source 2002 can be substantially similar to the combination of pump source 1302 and active gain equalization element 1304 of FIG. 13A.

In this embodiment, Raman amplification stage 2001 includes a Raman gain medium 2006 capable of at least partially compensating for losses experienced by multiple wavelength signal 2016. In various embodiments, gain medium 2006 may comprise a Raman gain fiber coupled to an existing fiber span of an optical communication system. In other embodiments, Raman gain medium 2006 may comprise at least a portion of the existing fiber span coupled to existing amplification stage 2008 prior to the addition of Raman amplification stage 2001.

Spectrally tailored pump signal 2010 generates a spectrally shaped gain spectrum of Raman pre-amplifier 2006. The spectrally shaped gain spectrum of Raman pre-amplifier 2006 operates to form a spectrally tailored output optical signal 2012. Spectrally tailored output signal 2012 comprises a pre-emphasized signal, which results in an approximately uniform gain over the spectral range of multiple wavelength signal 2016 when added to the gain spectrum of existing amplification stage 2008.

In some embodiments, Raman gain medium 2006 may comprise a length of dispersion compensating fiber having a slope of dispersion that is approximately equal to and opposite from the slope of chromatic dispersion associated with a communication medium traversed by multiple wavelength signal 2016. In this embodiment, the dispersion compensating fiber operates to serve as the gain medium for pre-amplification stage 2001. In an alternative embodiment, dispersion compensating fiber could comprise a length of dispersion compensating transmission fiber coupled to a length of Raman gain fiber. Implementing a dispersion compensating fiber advantageously generates a low-noise Raman pre-amplifier.

In this embodiment, amplifier 2000 is upgraded to include a wavelength combiner 2004 capable of coupling spectrally tailored pump signal 2010 to gain medium 2006. Wavelength combiner 2004 may comprise any device, such as, for example, a wavelength division multiplexer or optical circulator.

FIG. 20B is a block diagram illustrating an exemplary embodiment of a plurality of active gain equalizing pump sources 2052a and 2052b implemented to upgrade a pre-existing multiple-stage amplifier 2050. In this example, multiple-stage amplifier 2050 comprises at least a first existing amplification stage 2056a and a second existing amplification stage 2056b. Although these examples use two existing amplification stages, any additional number of amplification stages can be used without departing from the scope of the present disclosure. In these particular examples, first existing amplification stage 2056a comprises a low-noise pre-amplifier, while second existing amplification stage 2056b comprises a high-gain power amplifier.

In this embodiment, amplifier 2050 is upgraded to include at least a first Raman amplification stage 2051a and a second Raman amplification stage 2051b. Although this example implements two Raman amplification stages 2051a and 2051b, any additional number of Raman amplification stages can be implemented without departing from the scope of the present disclosure. First Raman amplification stage 2051a can comprise a distributed Raman pre-amplification stage, a discrete Raman pre-amplification stage, or a hybrid pre-amplification stage. In various embodiments, the structure and function of first Raman amplification stage 2051a can be substantially similar to Raman amplification stage 2001 of FIG. 20A.

In this example, second Raman amplification stage 2051b comprises a discrete Raman amplification stage with a Raman gain spectrum. In various embodiments, the structure and function of second Raman amplification-stage 2051b can be substantially similar to intermediate amplification stage 1901 FIG. 19.

In this example, first Raman amplification stage 2051a includes a first active gain equalization pump source 2052a and second Raman amplification stage 2051b includes a second active gain equalization pump source 2052b. Although this example implements two pump sources 2052a and 2052b, any additional number of pump sources can be implemented without departing from the scope of the present disclosure. Pump sources 2052a and 2052b may comprise any device capable of spectrally tailoring pump signals 2060a and 2060b, respectively.

In this embodiment, first Raman amplification stage 2051a includes a first wavelength combiner 2054a and second Raman amplification stage 2051b includes a second wavelength combiner 2054b. Although this example implements two wavelength combiners 2054a and 2054b, any additional number of combiners can be used without departing from the scope of the present disclosure. In this example, first wavelength combiner 2054a operates to couple spectrally tailored pump signal 2060a to a first Raman gain medium 2058a. In a similar manner, second wavelength combiner 2054b operates to couple spectrally tailored pump signal 2060b to a second Raman gain medium 2058b. Wavelength combiners 2054a and 2054b may comprise any device, such as, for example, a wavelength division multiplexer.

In operation, spectrally tailored pump signal 2060a generates a spectrally shaped gain spectrum within first Raman amplification stage 2051a. The spectrally shaped gain spectrum of first Raman amplification stage 2051a operates on input signal 2066 to form a spectrally tailored output optical signal 2063. Spectrally tailored output signal 2063 comprises a pre-emphasized input to first existing amplification stage 2056a. First existing amplification stage 2056a operates on signal 2063 to form signal 2064.

Spectrally tailored pump signal 2060b of second Raman amplification stage 2051b generates a spectrally shaped gain spectrum within second Raman amplification stage 2051b. The spectrally shaped gain spectrum of second Raman amplification stage 2051b operates on signal 2064 output from first existing amplification stage 2056a to form a spectrally tailored output optical signal 2062. Second existing amplification stage 2056b applies its gain spectrum to signal 2062 to form output signal 2061. Through appropriate control of the gain spectra of Raman amplification stages 2051a and 2051b, output signal 2061 experiences an approximately flat overall gain profile for amplifier 2050.

By using these and similar active gain equalization techniques, existing amplifiers can be upgraded to flatten non-uniform gain profiles over a given wavelength range. Alternatively, these techniques allow for increasing an amplifiers bandwidth while maintaining, or even improving, the uniformity of the amplifier's gain profile.

X. Distributed Amplification in High Loss Systems

FIGS. 21A and 21B are block diagrams illustrating exemplary embodiments of distributed Raman amplifiers capable of at least partially counteracting losses in relatively high loss systems. Distributed Raman amplifiers typically comprise an improved noise figure when compared to a similar discrete Raman amplifier. The improved noise figure enables distributed Raman amplification to be used to increase system capacity, to account for variations in fiber specifications, and/or to increase the separation between amplifiers and/or regenerators. It can be particularly advantageous to use distributed Raman amplifiers in the first stages of a cascade of amplification stages because the noise figure of the first few amplification stages is particularly important in generating a sufficient noise figure.

Existing optical communication systems typically comprise fixed hut spacing (e.g., locations within the system that amplifiers can be placed, typically every 40–45 km) and fixed transmission fiber losses. These systems can be upgraded to include distributed Raman amplification to provide more uniform gain to the optical signal over the fiber span, which can maintain a relatively high signal amplitude and account for fiber losses. In addition, distributed Raman amplification can provide a relatively better signal-to-noise ratio than discrete amplifiers. Consequently, communication systems that require maintenance of relatively high signal amplitude or comprise a relatively high optical fiber loss can benefit from distributed Raman amplification.

A soliton-based communication system provides one example of a system requiring maintenance of a relatively high signal amplitude. Soliton signals typically comprise pulses that substantially maintain their shape over a relatively long communication distance. Conventional soliton systems typically require maintenance of the signal level within 6 decibels of the original level. Consequently, in a soliton system comprising transmission fiber with a loss of 0.2 dB/km, the soliton system requires hut spacing approximately every 30 km. Another aspect of this disclosure recognizes that implementing a distributed amplifier enables maintenance of the relatively high signal level throughout the propagation of the Soliton signal and allows hut spacing to be increased to more than 30 km. In various embodiments, a distributed Raman amplifier can be implemented in a soliton communication system without decreasing the current hut spacing.

An optical system operating with optical wavelengths shorter than 1430 nm or longer than 1610 nm provide a few examples of optical systems comprising a relatively high fiber loss. Operating a Raman amplifier in the 1310 nm window typically results in an increased optical signal loss. For example, a loss of 0.35 dB/km can be expected for operation in the 1310 nm window, where a loss of 0.2 dB/km can typically be expected for operation in the 1550 nm window. As optical signal loss increases, the communication system requires additional gain to achieve optical signal transparency. Consequently, a higher signal level is typically required to maintain the same signal-to-noise ratio for the amplifier. Increasing the signal level, however, can lead to limits imposed on the system from transmission fiber nonlinearities.

One aspect of this disclosure recognizes that implementing a distributed Raman amplifier comprising a relatively lower noise figure enables an increased gain level without increasing the signal level, thus minimizing the impact on signal to noise ratio. In addition, communication systems operating in the higher loss wavelength range of optical fibers (i.e., wavelengths below 1430 nm or above 1610 nm) can maintain the same hut spacing by using distributed amplification.

FIG. 21A is a block diagram illustrating an exemplary embodiment of a distributed Raman amplifier 2100 operating in the 1310 nm operating window. In this example, distributed Raman amplifier 2100 includes a pump source 2102 capable of generating a pump signal 2110. Pump signal 2110 may comprise one or more wavelength signals capable of amplifying one or more optical wavelength signals 2116. Pump source 2102 may comprise any device, such as, for example, a broadband Raman oscillator, a laser diode pump, an active gain equalized pump source, or a combination of these or other pump sources.

In one particular embodiment, the structure and function of pump source 2102 can be substantially similar to active gain equalization pump source 1352 of FIG. 13B. In other embodiments, the structure and function of pump source 2102 can be substantially similar to the combination of pump source 1302 and active gain equalization element 1304 of FIG. 13A. In various embodiments, the structure and function of pump source 2102 can be substantially similar to any one of the wavelength shifters illustrated in FIGS. 4A through 4C. In other embodiments, the structure and function of pump source 2102 can be substantially similar to any one of the broadband Raman oscillators illustrated in FIGS. 6 through 9.

In one particular embodiment, optical signal 2116 comprises a multiple wavelength signal operating in the 1310 nm window of transmission fiber 2106. In this example, a compensation technique may be implemented to account for the inter-channel Raman effect of the multiple wavelength optical signals. The inter-channel Raman effect typically causes the shorter wavelength signals of the multiple wavelength signal to transfer energy to the longer wavelength signals, which can result in a tilted gain profile of optical signal 2116. To substantially counteract this resultant tilted gain profile, a compensation technique can be implemented to provide more gain to the shorter wavelength signals. In this example, pump signal 2110 comprises a spectrally tailored multiple wavelength pump signal capable of compensating for the gain tilt and generating a relatively flat gain profile for optical signal 2116. In some embodiments, the spectrally tailored pump signal 2110 can apply an approximately linear compensation to the gain profile of optical signal 2116.

In this embodiment, distributed Raman amplifier 2100 includes a wavelength combiner 2104 capable of coupling pump signal 2110 to a transmission fiber 2106. Wavelength combiner 2104 may comprise any device capable of coupling one or more wavelength signals to transmission fiber 2106, such as, for example, a wavelength division multiplexer. Transmission fiber 2106 may comprise any optical fiber type capable of supporting Raman gain.

FIG. 21B is a block diagram illustrating an exemplary embodiment of a distributed Raman amplifier 2150 implemented in a pre-existing soliton optical communication system. In this example, the soliton optical communication system includes an amplifier 2158 operable to amplify soliton optical signal 2166. The structure and function of amplifier 2158 can be substantially similar to amplifier 22 of FIG. 1.

In this example, the soliton optical communication system is upgraded to include a distributed Raman amplifier 2150. Distributed Raman amplifier includes a pump source 2152 capable of generating a pump signal 2160. Pump signal 2160 may comprise one or more wavelength signals capable of amplifying one or more soliton optical wavelength signals 2166. Pump source 2152 may comprise any device, such as, for example, a broadband Raman oscillator, a laser diode pump source, an active gain equalized pump source, or a combination of these or other pump sources.

In one particular embodiment, the structure and function of pump source 2152 can be substantially similar to active gain equalization pump source 1352 of FIG. 13B. In other embodiments, the structure and function of pump source 2152 can be substantially similar to the combination of pump source 1302 and active gain equalization element 1304 of FIG. 13A. In various embodiments, the structure and function of pump source 2152 can be substantially similar to any one of the wavelength shifters illustrated in FIGS. 4A through 4C. In other embodiments, the structure and function of pump source 2152 can be substantially similar to any one of the broadband Raman oscillators illustrated in FIGS. 6 through 9.

In one particular embodiment, optical signal 2166 comprises a multiple wavelength soliton signal operating with a relatively high signal level. In this example, a compensation technique may be implemented to account for the inter-channel Raman effect of the multiple wavelength optical signals. The inter-channel Raman effect typically causes the shorter wavelength signals of the multiple wavelength signal to transfer energy to the longer wavelength signals, which can result in a tilted gain profile of optical signal 2166. To substantially counteract this resultant tilted gain profile, a compensation technique can be implemented to provide more gain to the shorter wavelength signals. In this example, pump signal 2160 comprises a spectrally tailored multiple wavelength pump signal capable of compensating for the gain tilt and generating a relatively flat gain profile for optical signal 2166. In some embodiments, the spectrally tailored pump signal 2160 can apply an approximately linear compensation to the gain profile of optical signal 2166.

In this embodiment, distributed Raman amplifier 2150 includes a wavelength combiner 2154 capable of coupling pump signal 2160 to a transmission fiber 2156. Wavelength combiner 2154 may comprise any device capable of coupling one or more wavelength signals to transmission fiber 2156, such as, for example, a wavelength division multiplexer. Transmission fiber 2156 may comprise any optical fiber type capable of supporting Raman gain.

XI. Co-Propagating or Bi-Directionally Pumped Amplifiers

Figure 22A:
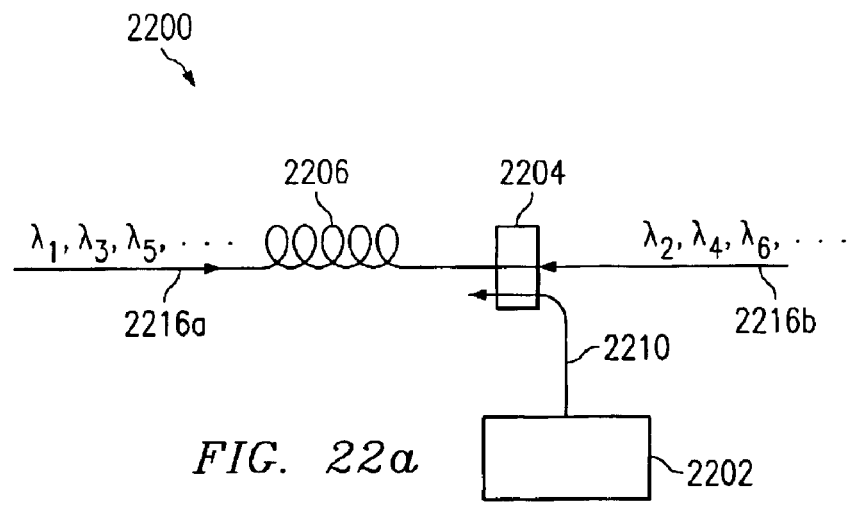
FIGS. 22A and 22B are block diagrams illustrating exemplary embodiments of Raman amplifiers implementing a high-dispersion Raman gain fiber.
Figure 22B:
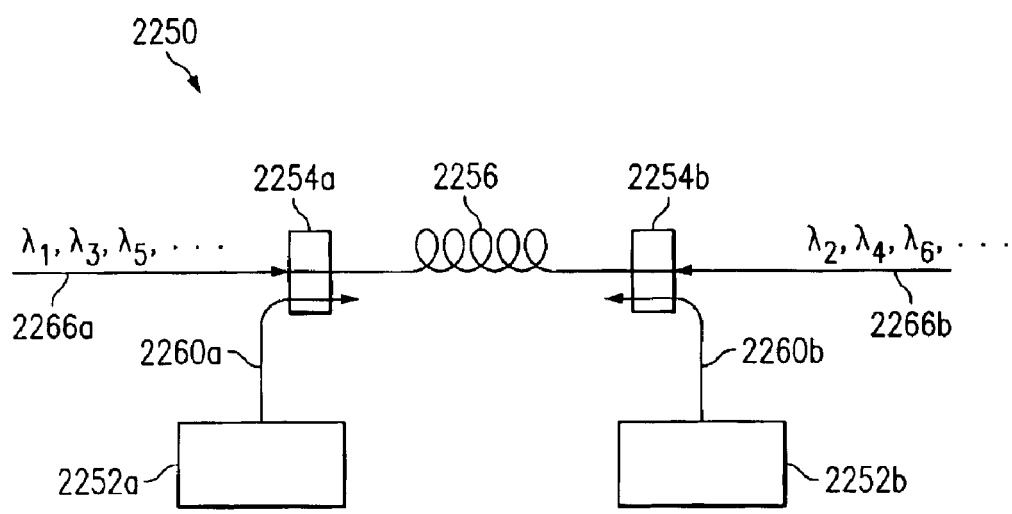

FIGS. 22A and 22B are block diagrams illustrating exemplary embodiments of co-propagating or bi-directionally pumped Raman amplifiers implementing a high-dispersion gain fiber. As used throughout this document, the term "high dispersion gain fiber" refers to an optical fiber having a magnitude of dispersion greater than two (2) picoseconds per nanometer-kilometer over the signal wavelengths of the amplifier. Although this example shows a bi-directional communication link, Raman amplifiers 2200 and 2250 could alternatively be implemented in a uni-directional optical communication system.

In these embodiments, each Raman amplifier 2200 and 2250 comprises at least one pump signal 2210 and 2260 that co-propagates with at least one of the wavelengths of optical signals 2216 and 2266, respectively. Conventional design approaches that have implemented Raman amplification typically limit the pump signal to counter-propagate in relation to the optical signal. As used throughout this document, the term "counter-propagate" refers to a pump signal that propagates through the gain medium of an optical device in a direction counter to the direction of optical signal 2216. Counter-propagation has typically been used to minimize the duration of interaction and cross talk between the pump signal and the optical signal, and to minimize inter-channel interference between one or more wavelengths of the optical signal.

Unlike conventional applications in one particular embodiment, amplifiers 2200 and 2250 implement at least one pump signal that co-propagates with at least one wavelength of the optical signal. Throughout this document, the term "co-propagates" or "co-propagating" refers to a condition where, for at least some time at least a portion of the pump signal propagates through the gain medium in the same direction as at least one wavelength of the optical signal being amplified.

One aspect of this disclosure recognizes that generating a sufficient walk off between different wavelength signals can enable the formation of a co-propagating or a bi-directionally pumped Raman amplifier that minimizes cross talk and inter-channel interference. In particular, cross talk between optical signals and pump signals, and inter-channel interference can be minimized by ensuring that the different wavelengths walk off relatively rapidly.

The rate of walk off for a wavelength depends at least in part on the group velocity dispersion in an optical fiber. The group velocity dispersion depends at least in part on the magnitude of dispersion of the gain fiber and the velocity differences of the wavelengths traversing the gain fiber. The velocity differences of the wavelengths depend at least in part on the magnitude of dispersion (D) of the gain fiber and the difference ($\Delta\lambda$) between the optical signal wavelengths and/or a pump signal wavelength. Increasing the length (L) and/or dispersion of the gain fiber tends to increase the timing difference between particular wavelengths. Thus, the larger the dispersion and longer the gain fiber, the larger the timing difference between wavelengths. In equation form, this relationship is expressed as:

$$\Delta t = D \times \Delta\lambda \times L \tag{1}$$

where $\Delta t$ is the difference in transit time between optical signals with a wavelength difference $\Delta\lambda$.

One aspect of this disclosure recognizes that a Raman amplifier implementing at least one co-propagating pump can be implemented that ensures sufficient walk off between different wavelength signals by using an adequate length of high-dispersion Raman gain fiber. The walk-off length ($L_{wo}$) can be determined by:

$$L_{wo} = \frac{\Delta t}{D \times \Delta\lambda} \tag{2}$$

where $\Delta t$ is the bit period (e.g., inverse of the bit rate), D is the average group velocity dispersion, and $\Delta\lambda$ is the wavelength separation between the two signals or signal and pump. This equation enables the determination of the walk-off length between the optical signal wavelengths and the pump wavelength ($L_{wosp}$) where $\Delta\lambda$ comprises the difference between the center wavelength of the optical signal and the pump signal wavelength. In addition, this equation enables the determination of the walk-off length between adjacent channels of the optical signals ($L_{woss}$) where $\Delta\lambda$ comprises the difference between adjacent optical signals. As used in this document, the term "channel" refers to a center wavelength of an information carrying signal and/or wavelength. A channel is adjacent to another channel if there are no information carrying signals between them.

To ensure adequate walk-off between the pump signal wavelengths and the optical signal wavelengths, the length of the gain fiber ($L_{amp}$) should be at least ten (10) times the walk off length ($L_{wosp}$). In equation form, this relationship is expressed as:

$$L_{amp} > 10 \times L_{wosp} \tag{3}$$

In addition, to ensure adequate walk off between adjacent co-propagating optical signals, the length of the gain fiber ($L_{amp}$) should be at least two (2) times the walk off length ($L_{woss}$) for those signals. In equation form, this relationship is expressed as:

$$L_{amp} > 2 \times L_{woss} \tag{4}$$

In various embodiments, the optical signal comprises a magnitude of dispersion acquired by the optical signal while traversing the optical communication system. In some embodiments, the dispersion acquired by the optical signal while traversing an optical communication system can comprise a combination of a residual dispersion and/or local dispersion. As used throughout this document, the term "residual dispersion" refers to dispersion remaining in an optical signal after traversing a dispersion compensating element. The term "local dispersion" refers to dispersion acquired by the optical signal while traversing a particular span or transmission link of the optical communication system.

In one particular embodiment, the dispersion compensating element comprises a maximum dispersion compensation level that is intentionally selected to provide only partial compensation for dispersion acquired by the optical signal while traversing a span of the system. Providing only partial dispersion compensation in each span allows the system to maintain a sufficiently high dispersion. Maintaining a sufficiently high dispersion throughout the system is advantageous in providing adequate walk off between the pump signal and the optical signal, which tends reduce the RIN system penalty. In addition, the optical signal noise associated with the RIN penalty and the residual dispersion at least partially destructively interact when received by a receiver after traversing the multiple span communication system, thus reducing the overall system noise penalty. In various embodiments, each dispersion compensating element comprises a maximum dispersion compensation level of ninety-nine (99) percent or less, ninety (90) percent or less, seventy-five (75) percent or less, or fifty (50) percent or less.

FIG. 22A is a block diagram illustrating an exemplary embodiment of a Raman amplifier 2200 implementing a uni-directionally pumped Raman gain fiber 2206. In this example, Raman amplifier 2200 includes a pump source 2202 capable of generating a pump signal 2210. Pump source 2202 may comprise any device capable of generating pump signal 2210.

In some embodiments, pump source 2202 can comprise a low-noise pump source, such as, for example, a pump source comprising a relatively low relative noise intensity (RIN) light source. Implementing a low-noise pump provides the advantage of minimizing cross talk between pump signal 2210 and multiple wavelength signal 2216 while at least a portion of the signals are co-propagating.

In this particular embodiment, a Raman gain fiber 2206 is implemented in a bi-directional optical communication system. In this example, Raman gain fiber 2206 receives at least a first optical signal 2216a and a second optical signal 2216b. In this example, first optical signal 2216a comprises one or more wavelengths propagating in a first direction through gain fiber 2206. Similarly, second optical signal 2216b comprises one or more wavelengths propagating in a second direction through gain fiber 2206. In one particular embodiment, the first direction of propagation is approximately complimentary to the second direction of propagation. In this particular embodiment, at least one wavelength of pump signal 2210 co-propagates with at least one wavelength of second optical signal 2216b. In an alternative embodiment, pump signal 2210 can be introduced to gain fiber 2206 in a manner that enables at least one wavelength of pump signal 2210 to co-propagate with at least one wavelength of first optical signal 2216a.

In an alternative embodiment, Raman gain fiber 2206 can be implemented in an uni-directional optical communication system. In that example, Raman gain fiber 2206 receives an optical signal traversing gain fiber 2206 in a first direction of propagation. In this embodiment, pump signal 2210 is introduced to Raman gain fiber 2206 in a manner that enables at least one wavelength of pump signal 2210 to co-propagate with at least one wavelength of optical signal 2216.

In some embodiments, optical signal 2216a and 2216b traveling in different directions can comprise distinct sets of wavelengths. As one particular example, each wavelength of first optical signal 2216a can be adjacent to one or more wavelengths of second optical signal 2216b. For example, where first optical signal 2216a comprises wavelengths $\lambda 1$, $\lambda 3$, and $\lambda 5$, first optical signal 2216b could comprise at least wavelengths $\lambda 2$, $\lambda 4$, and $\lambda 6$, which are adjacent to wavelengths $\lambda 1$, $\lambda 3$, and $\lambda 5$ of signal 2216a. In this particular example, the first direction of propagation and the second direction of propagation are approximately complimentary one another. In various embodiments, optical signals 2216a and 2216b propagate through amplifier 2200 having a data rate of 2.5 gigabits per second or more, or having a data rate of 9.5 gigabits per second or more.

In this embodiment, Raman amplifier 2200 includes a uni-directionally pumped gain fiber 2206 capable of amplifying optical signals 2216a and 2216b. Implementing a uni-directionally pumped gain fiber 2206 is particularly advantageous in a Raman amplifier where changes in pump power are three (3) decibels or less in gain fiber 2206. In this example, gain fiber 2206 operates to minimize cross talk and inter-channel interference. Gain fiber 2206 may comprise any optical fiber capable of generating a relatively high magnitude of dispersion over the range of signal wavelengths, such as, for example, dispersion shifted fiber, standard single mode fiber, or dispersion compensating fiber.

Although the use of high dispersion gain fiber can minimize inter-channel interference, a system designer should also consider the impact of Raman cross talk between wavelengths of a multiple wavelength optical signal. This effect results from shorter wavelengths transferring energy to longer wavelengths of an optical signal via the Raman effect. For example, if equal power is launched in four adjacent multiple wavelength signal channels, at the end of the gain fiber the channel power profile will typically be tilted with more power in the longer wavelength channels. In various embodiments, a pre-emphasis technique can be implemented to account for Raman cross talk and achieve a substantially uniform power profile. In other embodiments, active gain equalization can be implemented to compensate for the Raman cross talk effect.

In this embodiment, Raman amplifier 2200 includes a wavelength combiner 2204 capable of coupling pump signal 2210 to Raman gain fiber 2206. Wavelength combiner 2204 may comprise any device capable of coupling one or more wavelength signals to Raman gain fiber 2206, such as, for example, a wavelength division multiplexer.

FIG. 22B is a block diagram illustrating an exemplary embodiment of a Raman amplifier 2250 implementing a bi-directionally pumped Raman gain fiber 2256. In this example, Raman amplifier 2250 includes at least a first pump source 2252a and a second pump source 2252b. Although this example includes two pump sources 2252a and 2252b, any number of pump sources can be used without departing from the scope of the present disclosure. Each pump source 2252a and 2252b may comprise any device capable of generating pump signal 2260. The structure and function of each pump source 2252a and 2252b can be substantially similar to pump source 2202 of FIG. 22A. In one particular embodiment, pump sources 2252a and 2252b each comprise a low-noise pump source, such as, for example, a pump source comprising a relatively low relative noise intensity (RIN) light source.

In an alternative embodiment, Raman amplifier 2250 can include a first optical isolator and a second optical isolator. The first optical isolator can be coupled between pump source 2252a and gain fiber 2256. The first optical isolator operates to minimize cross talk between pump signal 2260b and 2260a and/or instabilities generated through feedback. The second optical isolator can be coupled between pump source 2252b and gain fiber 2256 and operate to minimize cross talk between pump signal 2260a and 2260b.

In this particular embodiment, a Raman gain fiber 2256 is implemented in a bi-directional optical communication system. In this example, Raman gain fiber 2256 receives at least a first optical signal 2266a and a second optical signal 2266b. In this example, first optical signal 2266a comprises one or more wavelengths propagating in a first direction through gain fiber 2256. Similarly, second optical signal 2266b comprises one or more wavelengths propagating in a second direction through gain fiber 2256. In one particular embodiment, the first direction of propagation is approximately complimentary to the second direction of propagation. In this particular embodiment, at least one wavelength of pump signal 2260b co-propagates with at least one wavelength of second optical signal 2266b. In an alternative embodiment, pump signal 2260a can be introduced to gain fiber 2256 in a manner that enables at least one wavelength of pump signal 2260a to co-propagate with at least one wavelength of first optical signal 2266a.

In an alternative embodiment, Raman gain fiber 2256 can be implemented in an uni-directional optical communication system. In that example, Raman gain fiber 2256 receives an optical signal 2266 traversing gain fiber 2256 in a first direction of propagation. In this embodiment, pump signal 2260 is introduced to Raman gain fiber 2256 in a manner that enables at least one wavelength of pump signal 2260 to co-propagate with at least one wavelength of optical signal 2266.

In some embodiments, each wavelength of first optical signal 2266a is adjacent to a wavelength of second optical signal 2266b. For example, where first optical signal 2266a comprises wavelengths λ1, λ3, and λ5, second optical signal 2266b would comprise at least wavelengths λ2, λ4, and λ6, which are adjacent to wavelengths λ1, λ3, and λ5 of signal 2266a. In these particular examples, the first direction of propagation and the second direction of propagation are substantially opposite one another. In various embodiments, optical signals 2266a and 2266b propagate through amplifier 2250 having a data rate of 2.5 gigabits per second or more, or having a data rate of 9.5 gigabits per second or more.

In this embodiment, Raman amplifier 2250 includes a bi-directionally pumped Raman gain fiber 2256 capable of amplifying multiple wavelength signals 2266a and 2266b. Implementing a bi-directionally pumped Raman gain fiber 2256 is particularly advantageous in a Raman amplifier where changes in pump power are greater than three (3) decibels in gain fiber 2256. In this example, gain fiber 2256 operates to minimize cross talk between pump signal 2260 and multiple wavelength signal 2266. In addition, gain fiber 2256 operates to minimize inter-channel interference between adjacent signals within multiple wavelength signals 2266. Gain fiber 2256 may comprise any optical fiber capable of generating a relatively high magnitude of dispersion, such as, for example, dispersion shifted fiber, standard single mode fiber, or dispersion compensating fiber. In one particular embodiment, gain fiber 2256 comprises a sufficient length of dispersion compensating fiber with a magnitude of dispersion of at least sixteen (16) picoseconds per nanometer-kilometer.

In this embodiment, Raman amplifier 2250 includes at least a first wavelength combiner 2254a and a second wavelength combiner 2254b. Although this example includes two wavelength combiners 2254a and 2254b, any number of wavelength combiners can be used without departing from the scope of the present disclosure. Each wavelength combiner 2254a and 2254b may comprise any device capable of coupling one or more wavelength signals to Raman gain fiber 2256, such as, for example, a wavelength division multiplexer.

XII. Examples of Bi-Directionally Pumped Raman Amplifiers

This section provides specific examples of bi-directional Raman amplifiers. In these examples, the bi-directional Raman amplifiers receive an optical signal band centered at approximately the 1550 nm wavelength. The Raman amplifiers also receive a pump signal centered at approximately the 1450 nm wavelength (Δλ=100 nm for signal and pump). In this example, the optical signal comprises a multiple wavelength signal with a channel spacing of approximately 0.8 nm. Each adjacent channel counter-propagates with the channel spaced approximately 0.8 nm. In other words, the channel spacing between adjacent co-propagating channels is approximately 1.6 nm. The multiple wavelength optical signals propagate at bit rates of approximately 2.5 Gb/s in a first embodiment, and at 10 Gb/s in a second embodiment.

The respective bit periods of the two embodiments are 400 picoseconds or 100 picoseconds, respectively.

In a first example, the bi-directional Raman amplifier implements a gain fiber comprising dispersion compensating fiber with a length of 8 km in the first embodiment, and 15 km in the second embodiment. In addition, the dispersion compensating fiber comprises an average magnitude of dispersion of 90 picoseconds/nm-km and a loss of 0.55 dB/km at the pump signal wavelength.

According to equations (1)–(4) discussed above, the walk off length ($L_{woss}$) between adjacent signal channels is:

$L_{woss}$=2.78 km at 2.5 Gb/s; and $L_{woss}$=0.69 km at 10 Gb/s

The walk off length ($L_{wosp}$) between the pump signal and the multiple wavelength optical signal is:

$L_{wosp}$=44.4 m at 2.5 Gb/s; and $L_{wosp}$=11.1 m at 10 Gb/s

This example illustrates that adequate walk off ($L_{wosp}$) between the pump signal wavelengths and optical signal wavelengths can be achieved in either embodiment:

8 km>10×44.4 m at 2.5 Gb/s 15 km>10×11.1 m at 10 Gb/s

In addition, adequate walk off ($L_{woss}$) between adjacent signal channels can also be achieved in either embodiment:

8 km>2×2.78 km at 2.5 Gb/s 15 km>2×0.69 km at 10 Gb/s

Therefore, a bi-directional amplifier implementing dispersion compensating fiber can be made to satisfactorily amplify multiple wavelength signals propagating at least at 2.5 Gb/s or 10 Gb/s. However, since the loss is more than 3 dB for the pump signal, it may be advantageous to bi-directionally pump the amplifier, as shown in FIG. 22B.

Implementing dispersion compensating fiber as the Raman gain fiber in a bi-directional Raman amplifier provides the advantage of enabling the gain fiber to function as a dispersion compensating element. In various embodiments, the gain fiber comprises a sufficient length of dispersion compensating fiber to at least partially compensate for chromatic dispersion. In other embodiments, a bi-directional amplifier comprising dispersion compensating fiber can be used to upgrade an existing bi-directional amplifier. In some embodiments, the bi-directional amplifier can implement active gain equalization to achieve an approximately uniform gain over a specified spectral range.

In a second example, the bi-directional Raman amplifier implements a gain fiber comprising a standard single mode fiber with a length of 8 km. In addition, the standard single mode fiber comprises an average magnitude of dispersion of 16 picoseconds/nm-km and a loss of 0.30 dB/km at the pump signal wavelength.

According to equations (1)–(4) discussed above, the walk off length ($L_{woss}$) between adjacent signal channels is:

$L_{woss}$=15.6 km at 2.5 Gb/s; and $L_{woss}$=3.9 km at 10 Gb/s

The walk off length ($L_{wosp}$) between the pump signal and the multiple wavelength optical signal is:

$L_{wosp}$=0.25 km at 2.5 Gb/s; and $L_{wosp}$=62.5 m at 10 Gb/s

This example illustrates that adequate walk off ($L_{wosp}$) between the pump signal wavelengths and optical signal wavelengths can be achieved in either embodiment:

8 km>10×0.25 km at 2.5 Gb/s 8 km>10×62.5 m at 10 Gb/s

In addition, this example illustrates that adequate walk off ($L_{woss}$) between adjacent signal channels can also be achieved, but only at a bit rate of 10 Gb/s:

8 km<2×15.6 km at 2.5 Gb/s (fails)

8 km>2×3.9 km at 10 Gb/s

Therefore, a bi-directional amplifier implementing standard single mode fiber with a fiber length of 8 km can be made to satisfactorily amplify optical signals propagating at least at 10 Gb/s. In addition, the bi-directional amplifier of this example cannot satisfy the design criteria of the above equations at a bit rate of 2.5 Gb/s. However, a bi-directional amplifier implementing standard single mode fiber can be made to satisfactorily amplify optical signals propagating at least at 2.5 Gb/s or 10 Gb/s by selecting the appropriate channel spacing, fiber length, and/or wavelengths propagated.

In a third example, the bi-directional Raman amplifier implements a gain fiber comprising dispersion-shifted fiber with a length of 8 km. In addition, the dispersion-shifted fiber comprises an average magnitude of dispersion of 2 picoseconds/nm-km and a loss of 0.30 dB/km at the pump signal wavelength.

According to equations (1)–(4) discussed above, the walk off length ($L_{woss}$) between adjacent signal channels is:

$L_{woss}$=125 km at 2.5 Gb/s; and $L_{woss}$=31.3 km at 10 Gb/s

The walk off length ($L_{wosp}$) between the pump signal and the multiple wavelength signal is:

$L_{wosp}$=2 km at 2.5 Gb/s; and $L_{wosp}$=0.5 km at 10 Gb/s

This example illustrates that adequate walk off ($L_{wosp}$) between the pump signal wavelengths and optical signal wavelengths can be achieved only at a bit rate of 10 Gb/s:

8 km<10×2 m at 2.5 Gb/s (fails)

8 km>10×0.5 m at 10 Gb/s

In addition, this example illustrates that adequate walk off ($L_{woss}$) between adjacent signal channels can not be achieved in either embodiment:

8 km<2×125 km at 2.5 Gb/s (fails)

8 km<2×31.3 km at 10 Gb/s (Fails)

Therefore, a bi-directional amplifier implementing dispersion-shifted fiber with a fiber length of 8 km cannot satisfy the design criteria of the above equations at bit rates of at least 2.5 Gb/s and 10 Gb/s. However, a bi-directional amplifier implementing dispersion-shifted fiber can be made to satisfactorily amplify optical signals propagating at least at 2.5 Gb/s or 10 Gb/s by selecting the appropriate channel spacing, fiber length, and/or wavelengths propagated.

XIII. Laser Diode Pumped BBRO for New Bandwidth Windows

Figure 23A:
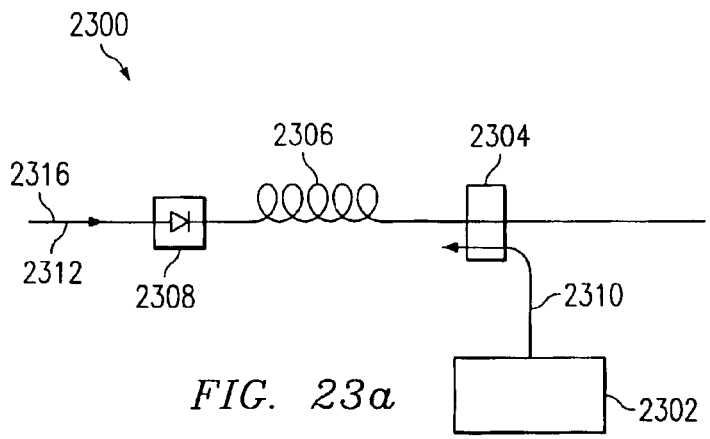
FIGS. 23A through 23C are block diagrams illustrating exemplary embodiments of Raman amplifiers implementing a laser diode pump to various wavelength ranges.
Figure 23B:
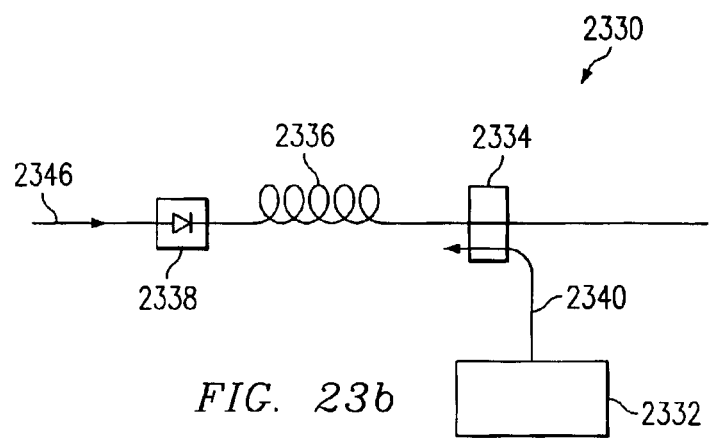
Figure 23C:
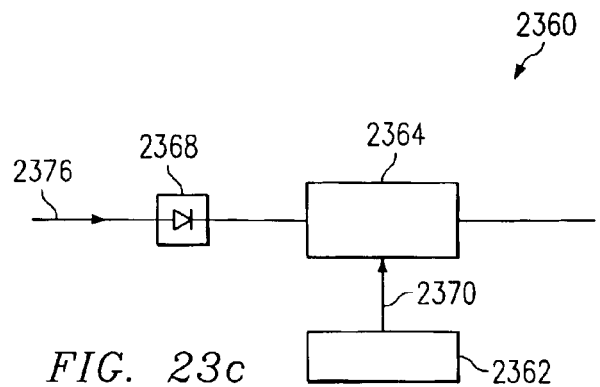

FIGS. 23A through 23C are block diagrams illustrating exemplary embodiments of Raman amplifiers implementing a laser diode pump to various wavelength ranges. In these examples, each Raman amplifier 2300, 2330, and 2360 includes an isolator 2308, 2338, and 2368 operable to minimize lasing feedback.

FIG. 23A is a block diagram illustrating an exemplary embodiment of a Raman amplifier 2300 implementing a laser diode pump 2302 to amplify wavelengths in the 1400 nm window. In this example, Raman amplifier 2300 includes laser diode pump 2302 capable of generating a multiple wavelength pump signal 2310. The structure and function of laser diode pump 2302 can be substantially similar to any of the pump sources in FIGS. 2A through 2D. In this particular embodiment, pump 2302 comprises a plurality of laser diodes each capable of generating a lasing wavelength centered at approximately the 1310 nm wavelength.

In this embodiment, Raman amplifier 2300 is coupled to a fiber span 2312 comprising a low-loss operating window approximately centered at the 1400 nm wavelength. Fiber span 2312 may comprise any optical fiber capable of generating a low-loss operating window approximately centered at the 1400 nm wavelength, such as, for example, the "all-wave" optical fiber.

In this embodiment, Raman amplifier 2300 includes a wavelength combiner 2304 capable of coupling pump signal 2310 to gain fiber 2306. Wavelength combiner 2304 may comprise any device, such as, for example, a wavelength division multiplexer. Gain fiber 2306 may comprise any optical fiber capable of transferring the optical energy of pump signal 2310 to multiple wavelength signal 2316. In one particular embodiment, at least a portion of gain fiber 2306 comprises an appropriate length of dispersion compensating fiber capable of at least partially counteracting chromatic dispersion associated with multiple wavelength signal 2316.

In this particular embodiment, pump signal 2310 traverses gain fiber 2306 in a direction approximately complimentary to that of multiple wavelength optical signal 2316. In an alternative embodiment, pump signal 2310 can be introduced to gain fiber 2306 in a manner that enables at least one wavelength of pump signal 2310 to co-propagate with at least one wavelength of optical signal 2316. In that example, optical signal 2316 traverses gain fiber 2306 in a substantially similar direction of propagation to that of pump signal 2310. In yet another alternative embodiment, gain fiber 2306 can be bi-directionally pumped.

In this embodiment, laser diode pump 2302 directly pumps gain fiber 2306. In an alternative embodiment, Raman amplifier 2300 can include an active gain equalization element coupled between laser diode pump 2302 and wavelength combiner 2304. The structure and function of the active gain equalization element can be substantially similar to active gain equalization element 1304 of FIG. 13A.

FIG. 23B is a block diagram illustrating an exemplary embodiment of a Raman amplifier 2330 implementing a broadband Raman oscillator 2332 to amplify wavelengths in the violet window (e.g., 1430 and 1525 nm wavelength range). In this example, Raman amplifier 2330 includes broadband Raman oscillator 2332 operable to wavelength shift a laser diode generated pump signal. In various embodiments, the structure and function of Raman oscillator 2332 can be substantially similar to any of the broadband Raman oscillators illustrated in FIGS. 6 through 9. In this embodiment, Raman oscillator 2332 operates to wavelength shift a pump signal centered at approximately the 1310 nm wavelength to a first Raman cascade order. In this example, the first Raman cascade order comprises a 1356 nm to 1424 nm wavelength range.

In this embodiment, broadband Raman oscillator 2332 also operates to generate a spectrally tailored pump signal 2340. In one particular embodiment, broadband Raman oscillator 2332 comprises an active gain equalization element operable to generate spectrally tailored pump signal 2340. The active gain equalizing element may comprise any device capable of spectrally tailoring pump signal 2340. In one particular embodiment, the active gain equalizing element can generate an approximately uniform gain over the desired spectral range. For example, the active gain equalizing element may comprise a Mach-Zehnder type filter, a dielectric filter, a lattice device, or a long-period grating.

In another embodiment, broadband Raman oscillator 2332 operates to receive a multiple wavelength pump signal generated by a plurality of laser diodes capable of tailoring the gain spectrum of the pump signal. Spectrally tailored pump signal 2340 can be generated by adjusting the amplitude of each of the plurality of laser diodes. In this example, each of the plurality of laser diodes is grating tuned and generates a specific lasing wavelength. In one particular embodiment, each of the plurality of laser diodes generates a lasing wavelength centered at approximately the 1310 nm wavelength.

In this embodiment, Raman amplifier 2330 includes a wavelength combiner 2334 capable of coupling pump signal 2340 to gain fiber 2336. Wavelength combiner 2334 may comprise any device, such as, for example, a wavelength division multiplexer. Gain fiber 2336 may comprise any optical fiber capable of transferring the optical energy of pump signal 2340 wavelength to multiple wavelength signal 2346. In one particular embodiment, at least a portion gain fiber 2336 comprises an appropriate length of dispersion compensating fiber capable of at least partially counteracting chromatic dispersion associated with multiple wavelength signal 2346.

In this particular embodiment, pump signal 2340 traverses gain fiber 2336 approximately complimentary to multiple wavelength optical signal 2346. In an alternative embodiment, pump signal 2340 can be introduced to gain fiber 2336 in a manner that enables at least one wavelength of pump signal 2340 to co-propagate with at least one wavelength of optical signal 2346. In that example, optical signal 2346 traverses gain fiber 2336 in a substantially similar direction of propagation to that of pump signal 2340. In yet another alternative embodiment, gain fiber 2336 can be bi-directionally pumped.

In this embodiment, broadband Raman oscillator 2332 includes an active gain equalization element. In an alternative embodiment, Raman amplifier 2330 can include an active gain equalization element coupled between broadband Raman oscillator 2332 and wavelength combiner 2334. The structure and function of the active gain equalization element can be substantially similar to active gain equalization element 1304 of FIG. 13A.

FIG. 23C is a block diagram illustrating an exemplary embodiment of a Raman amplifier 2360 implementing a laser diode pump 2362 to amplify wavelengths in the violet window. In this example, Raman amplifier 2360 includes laser diode pump 2362 capable of generating a multiple wavelength pump signal 2370. The structure and function of laser diode pump 2362 can be substantially similar to any of the pump sources in FIGS. 2A through 2D. In this particular embodiment, pump 2362 comprises a plurality of laser diodes each capable of generating a lasing wavelength centered at approximately the 1310 nm wavelength.

In this embodiment, Raman amplifier 2360 comprises a Raman amplification stage 2364 coupled to laser diode pump 2362. Raman amplification stage 2364 comprises a broadband Raman oscillator operable to wavelength shift pump signal 2370 received from laser diode pump 2362. In this example, the broadband Raman oscillator operates to wavelength shift pump signal 2370 by two Raman cascade orders. Raman amplification stage 2364 also operates to amplify a multiple wavelength signal 2376. In this example, a gain fiber associated with the broadband Raman oscillator is combined with a gain fiber used to amplify multiple wavelength signal 2376. Raman amplification stage 2364 may comprise any device, such as, for example, a Sagnac Raman cavity, a linear cavity with chirped gratings, or a circulator loop cavity.

In this embodiment, laser diode pump 2362 directly pumps Raman amplification stage 2364. In an alternative embodiment, Raman amplifier 2360 can include an active gain equalization element coupled between laser diode pump 2362 and Raman amplification stage 2364. The structure and function of the active gain equalization element can be substantially similar to active gain equalization element 1304 of FIG. 13A.

Although the present invention has been described in several embodiments, a myriad of changes, variations, alterations, transformations, and modifications may be suggested to one skilled in the art, and it is intended that the present invention encompass such changes, variations, alterations, transformations, and modifications as falling within the spirit and scope of the appended claims.

What is claimed is:

1. A laser diode pump, comprising:
   a plurality of laser diodes each capable of generating a lasing wavelength; and
   at least one wavelength combiner operable to combine the plurality of lasing wavelengths generated by the plurality of laser diodes into a multiple wavelength pump signal, the at least one combiner comprising at least a first polarization combiner and at least a second polarization combiner;
   wherein at least two of the plurality of lasing wavelengths generated by the plurality of laser diodes comprise a wavelength between 1270 nm and 1350 nm.

2. The laser diode pump of claim 1, wherein the plurality of laser diodes comprise at least a first pair of laser diodes and at least a second pair of laser diodes; and wherein each diode of each pair outputs approximately the same wavelength as the other diode in that pair.

3. The laser diode pump of claim 2, wherein the at least a first pair of laser diodes generate a first lasing wavelength, and wherein the at least a second pair of laser diodes generate a second lasing wavelength.

4. The laser diode pump of claim 3, wherein the first lasing wavelength comprises a wavelength spaced by five (5) nanometers or more from the second lasing wavelength.

5. The laser diode pump of claim 1, wherein the plurality of laser diodes comprises four (4) laser diodes.

6. The laser diode pump of claim 1, wherein the plurality of laser diodes comprises eight (8) laser diodes.

7. The laser diode pump of claim 1, wherein at least one of the plurality of laser diodes comprises a ternary material.

8. The laser diode pump of claim 7, wherein the ternary material comprises an InGaAs material.

9. The laser diode pump of claim 7, wherein an active region of the at least one laser diode comprises the ternary material.

10. The laser diode pump of claim 1, wherein at least one of the plurality of laser diodes comprises a quarternary material.

11. The laser diode pump of claim 1, wherein the at least one wavelength combiner comprises a device selected from a group consisting of a polarization beam splitter, a wavelength division multiplexer, and a polarization multiplexer.

12. The laser diode pump of claim 1, wherein the multiple wavelength pump signal comprises a substantially un-polarized pump signal.

13. The laser diode pump of claim 1, wherein the multiple wavelength pump signal operates to pump a gain fiber of a distributed Raman amplifier coupled to the laser diode pump.

14. The laser diode pump of claim 1, wherein the multiple wavelength pump signal operates to pump a broadband Raman oscillator capable of wavelength shifting the multiple wavelength pump signal to a desired Raman cascade order.

15. The laser diode pump of claim 14, wherein the broadband Raman oscillator comprises at least one wavelength control element operable to select at least one wavelength for output from the oscillator.

16. The laser diode pump of claim 15, wherein the at least one wavelength control element comprises a device selected from a group consisting of a fiber grating, a dielectric filter, and a wavelength division multiplexer filter.

17. The laser diode pump of claim 14, wherein a multiple wavelength pump signal output from the Raman oscillator facilitates amplification in an operating window selected from a group consisting of a 1400 nanometer window, the violet window, and the EDFA window.

18. The laser diode pump of claim 1, further comprising a plurality of wavelength selecting devices each coupled to one of the plurality of laser diodes and operable to select and pass at least one lasing wavelength.

19. The laser diode pump of claim 18, wherein at least one of the plurality of wavelength selecting devices comprises a device capable of tuning the at least one lasing wavelength to at least 30 nanometers from a gain peak of the laser diode coupled to the at least one of the plurality of wavelength selecting devices.

20. The laser diode pump of claim 18, wherein at least one of the plurality of wavelength selecting devices comprises a fiber pig-tailed cavity comprising a grating.

21. The laser diode pump of claim 18, wherein at least one of the plurality of wavelength selecting devices operates to maintain a polarization of the selected lasing wavelength.

22. The laser diode pump of claim 18, wherein at least one of the plurality of wavelength selecting devices comprises a polarization maintaining optical fiber coupled between one of the plurality of laser diodes and one of the plurality of wavelength selecting devices.

23. The laser diode pump of claim 18, wherein at least one of the plurality of wavelength selecting devices comprises a device capable of reflecting five (5) percent or more of the selected lasing wavelength.

24. The laser diode pump of claim 1, further comprising at least one polarization combiner operable to combine at least two signals having approximately the same lasing wavelength into a substantially un-polarized pump signal.

25. The laser diode pump of claim 24, wherein the at least one polarization combiner comprises a device selected from a group consisting of a polarization beam splitter, a polarization multiplexer, and a birefringent element.

26. A laser diode pump, comprising:
  a plurality of laser diodes each capable of generating a lasing wavelength; and
  at least one combiner operable to combine at least two of the lasing wavelengths generated by the plurality of laser diodes into at least one substantially un-polarized pump signal, the at least one combiner comprising at least a first polarization combiner and at least a second polarization combiner;
  wherein at least one of the lasing wavelengths generated by the plurality of laser diodes comprises a wavelength between 1270 nm and 1350 nm.

27. The laser diode pump of claim 26, wherein the at least one combiner comprises a device selected from the group consisting of a wavelength division multiplexer, a polarization beam splitter, a polarization multiplexer, a power coupler, and a birefringent element.

28. The laser diode pump of claim 26, wherein the at least a first polarization combiner operates to generate a first substantially un-polarized pump signal, and wherein the at least a second polarization combiner operates to generate a second substantially un-polarized pump signal.

29. The laser diode pump of claim 26, further comprising a wavelength combiner operable to receive outputs from the first polarization combiner and the second polarization combiner and to form a multiple wavelength substantially un-polarized pump signal.

30. The laser diode pump of claim 29, wherein the wavelength combiner comprises a wavelength division multiplexer.

31. The laser diode pump of claim 26, wherein the at least one substantially un-polarized pump signal operates to pump a broadband Raman oscillator capable of wavelength shifting the at least one substantially un-polarized pump signal to a desired Raman cascade order.

32. The laser diode pump of claim 26, wherein the at least one substantially un-polarized pump signal operates to pump a gain fiber of a distributed Raman amplifier coupled to the laser diode pump.

33. The laser diode pump of claim 26, wherein at least one of the plurality of laser diodes comprises:
  a laser diode capable of generating a substantially linearly polarized pump light; and
  a polarization maintaining fiber,
  wherein the pump light is capable of being coupled at a 45 degree angle into the polarization maintaining fiber to produce a beam having two polarization directions.

34. The laser diode pump of claim 26, wherein at least one of the plurality of laser diodes comprises:
  a laser diode capable of generating a substantially linearly polarized pump light; and
  a polarization maintaining fiber,
  wherein the pump light is capable of being coupled at an arbitrary non-zero angle into the polarization maintaining fiber to produce a beam having two polarization directions.

35. A method of forming a multiple wavelength pump signal, comprising:
  generating a plurality of lasing wavelengths; and
  combining the plurality of lasing wavelengths into a multiple wavelength pump signal, wherein the plurality of lasing wavelengths are combined using at least one wavelength combiner that comprises at least a first polarization combiner and at least a second polarization combiner;
  wherein at least two of the plurality of lasing wavelengths comprise a wavelength between 1270 rim and 1350 nm.

36. The method of claim 35, wherein the plurality of lasing wavelengths are generated by a plurality of laser diodes.

37. The method of claim 35, wherein the plurality of lasing wavelengths comprise at least a first pair of lasing wavelengths and at least a second pair of lasing wavelengths, and wherein each lasing wavelength of each pair comprises approximately the same wavelength as the other wavelength in that pair.

38. The method of claim 37, wherein the first pair of lasing wavelengths comprise a wavelength spaced by five (5) nanometers or more from the second pair of lasing wavelengths.

39. The method of claim 35, wherein the multiple wavelength pump signal comprises a substantially un-polarized pump signal.

40. The method of claim 35, wherein the multiple wavelength pump signal operates to amplify an optical signal operating in an operating window selected from the group consisting of a 1400 nanometer window, the violet window, and the EDFA window.

41. The method of claim 35, further comprising:

selecting and passing at least one lasing wavelength; and combining the at least one lasing wavelength with another lasing wavelength to form a substantially un-polarized output signal.

42. A method of forming a multiple wavelength pump signal, comprising:

generating a plurality of lasing wavelengths; and combining at least two of the plurality of lasing wavelengths into at least one substantially un-polarized pump output signal, wherein the plurality of lasing wavelengths are combined using at least one wavelength combiner that comprises at least a first polarization combiner and at least a second polarization combiner;

wherein at least one of the plurality of lasing wavelengths comprises a wavelength between 1270 nm and 1350 nm.

43. The method of claim 42, wherein the plurality of lasing wavelengths comprise at least a first pair of lasing wavelengths and at least a second pair of lasing wavelengths, and wherein each lasing wavelength of each pair comprises approximately the same wavelength as the other wavelength in that pair.

44. The method of claim 43, wherein the first pair of lasing wavelengths comprise a wavelength spaced by five (5) nanometers or more from the second pair of lasing wavelengths.

45. The method of claim 43, further comprising:

receiving the first pair of lasing wavelengths and the second pair of lasing wavelengths at a wavelength, combiner, and combining the first pair of lasing wavelengths and the second pair of lasing wavelengths into a substantially un-polarized multiple wavelength pump signal.

* * * * *